(12) United States Patent
Shen et al.

(10) Patent No.: US 12,237,375 B2
(45) Date of Patent: Feb. 25, 2025

(54) SEMICONDUCTOR STRUCTURE OF STACKED TWO-DIMENSIONAL MATERIAL LAYERS

(71) Applicant: Taiwan Semiconductor Manufacturing Company, Ltd., Hsinchu (TW)

(72) Inventors: Shin-Wei Shen, Hsinchu (TW); Tse-An Chen, Taoyuan (TW); Tung-Ying Lee, Hsinchu (TW); Lain-Jong Li, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/358,968

(22) Filed: Jul. 26, 2023

(65) Prior Publication Data

US 2023/0369404 A1 Nov. 16, 2023

Related U.S. Application Data

(63) Continuation of application No. 17/460,329, filed on Aug. 30, 2021, now Pat. No. 11,784,225.

(51) Int. Cl.
*H01L 27/12* (2006.01)
*H01L 21/822* (2006.01)
(Continued)

(52) U.S. Cl.
CPC ...... *H01L 29/1029* (2013.01); *H01L 21/8221* (2013.01); *H01L 27/0688* (2013.01);
(Continued)

(58) Field of Classification Search
CPC .............. H01L 21/8221; H01L 21/822; H01L 21/02365; H01L 21/8256; H01L 21/8252; H01L 21/8254; H01L 21/8258; H01L 21/8206; H01L 21/8213; H01L 27/0688; H01L 27/06; H01L 27/1225; H01L 27/12; H01L 27/127; H01L 27/08; H01L 29/1029; H01L 29/10; H01L 29/42392;
(Continued)

(56) References Cited

U.S. PATENT DOCUMENTS 9,209,247 B2 12/2015 Colinge et al.
9,236,267 B2 1/2016 De et al.
(Continued)

*Primary Examiner* — Nikolay K Yushin
(74) *Attorney, Agent, or Firm* — JCIPRNET

(57) ABSTRACT

A semiconductor structure includes a semiconductor substrate, a plurality of stacked units, a conductive structure, a plurality of dielectrics, a first electrode strip, a second electrode strip, and a plurality of contact structures. The stacked units are stacked up over the semiconductor substrate, and comprises a first passivation layer, a second passivation layer and a channel layer sandwiched between the first passivation layer and the second passivation layer. The conductive structure is disposed on the semiconductor substrate and wrapping around the stacked units. The dielectrics are surrounding the stacked units and separating the stacked units from the conductive structure. The first electrode strip and the second electrode strip are located on two opposing sides of the conductive structure. The contact structures are connecting the channel layer of each of the stacked units to the first electrode strip and the second electrode strip.

20 Claims, 49 Drawing Sheets

(51) Int. Cl.
*H01L 27/06* (2006.01)
*H01L 29/10* (2006.01)
*H01L 29/423* (2006.01)
*H01L 29/66* (2006.01)

(52) U.S. Cl.
CPC ........ *H01L 27/1225* (2013.01); *H01L 27/127* (2013.01); *H01L 29/42392* (2013.01); *H01L 29/66969* (2013.01)

(58) Field of Classification Search
CPC . H01L 29/423; H01L 29/66969; H01L 29/66; H01L 29/78696; H01L 29/78612; H01L 29/78621; H01L 29/786; H01L 29/0673; H01L 29/06; H01L 29/24; H01L 29/16; H01L 29/18; H01L 29/20; H01L 29/41725; H01L 29/0843; H01L 29/417; H01L 29/778; H01L 29/803; H01L 29/0684; H01L 29/0657; H01L 29/66795; H01L 29/785; H01L 27/088; H01L 29/7869; H01L 29/22; B82Y 10/00; H10K 99/00

See application file for complete search history.

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |

SEMICONDUCTOR STRUCTURE OF STACKED TWO-DIMENSIONAL MATERIAL LAYERS

CROSS-REFERENCE TO RELATED APPLICATION

This application is a continuation application of U.S. application Ser. No. 17/460,329, filed on Aug. 30, 2021, now allowed. The entirety of the above-mentioned patent application is hereby incorporated by reference herein and made a part of this specification.

BACKGROUND

Semiconductor devices are used in a variety of electronic applications such as, for example, personal computers, cell phones and other electronic equipment. Transistors are circuit components or elements that are often formed on semiconductor devices. With the progress of transistor process technology, the dimension of transistors continues to shrink and therefore the number of transistors per unit area of an integrated circuit has increased accordingly.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
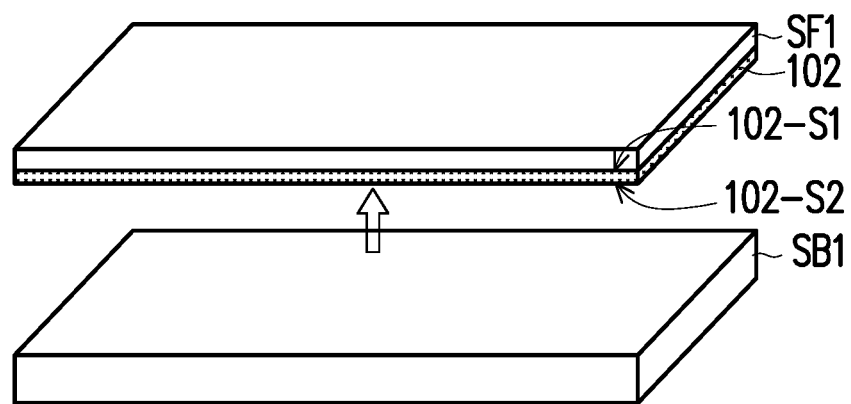
FIG. 1A to FIG. 1G are schematic views of various stages in a method of fabricating a stacked unit layer according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Embodiments discussed herein may be discussed in a specific context, namely a method of fabricating a semiconductor structure which utilizes two-dimensional materials for transistor applications. By utilizing the van der Waals interactions of two-dimensional material monolayers, one could further engineer their physical properties by creating vertically stacked heterostructures, and by coupling the two-dimensional materials with predesigned substrates to form complex devices. The transfer process of the two-dimensional materials plays a significant role for providing a neat interface between the vertical stacked heterostructures.

In conventional processes, during the formation of the stacked heterostructures, a residual contamination may remain on the two-dimensional material surfaces during layer-by-layer transfer process, and those leftovers lead to deteriorated device performance. Furthermore, during the transfer/removal process of two-dimensional materials, various issues may be confronted due to the use of chemical solvents, wet etching processes, which may deteriorate or crumble the material surface.

In accordance with some embodiments discussed herein, a method that enable the two-dimensional material building blocks to be cleanly peeled off from the target substrates without the use of any etchants or solvents is described. The embodiments allow the fabrication of a semiconductor structure achieved by vertical stack-by-stack hetero structure transfer for cubic integration. As such, a stacking assembly method that maintains the intrinsic properties of the two-dimensional building blocks while producing pristine interlayer interfaces can be achieved.

FIG. 1A to FIG. 1G are schematic views of various stages in a method of fabricating a stacked unit layer according to some exemplary embodiments of the present disclosure. As illustrated in FIG. 1A, in some embodiments, a channel material 102 is delaminated from a first substrate SB1 using a supporting film SF1. The channel material 102 may include a first surface 102-S1 and a second surface 102-S2 opposite to the first surface 102-S1. In some embodiments, the supporting film SF1 is attached to the first surface 102-S1 of the channel material 102, and used to peel off the channel material 102 from the first substrate SB1. In certain embodiments, the second surface 102-S2 of the channel material 102 is revealed after peeling. In the exemplary embodiment, the channel material 102 is a two-dimensional (2D) material, which may include transition metal dichalcogenides (TMDs) having the formula $MX_2$, in which M may be Mo or W, and X may be S, Se or Te. In some embodiments, the two-dimensional material (channel material 102) generally forms one or a few layers of an atomic matrix or a network having thickness within the range of about 0.1-5 nm. In certain embodiments, the two-dimensional material (channel material 102) is a crystalline material made from a single layer of atoms.

In some embodiments, the channel material 102 may be formed on the first substrate SB1 using chemical vapor deposition, vapor phase growth, or the like, and maybe delaminated from the first substrate SB1 using the supporting film SF1. In the exemplary embodiment, the first substrate SB1 includes sapphire, silicon, silicon oxide, silicon nitride, titanium nitride, or the like. Furthermore, the supporting film SF1 may include polymethyl methacrylate (PMMA), polyvinyl alcohol, thermal release tape, or the like. By using the supporting film SF1 to delaminate or hold up the channel material 102, the second surface 102-S2 of the channel material 102 may be separated from a surface of the first substrate SB1.

Figure 1B:
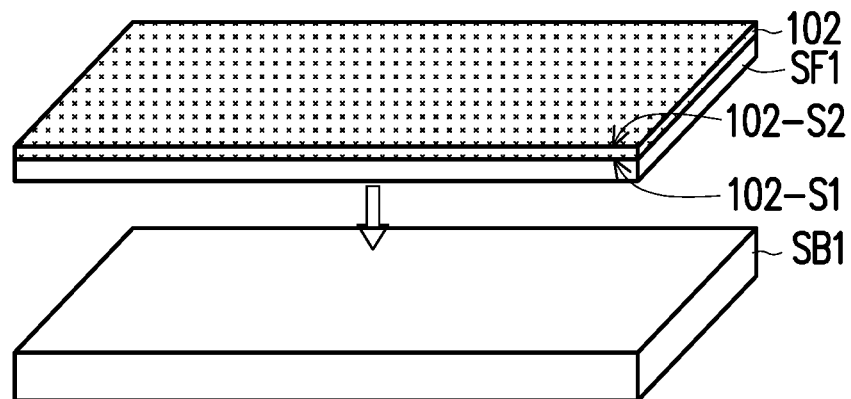

Referring to FIG. 1B, in some embodiments, the supporting film SF1 is reverse attached to the first substrate SB1 so that the second surface 102-S2 of the channel material 102 is facing away from the first substrate SB1. In certain embodiments, the second surface 102-S2 of the channel material 102 is arranged in a faced-up manner for attachment. In other words, a stacked structure of the supporting film SF1 along with the channel material 102 is flipped upside down and attached to the first substrate SB1 in a manner that the supporting film SF1 is disposed in between the first substrate SB1 and the channel material 102.

Figure 1C:
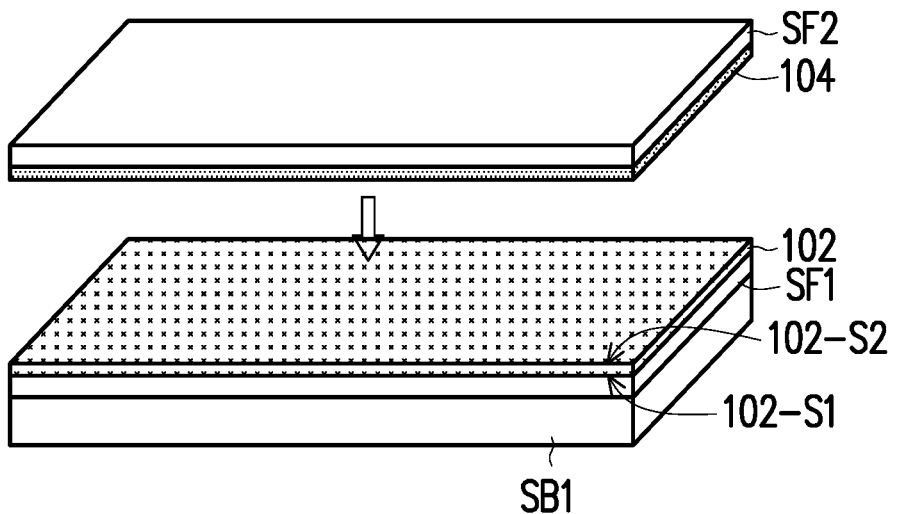

As illustrated in FIG. 1C, in some embodiments, a second supporting film SF2 is used to hold up a first passivation material 104, so that the first passivation material 104 can be attached to the second surface 102-S2 of the channel material 102. A material of the second supporting film SF2 is similar to a material of the first supporting film SF1 described above. In some embodiments, the first passivation material 104 is made of an insulating material, such as a two-dimensional (2D) material including boron nitride (hexagonal born nitride), or the like. Similarly, the two-dimensional material (first passivation material 104) generally forms one or a few layers of an atomic matrix or a network having thickness within the range of about 0.1-5 nm. In certain embodiments, the two-dimensional material (first passivation material 104) is a crystalline material made from a single layer of atoms. In some embodiments, since the channel material 102 is disposed on the first substrate SB1 in a faced-up manner, the second surface 102-S2 of the channel material 102 may be relatively clean and free of residues. As such, when attaching the first passivation material 104 to the second surface 102-S2 of the channel material 102, a neat interface in between the first passivation material 104 and the channel material 102 can be achieved.

Figure 1D:
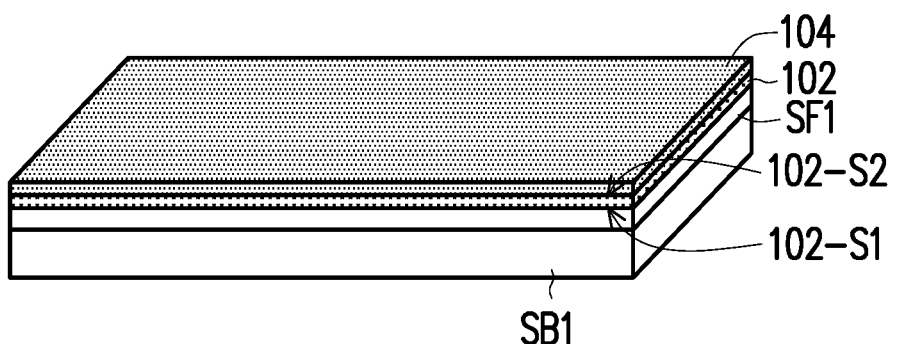
Figure 1E:
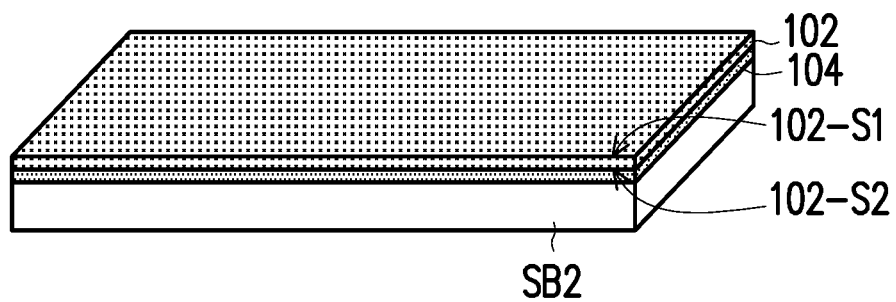

Referring to FIG. 1D, after attaching the first passivation material 104 onto the second surface 102-S2 of the channel material 102, the second supporting film SF2 is separated from the first passivation material 104 and the channel material 102. In other words, the second supporting film SF2 is removed or peeled off. Referring to FIG. 1E, in a subsequent step, the channel material 102 along with the first passivation material 104 is reverse stacked on a second substrate SB2 so that the first surface 102-S1 of the channel material 102 is facing away from the second substrate SB2. In other words, a stacked structure of the supporting film SF1 along with the channel material 102 and the first passivation material 104 is flipped upside down and attached to the second substrate SB2, whereby the first passivation material 104 is sandwiched in between the second substrate SB2 and the channel material 102. Thereafter, the supporting film SF1 may be removed or peeled off to reveal the first surface 102-S1 of the channel material 102. In some embodiments, the second substrate SB2 includes silicon, silicon oxide, silicon nitride, hafnium oxide, or the like.

Figure 1F:
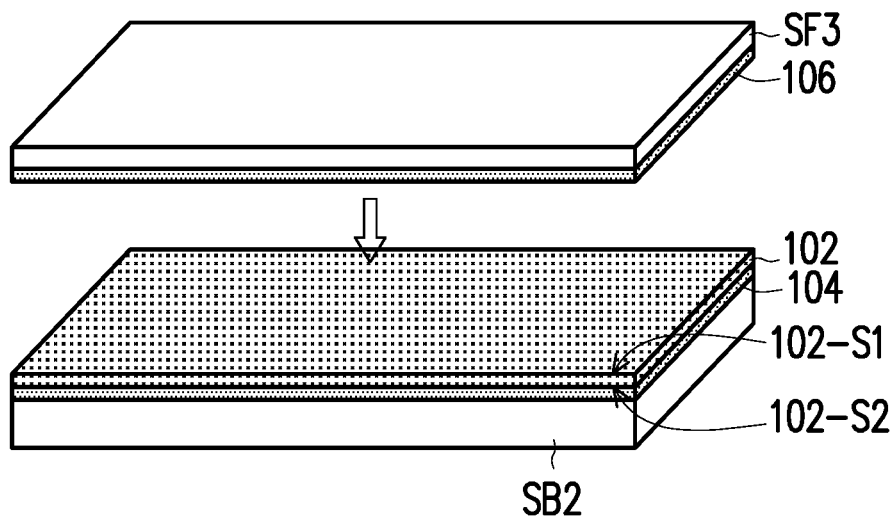

As illustrated in FIG. 1F, in some embodiments, a third supporting film SF3 is used to hold up a second passivation material 106, so that the second passivation material 106 can be attached to the first surface 102-S of the channel material 102. A material of the third supporting film SF3 is similar to a material of the first supporting film SF1 described above. In some embodiments, the second passivation material 106 and the first passivation material 104 are made of the same materials. In other words, the second passivation material 106 is made of an insulating material, such as a two-dimensional material including boron nitride (hexagonal born nitride), or the like.

Figure 1G:
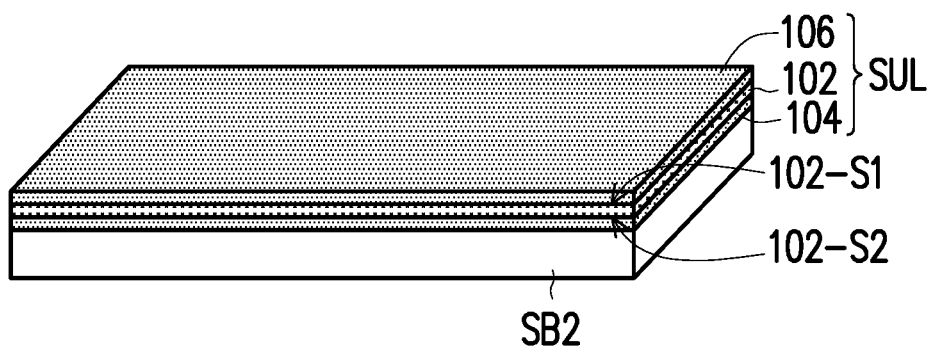

Referring to FIG. 1G, after attaching the second passivation material 106 onto the first surface 102-S1 of the channel material 102, the third supporting film SF3 is separated from the second passivation material 106. In other words, the third supporting film SF3 is removed or peeled off. After removing the third supporting film SF3, a stacked unit layer SUL constituted by the first passivation material 104, the channel material 102 and the second passivation material 106 may be obtained. The channel material 102 being sandwiched between the first passivation material 104 and the second passivation material 106. In some embodiments, the stacked unit layer SUL may be transferred to other substrates or stacked onto other structures, which may be varied depending on product requirements.

FIG. 2A to FIG. 2H are schematic views of various stages in a method of fabricating a stacked unit layer according to some other exemplary embodiments of the present disclosure. The method illustrated in FIG. 2A to FIG. 2H is similar to the method illustrated in FIG. 1A to FIG. 1G. Therefore, the same reference numerals are used to refer to the same or like parts, and its detailed description will be omitted herein. The difference between the embodiments, is that a metal layer 103 is further used during the transfer process of the two-dimensional materials in the method of FIG. 2A to FIG. 2H.

Figure 2A:
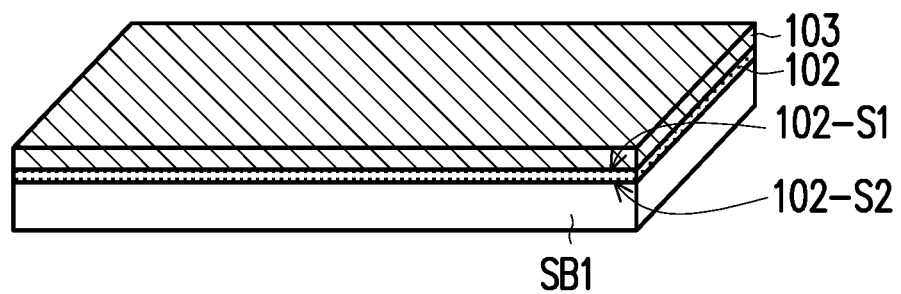
FIG. 2A to FIG. 2H are schematic views of various stages in a method of fabricating a stacked unit layer according to some other exemplary embodiments of the present disclosure.

As illustrated in FIG. 2A, in some embodiments, a first substrate SB1 with a channel material 102 (two dimensional materials) and a metal layer 103 disposed thereon is provided. The metal layer 103 is formed on the channel material 102 through deposition techniques, such as chemical vapor deposition (CVD), physical vapor deposition (PVD), or the like. In some embodiments, the metal layer 103 includes a low-melting metal, such as bismuth (melting point: 271.5° C.), indium (melting point: 156.6° C.), tin (melting point: 231.9° C.), or the like.

Figure 2B:
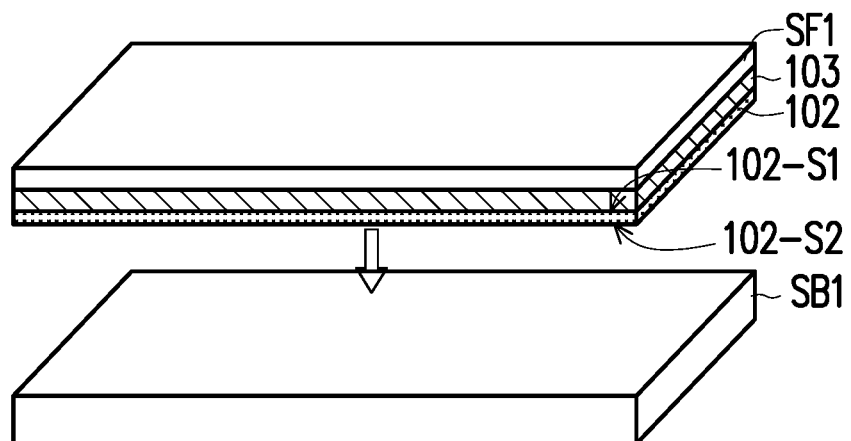

Referring to FIG. 2B, in some embodiments, a supporting film SF1 is used to delaminate the channel material 102 along with the metal layer 103 from the first substrate SB1. In other words, the supporting film SF1 holds up the channel material 102 and the metal layer 103, and separates the channel material 102 and the metal layer 103 from the first substrate SB1.

Figure 2C:
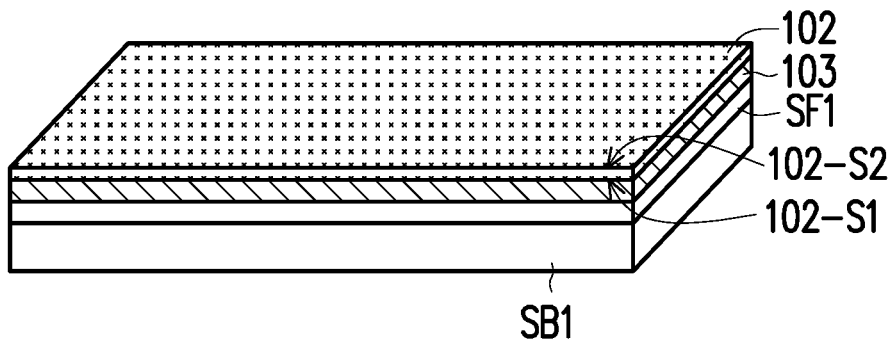

Referring to FIG. 2C, in some embodiments, the supporting film SF1 is reverse attached to the first substrate SB1 so that the second surface 102-S2 of the channel material 102 is facing away from the first substrate SB1. In other words, a stacked structure of the supporting film SF1 along with the channel material 102 and the metal layer 103 is flipped upside down and attached to the first substrate SB1 in a manner that the supporting film SF1 is disposed in between the first substrate SB1 and the metal layer 103.

Figure 2D:
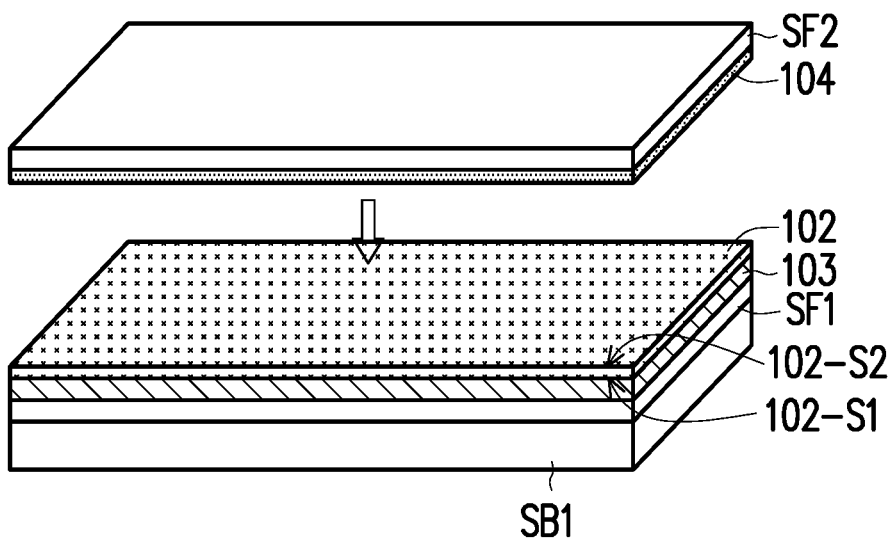

Referring to FIG. 2D, in a subsequent step, a second supporting film SF2 is used to hold up a first passivation material 104 (two-dimensional material), so that the first passivation material 104 can be attached to the second surface 102-S2 of the channel material 102. In the exemplary embodiment, since the channel material 102 is disposed on the first substrate SB1 in a faced-up manner, the second surface 102-S2 of the channel material 102 may be relatively clean and free of residues. As such, when attaching the first passivation material 104 to the second surface 102-S2 of the channel material 102, a neat interface in between the first passivation material 104 and the channel material 102 can be achieved.

Figure 2E:
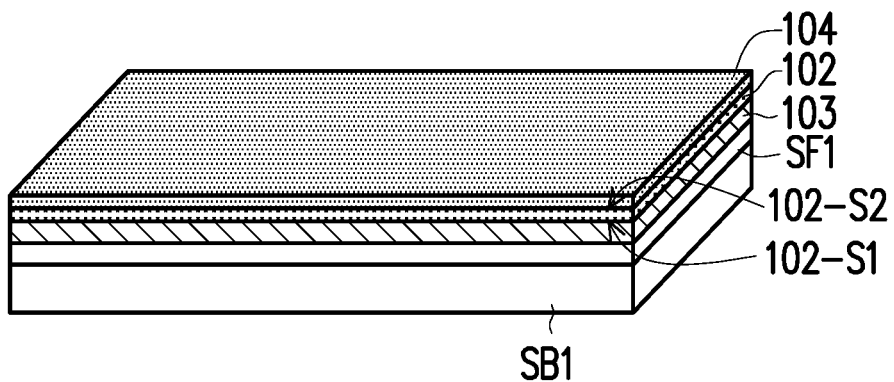
Figure 2F:
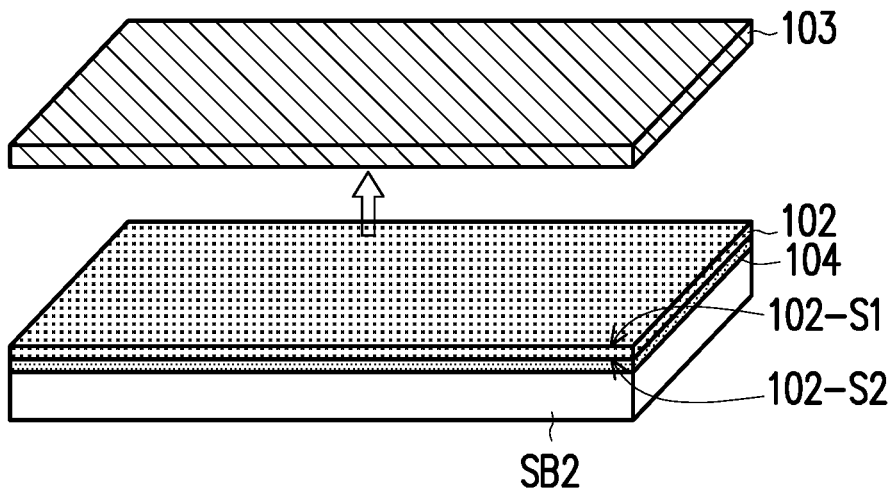

Referring to FIG. 2E, after attaching the first passivation material 104 onto the second surface 102-S2 of the channel material 102, the second supporting film SF2 is separated from the first passivation material 104 and the channel material 102. In other words, the second supporting film SF2 is removed or peeled off. Referring to FIG. 2F, in some embodiments, the channel material 102 along with the first passivation material 104 is reverse stacked on a second substrate SB2 so that the first surface 102-S1 of the channel material 102 is facing away from the second substrate SB2. In other words, a stacked structure of the supporting film SF1 along with the metal layer 103, the channel material 102 and the first passivation material 104 is flipped upside down and attached to the second substrate SB2, whereby the first passivation material 104 is sandwiched in between the second substrate SB2 and the channel material 102. Thereafter, the supporting film SF1 and the metal layer 103 may be removed or peeled off to reveal the first surface 102-S1 of the channel material 102.

Figure 2G:
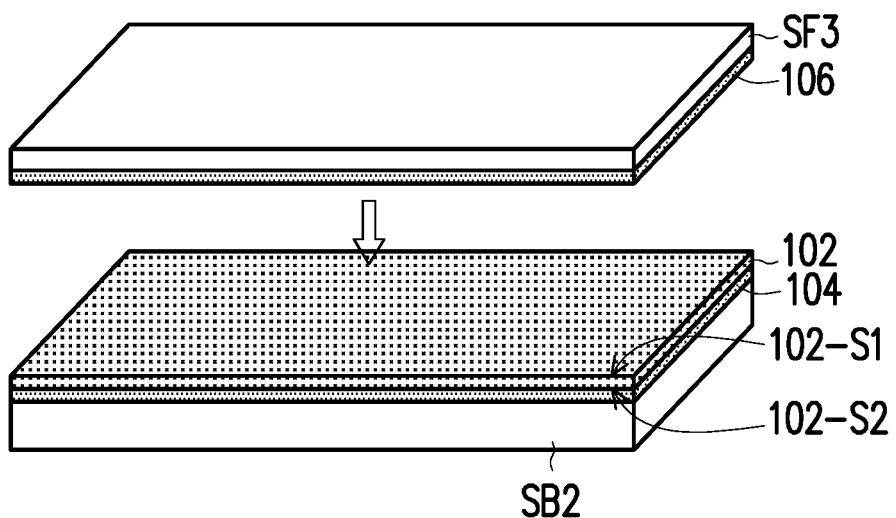
Figure 2H:
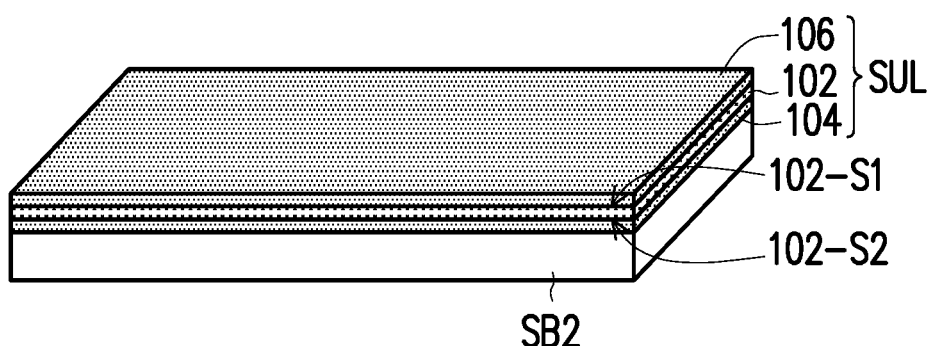

Referring to FIG. 2G, in some embodiments, a third supporting film SF3 is used to hold up a second passivation material 106 (two-dimensional material), so that the second passivation material 106 can be attached to the first surface 102-S of the channel material 102. Referring to FIG. 2H, after attaching the second passivation material 106 onto the first surface 102-S1 of the channel material 102, the third supporting film SF3 is separated from the second passivation material 106. In other words, the third supporting film SF3 is removed or peeled off. After removing the third supporting film SF3, a stacked unit layer SUL constituted by the first passivation material 104, the channel material 102 and the second passivation material 106 may be obtained.

In the exemplary embodiment, since the metal layer 103 (low-melting metal) is used to assist the transfer of the two-dimensional materials, a clean interface in between the channel material 102 and the first passivation material 104 may be further ensured. Furthermore, after peeling off the metal layer 103 from the first surface 102-S1 of the channel material 102, the first surface 102-S1 of the channel material 102 may be relatively clean and free of residues. As such, when attaching the second passivation material 106 to the first surface 102-S1 of the channel material 102, a neat interface in between the second passivation material 106 and the channel material 102 can be achieved.

Figure 3A:
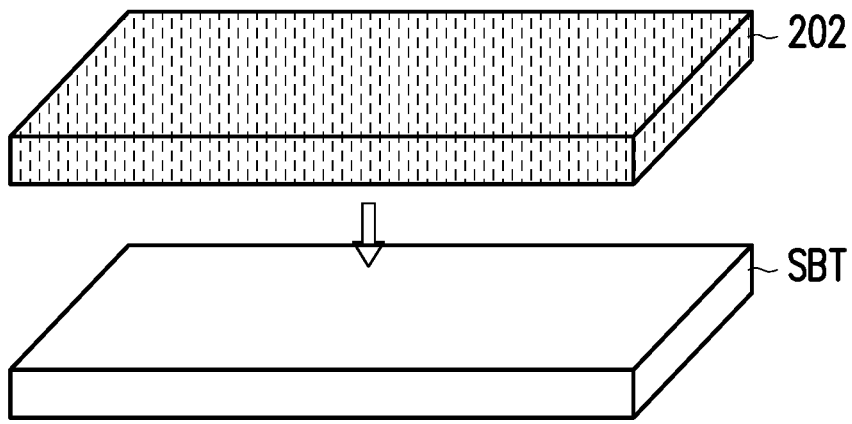
FIG. 3A to FIG. 3G are schematic views of various stages in a method of fabricating a stacked block structure according to some exemplary embodiments of the present disclosure.

FIG. 3A to FIG. 3G are schematic views of various stages in a method of fabricating a stacked block structure according to some exemplary embodiments of the present disclosure. Referring to FIG. 3A, in some embodiments, a substrate SBT is provided. The substrate SBT includes sapphire, silicon, silicon oxide, silicon nitride, titanium nitride, or the like. In some embodiments, a hydrophobic layer 202 is formed or grown on the substrate SBT. For example, the hydrophobic layer 202 includes trichloro(octadecyl)silane (OTS), (3-Aminopropyl)-triethoxysilane (APTES), (3-mercaptopropyl)-triethoxysilane (MPTES), polydimethylsiloxane (PDMS), or the like. In some embodiments, the hydrophobic layer 202 may be any hydrophobic materials that assist in the peeling of the layers formed thereon.

Figure 3B:
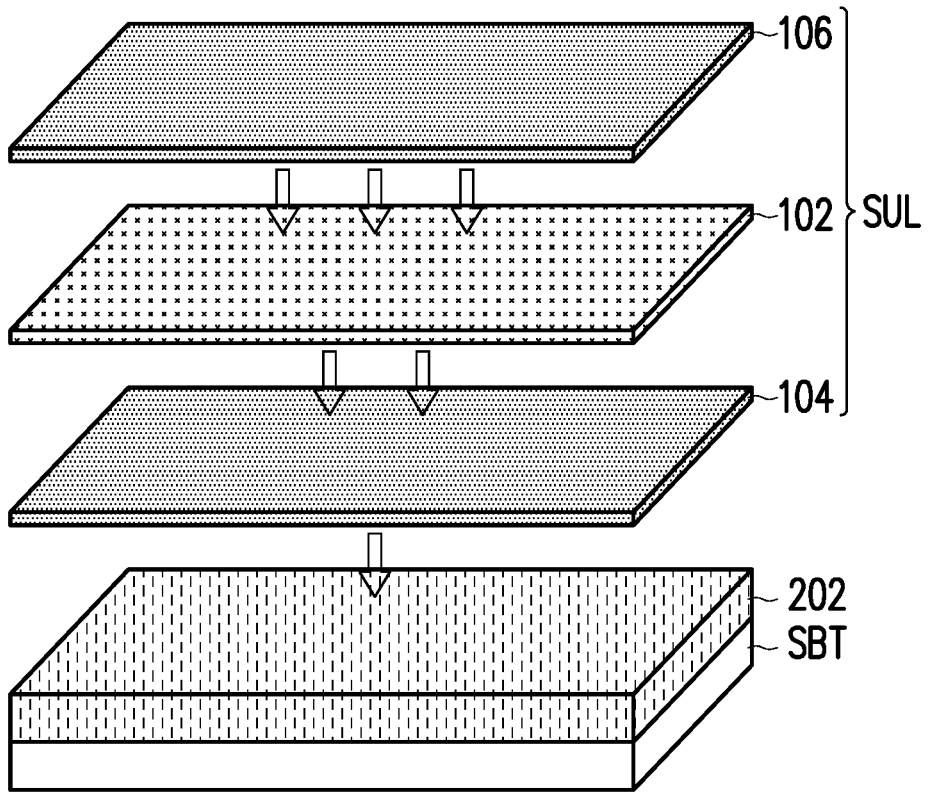

Referring to FIG. 3B, in a subsequent step, a stacked unit layer SUL is formed on the hydrophobic layer 202. For example, a first passivation material 104, a channel material 102 and a second passivation material 106 are sequentially stacked over the hydrophobic layer 202 and over the substrate SBT. In some embodiments, the stacked unit layer SUL may be formed over the hydrophobic layer 202 utilizing the methods described in FIG. 1A to FIG. 1G or FIG. 2A to FIG. 2H, for example.

Figure 3C:
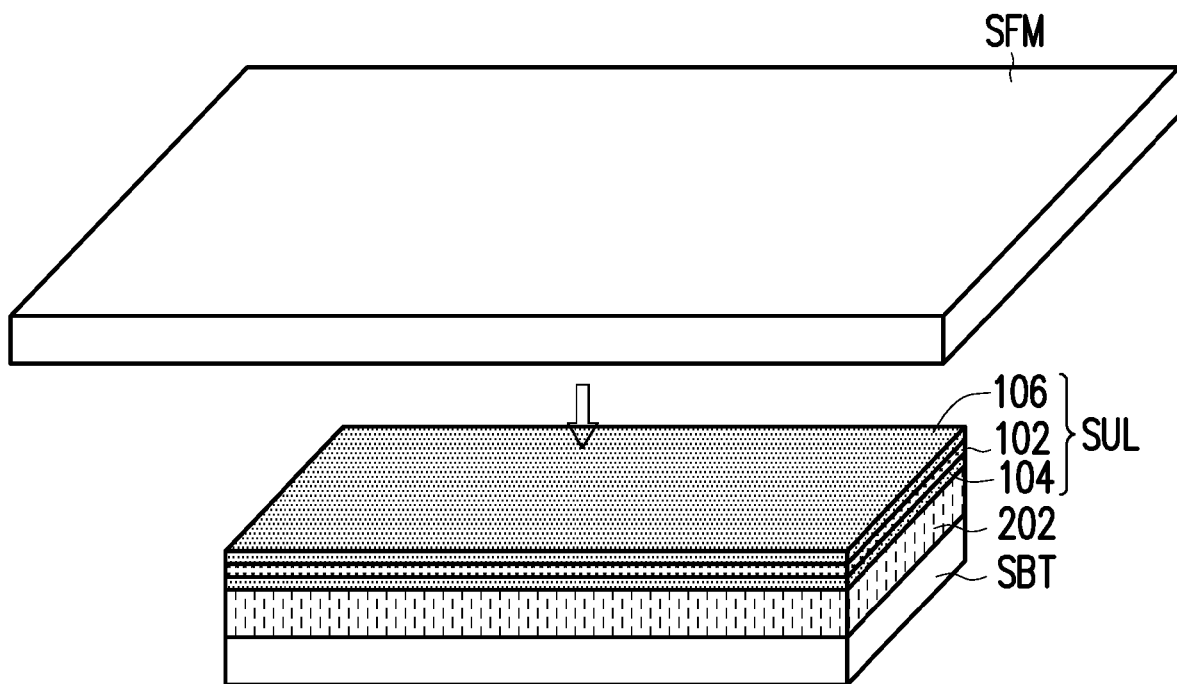

Referring to FIG. 3C, after forming the stacked unit layer SUL on the hydrophobic layer 202, a supporting film SFM is attached to the stacked unit layer SUL so that the stacked unit layer SUL is fasten up by the supporting film SFM. In some embodiments, the supporting film SFM is attached to the second passivation material 106 of the stacked unit layer SUL. A material of the supporting film SFM may be similar to a material of the supporting film SF1 described above.

Figure 3D:
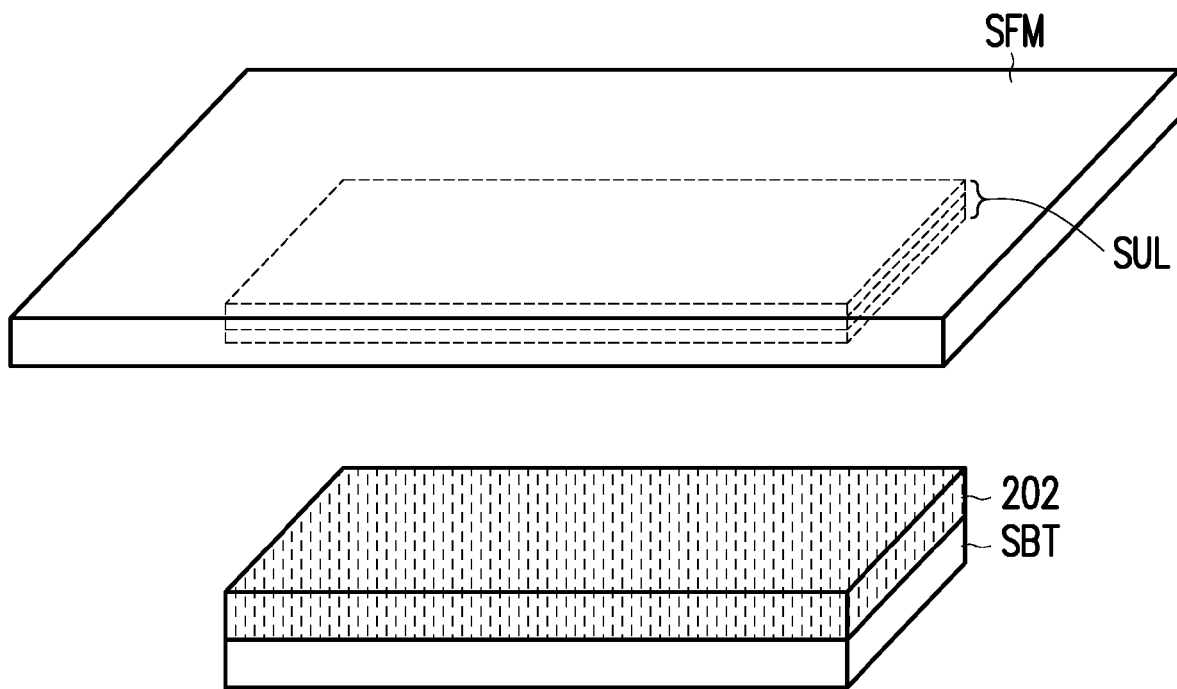

Referring to FIG. 3D, in a subsequent step, the supporting film SFM is used to hold up the stacked unit layer SUL. In other words, the stacked unit layer SUL is peeled off from the hydrophobic layer 202 and the substrate SBT. In some embodiments, since the hydrophobic layer 202 is interposed between the substrate SBT and the stacked unit layer SUL, the peeling off of the stacked unit layer SUL becomes relatively easy, and neat surfaces of the stacked unit layer SUL are ensured after peeling.

Figure 3E:
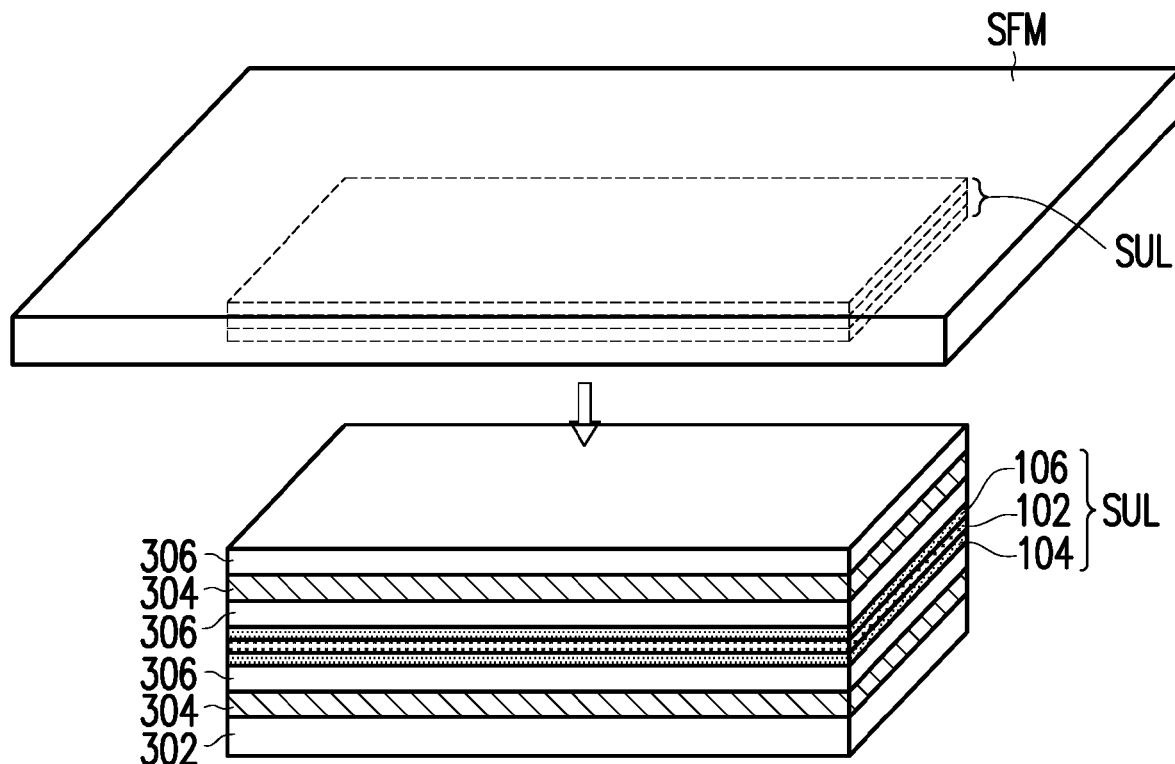

Referring to FIG. 3E, in some embodiments, the stacked unit layer SUL is transferred onto a target substrate, such as a semiconductor substrate 302. The semiconductor substrate 302 includes silicon, silicon oxide, silicon nitride, hafnium oxide, or the like. In some embodiments, the stacked unit layer SUL is transferred onto the semiconductor substrate 302 having a first gate material 304 and a gate dielectric material 306 located thereon. Thereafter, a plurality of gate dielectric materials 306 and another first gate material 304 may be stacked over the stacked unit layer SUL, and another stacked unit layer SUL may be transferred onto the topmost gate dielectric material 306 using the supporting film SFM in a similar manner. In some embodiments, the first gate material 304 and the gate dielectric materials 306 may respectively be formed by any suitable methods such as atomic layer deposition (ALD), or the like. In some embodiments, the first gate material 304 includes conductive materials such as gold (Au), silver (Ag), copper, titanium nitride, or the like. Furthermore, the gate dielectric materials 306 include silicon oxide ($SiO_2$), aluminum oxide ($Al_2O_3$) hafnium oxide ($HfO_2$), or the like.

Figure 3F:
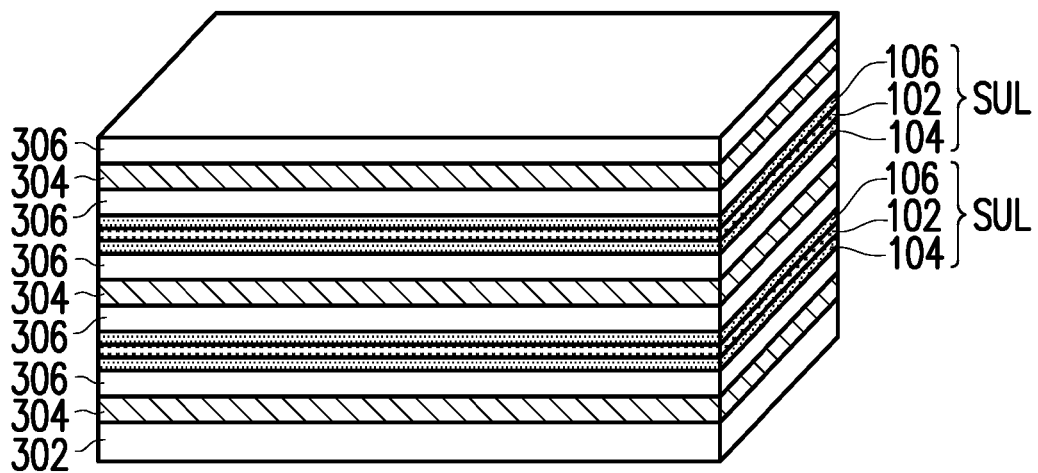

Referring to FIG. 3F, after stacking a second set of stacked unit layer SUL onto the top-most gate dielectric material 306, the formation of the gate dielectric materials 306 and the first gate material 304 may be repeated to cover the stacked unit layer SUL. As illustrated in FIG. 3F, in some embodiments, a top surface and a bottom surface of the stacked unit layer SUL is covered up by the gate dielectric materials 306. In other words, the stacked unit layer SUL is stacked up in a way so that it is physically separated from the first gate material 304. Thereafter, a double stacking heterostructure (with two stacked unit layers SUL) may be obtained.

Figure 3G:
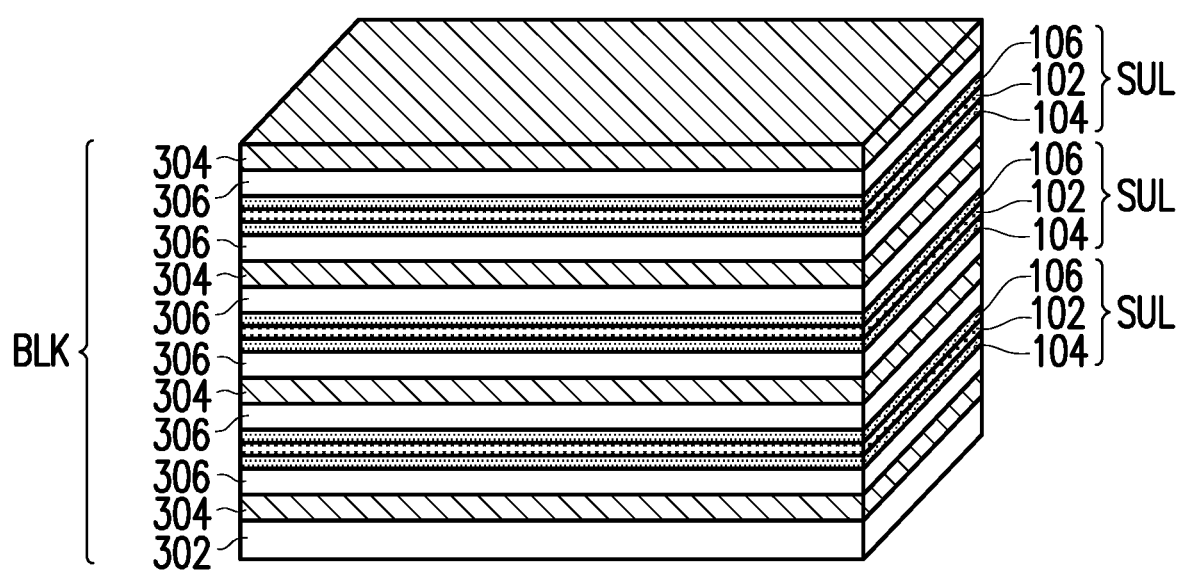

Referring to FIG. 3G, in some embodiments, the stacking of the plurality of stacked unit layers SUL, the gate dielectric materials 306 and the first gate material 304 over the semiconductor substrate 302 may be repeated until a desired number of stacking layers is formed. For example, as illustrated in FIG. 3G, a triple stacking heterostructure (with three stacked unit layers SUL) is formed over the semiconductor substrate 302 to form a stacked block structure BLK. In alternative embodiments, the number of stacking structures (stacked unit layers SUL) in the stacked block structure BLK may be appropriately adjusted based on product requirements.

FIG. 4A to FIG. 4F are schematic views of various stages in a method of fabricating a stacked block structure according to some other exemplary embodiments of the present disclosure. The method illustrated in FIG. 4A to FIG. 4F is similar to the method illustrated in FIG. 3A to FIG. 3G. Therefore, the same reference numerals are used to refer to the same or liked parts, and its detailed description will be omitted herein. The difference between the embodiments is that a release film 203 is used in replacement of the hydrophobic layer 202.

Figure 4A:
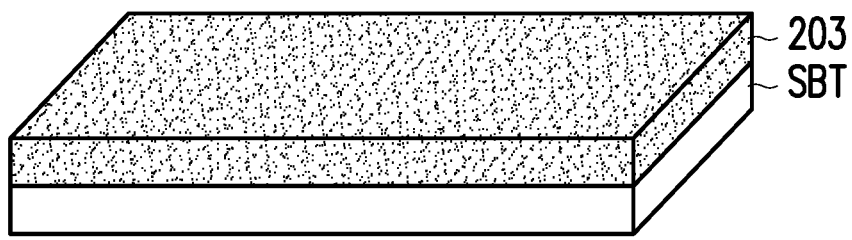
FIG. 4A to FIG. 4F are schematic views of various stages in a method of fabricating a stacked block structure according to some other exemplary embodiments of the present disclosure.

Referring to FIG. 4A, in some embodiments, a substrate SBT is provided. The substrate SBT includes sapphire, silicon, silicon oxide, silicon nitride, titanium nitride, or the like. In some embodiments, a release film 203 is formed on the substrate SBT. For example, the release film 203 is a polymer-based material (such as a Light To Heat Conversion (LTHC) material), which may be removed along with the substrate SBT upon laser irradiation.

Figure 4B:
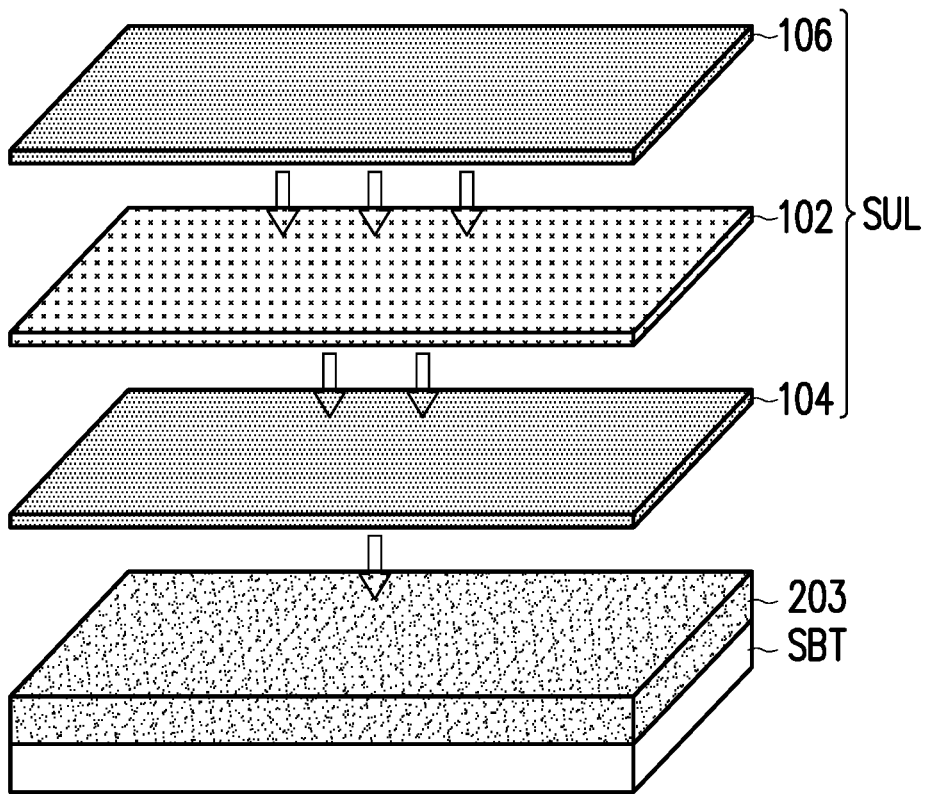

Referring to FIG. 4B, in a subsequent step, a stacked unit layer SUL is formed on the release film 203. For example, a first passivation material 104, a channel material 102 and a second passivation material 106 are sequentially stacked over the release film 203 and over the substrate SBT. In some embodiments, the stacked unit layer SUL may be formed over the release film 203 utilizing the methods described in FIG. 1A to FIG. 1G or FIG. 2A to FIG. 2H, for example.

Figure 4C:
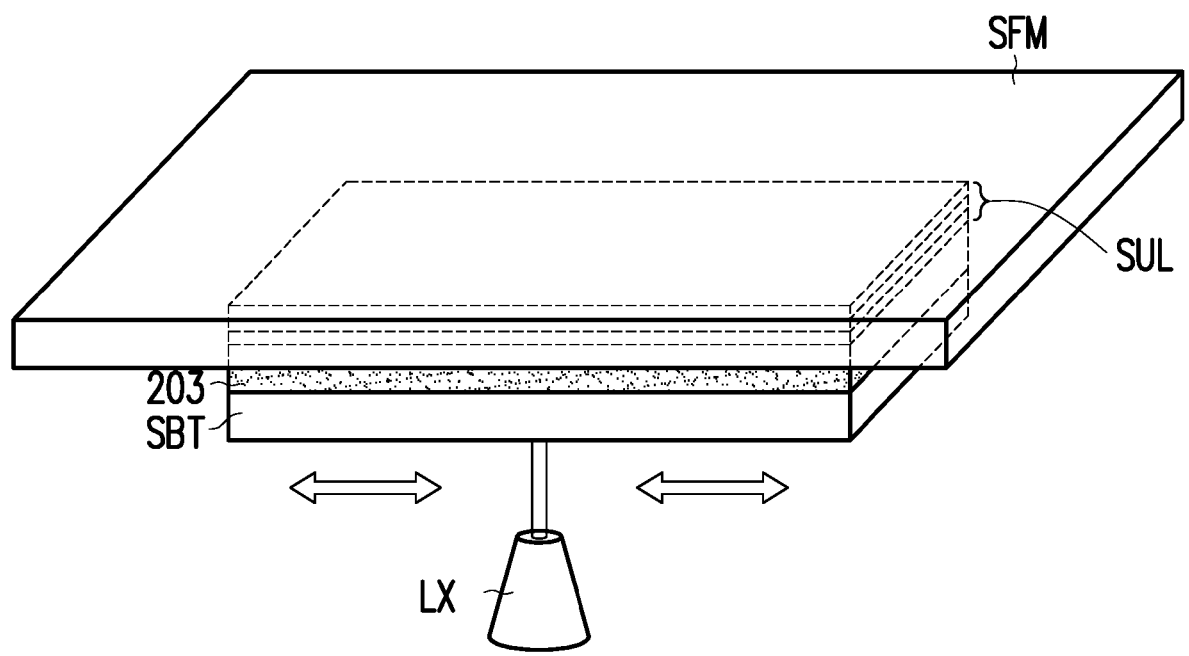

Referring to FIG. 4C, after forming the stacked unit layer SUL on the release film 203, a supporting film SFM is attached to the stacked unit layer SUL so that the stacked unit layer SUL is fasten up by the supporting film SFM. In some embodiments, the supporting film SFM is attached to the second passivation material 106 of the stacked unit layer SUL. Thereafter, in some embodiments, a laser LX is used to project a laser light on the release film 203, which will assist in the peeling of the layers located on the release film 203.

Figure 4D:
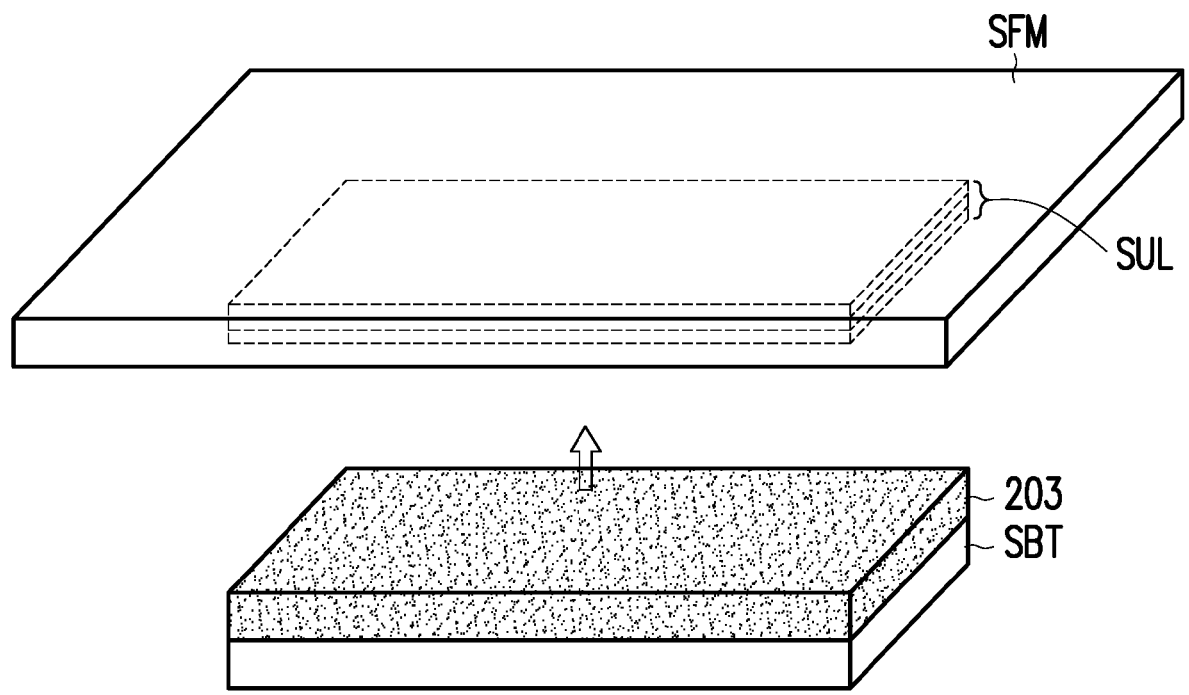

Referring to FIG. 4D, in a subsequent step, the supporting film SFM is used to hold up the stacked unit layer SUL. In other words, the stacked unit layer SUL is peeled off from the release film 203 and the substrate SBT. In some embodiments, since the release film 203 is interposed between the substrate SBT and the stacked unit layer SUL, the peeling off of the stacked unit layer SUL becomes relatively easy (laser assisted peeling), and neat surfaces of the stacked unit layer SUL are ensured after peeling.

Figure 4E:
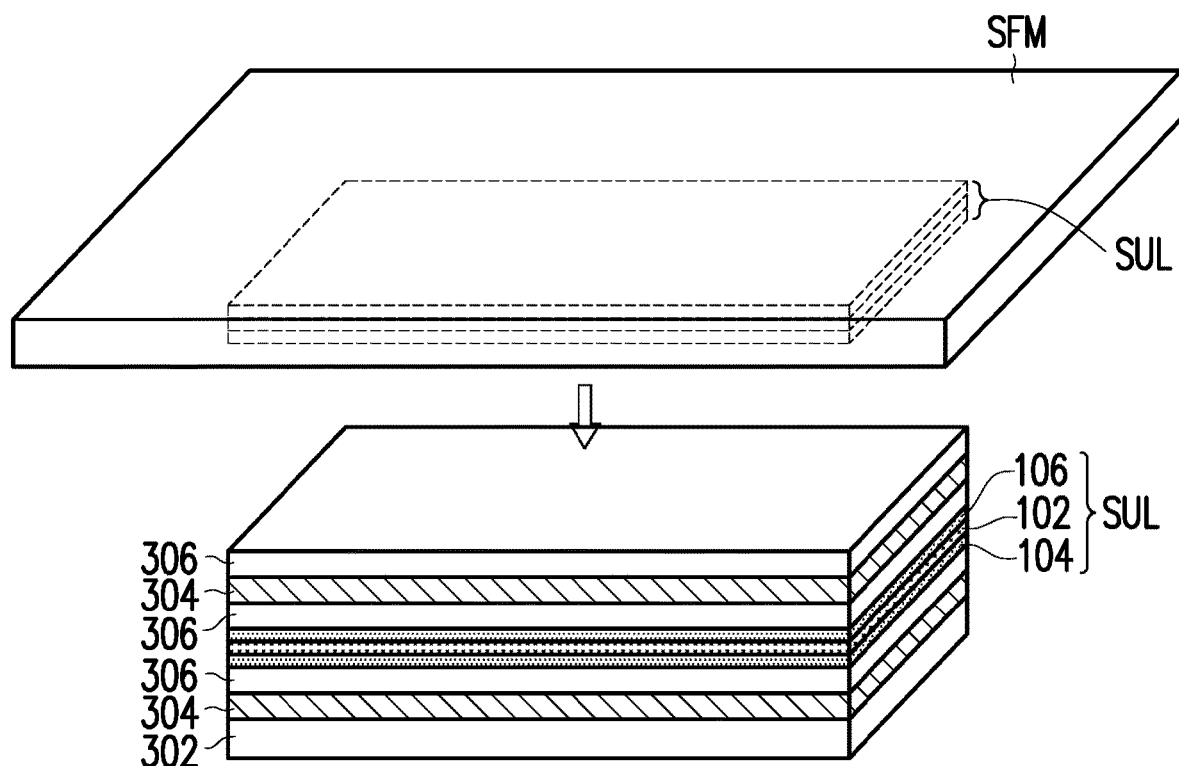

Referring to FIG. 4E, in some embodiments, the stacked unit layer SUL is transferred onto a semiconductor substrate 302. For example, the stacked unit layer SUL is transferred onto the semiconductor substrate 302 having a first gate material 304 and a gate dielectric material 306 located thereon. Thereafter, a plurality of gate dielectric materials 306 and another first gate material 304 may be stacked over the stacked unit layer SUL, and another stacked unit layer SUL may be transferred onto the topmost gate dielectric material 306 using the supporting film SFM in a similar manner.

Figure 4F:
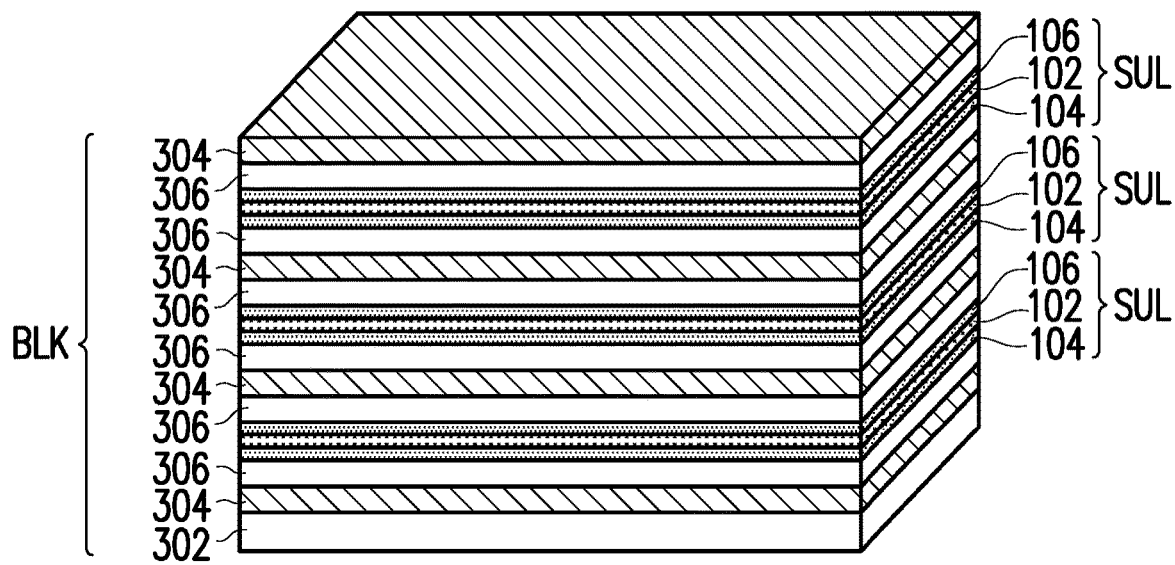

Referring to FIG. 4F, in some embodiments, the stacking of the plurality of stacked unit layers SUL, the gate dielectric materials 306 and the first gate material 304 over the semiconductor substrate 302 may be repeated until a desired number of stacking layers is formed. For example, as illustrated in FIG. 4F, a triple stacking heterostructure (with three stacked unit layers SUL) is formed over the semiconductor substrate 302 to form the stacked block structure BLK.

FIG. 5A to FIG. 5G are schematic views of various stages in a method of fabricating a stacked block structure according to some other exemplary embodiments of the present disclosure. The method illustrated in FIG. 5A to FIG. 5G is similar to the method illustrated in FIG. 3A to FIG. 3G. Therefore, the same reference numerals are used to refer to the same or liked parts, and its detailed description will be omitted herein. In the previous embodiments, a stacked unit layer SUL (including the first passivation material 104, the channel material 102 and the second passivation material 106) is transferred using the supporting film SFM in each transferring process to form the stacked heterostructure. However, the disclosure is not limited thereto, and more layers may be transferred in a single transferring process.

Figure 5A:
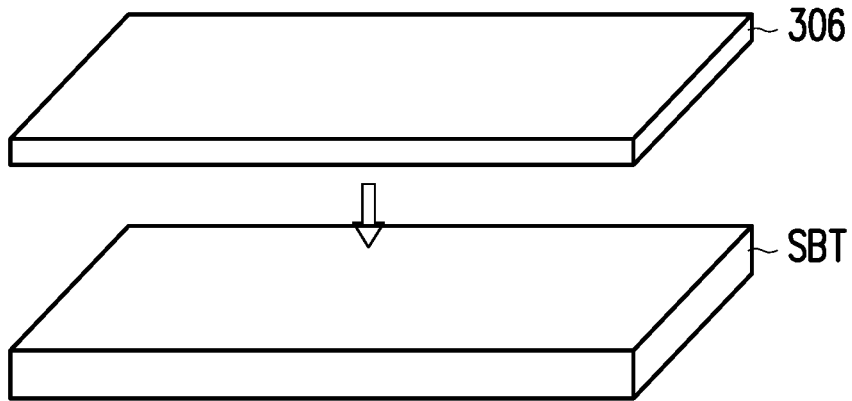
FIG. 5A to FIG. 5G are schematic views of various stages in a method of fabricating a stacked block structure according to some other exemplary embodiments of the present disclosure.

Referring to FIG. 5A, in some embodiments, a gate dielectric material 306 (oxide-based dielectric) is formed on the substrate SBT. Subsequently, referring to FIG. 5B, a stacked unit layer SUL is formed on the gate dielectric material 306. For example, a first passivation material 104, a channel material 102 and a second passivation material 106 are sequentially stacked over the gate dielectric material 306 and over the substrate SBT. In some embodiments, the stacked unit layer SUL may be formed over the gate dielectric material 306 utilizing the methods described in FIG. 1A to FIG. 1G or FIG. 2A to FIG. 2H, for example.

Figure 5B:
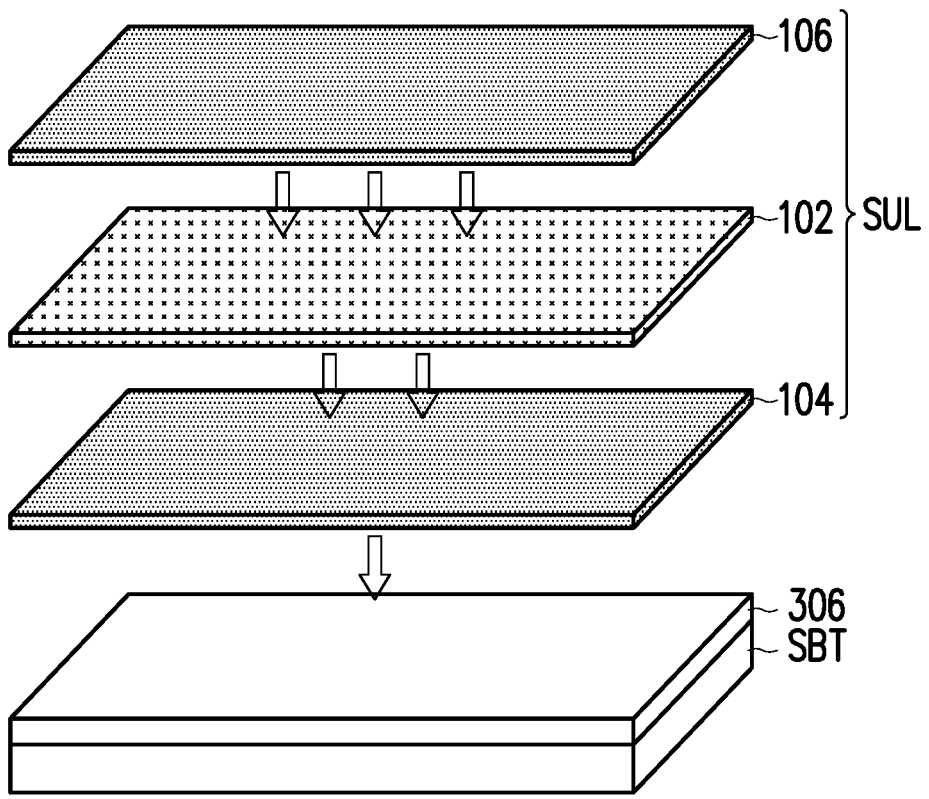
Figure 5C:
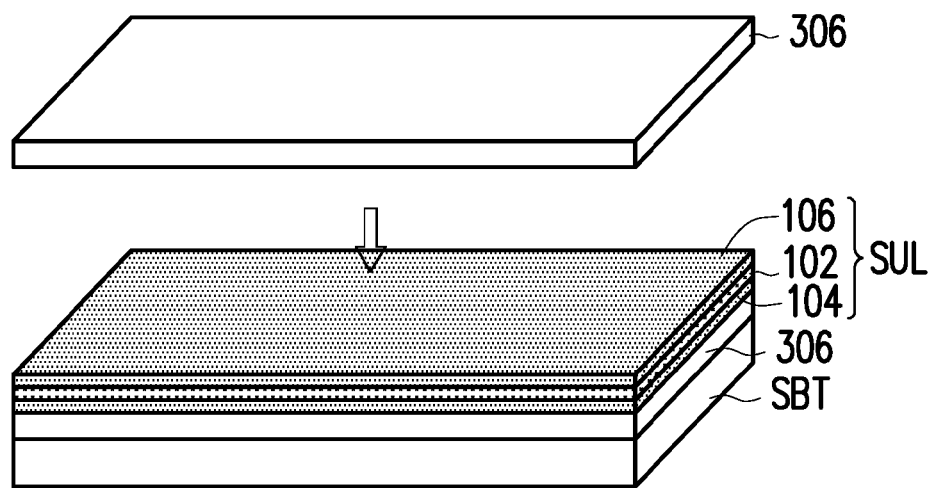

Referring to FIG. 5C, after forming the stacked unit layer SUL, another gate dielectric material 306 (oxide-based dielectric) is formed on the stacked unit layer SUL. In other words, the stacked unit layer SUL is sandwiched in between two gate dielectric materials 306. In some alternative embodiments, the second gate dielectric material 306 may be formed to cover the sidewalls of the stacked unit layer SUL, and may be joined with the gate dielectric material 306 located underneath. In other words, the gate dielectric materials 306 may be formed to isolate the stacked unit layer SUL, the disclosure is not limited thereto.

Figure 5D:
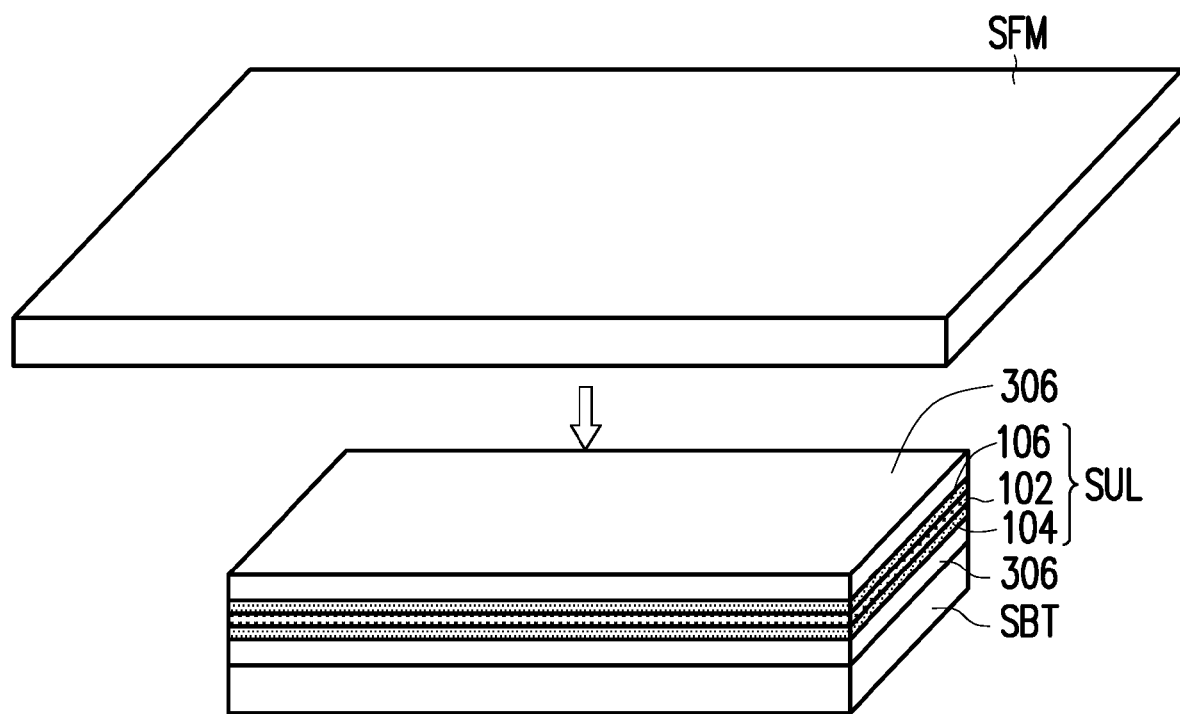
Figure 5E:
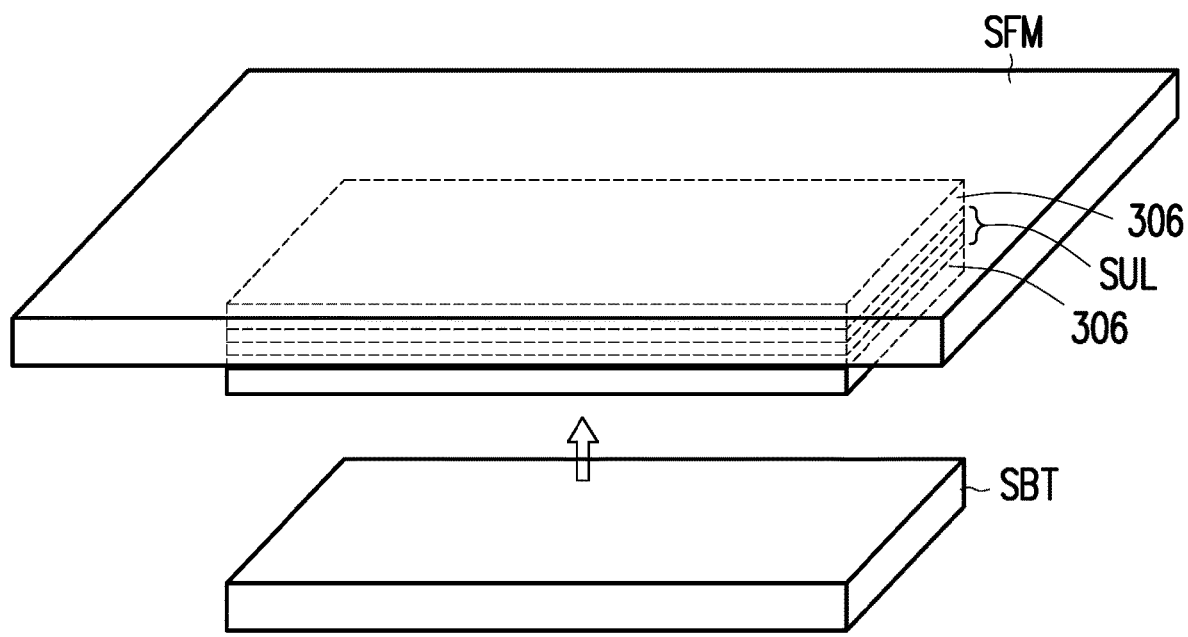

Referring to FIG. 5D, in a subsequent step, a supporting film SFM is attached to the topmost gate dielectric material 306 so that the gate dielectric materials 306 along with the stacked unit layer SUL are fasten up by the supporting film SFM. Thereafter, referring to FIG. 5E, the supporting film SFM is used to hold up a building block of the stacked unit layer SUL sandwiched by the gate dielectric materials 306. In other words, the building block is separated from the substrate SBT by peeling off the bottommost gate dielectric material 306 from the substrate SBT.

Figure 5F:
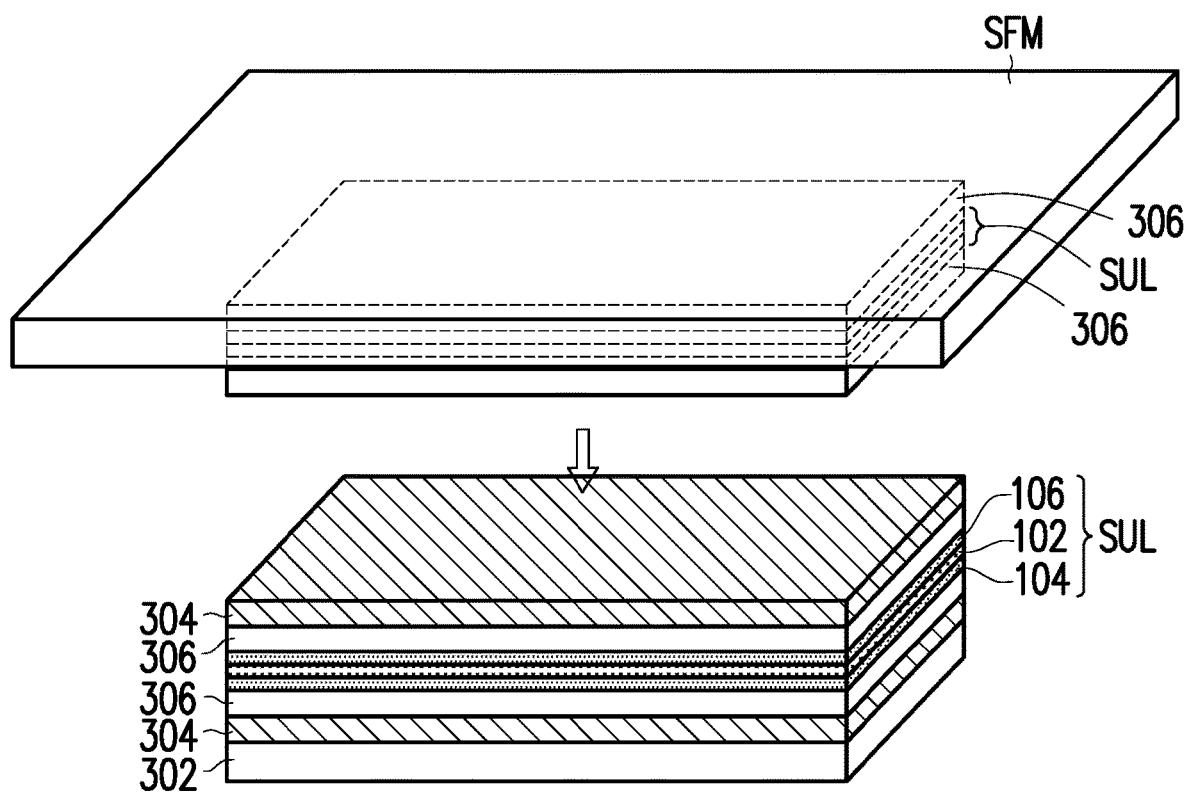

Referring to FIG. 5F, in some embodiments, the building block of the stacked unit layer SUL sandwiched by the gate dielectric materials 306 are transferred onto a semiconductor substrate 302. For example, the stacked unit layer SUL is transferred onto the semiconductor substrate 302 having a first gate material 304 located thereon. Thereafter, another first gate material 304 may be formed over the building block of the stacked unit layer SUL and the gate dielectric materials 306. In some embodiments, another building block of the stacked unit layer SUL sandwiched by the gate dielectric materials 306 may be transferred onto the topmost first gate material 304 using the supporting film SFM in a similar manner.

Figure 5G:
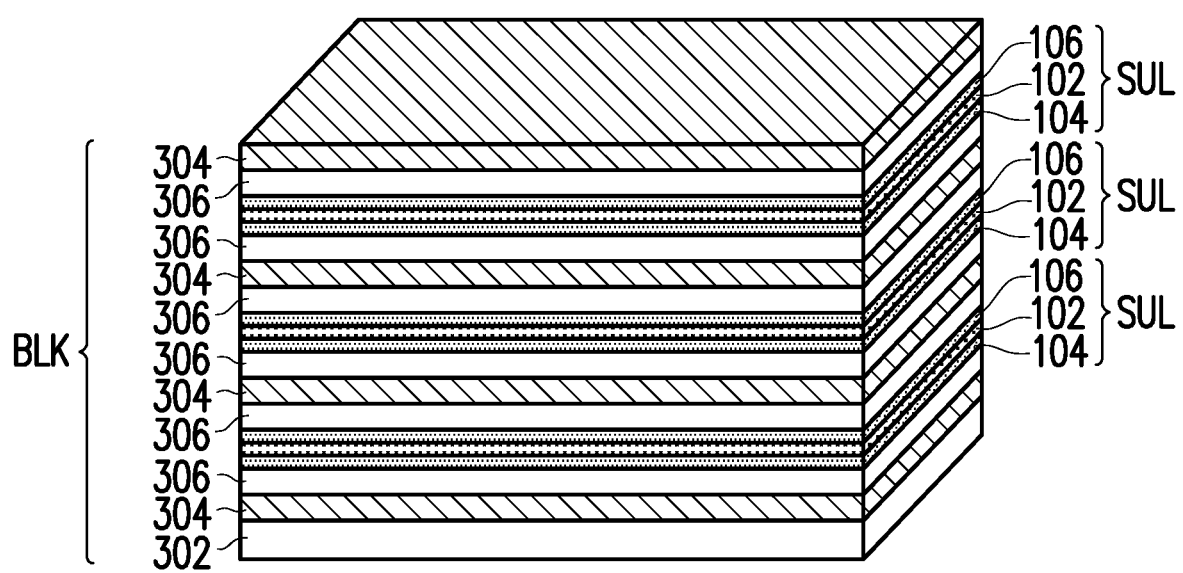

As such, referring to FIG. 5G, the stacking of the plurality of stacked unit layers SUL along with the gate dielectric materials 306 and the first gate material 304 over the semiconductor substrate 302 may be repeated until a desired number of stacking layers is formed. For example, as illustrated in FIG. 5G, a triple stacking heterostructure (with three stacked unit layers SUL) is formed over the semiconductor substrate 302 to form a stacked block structure BLK.

Figure 6:
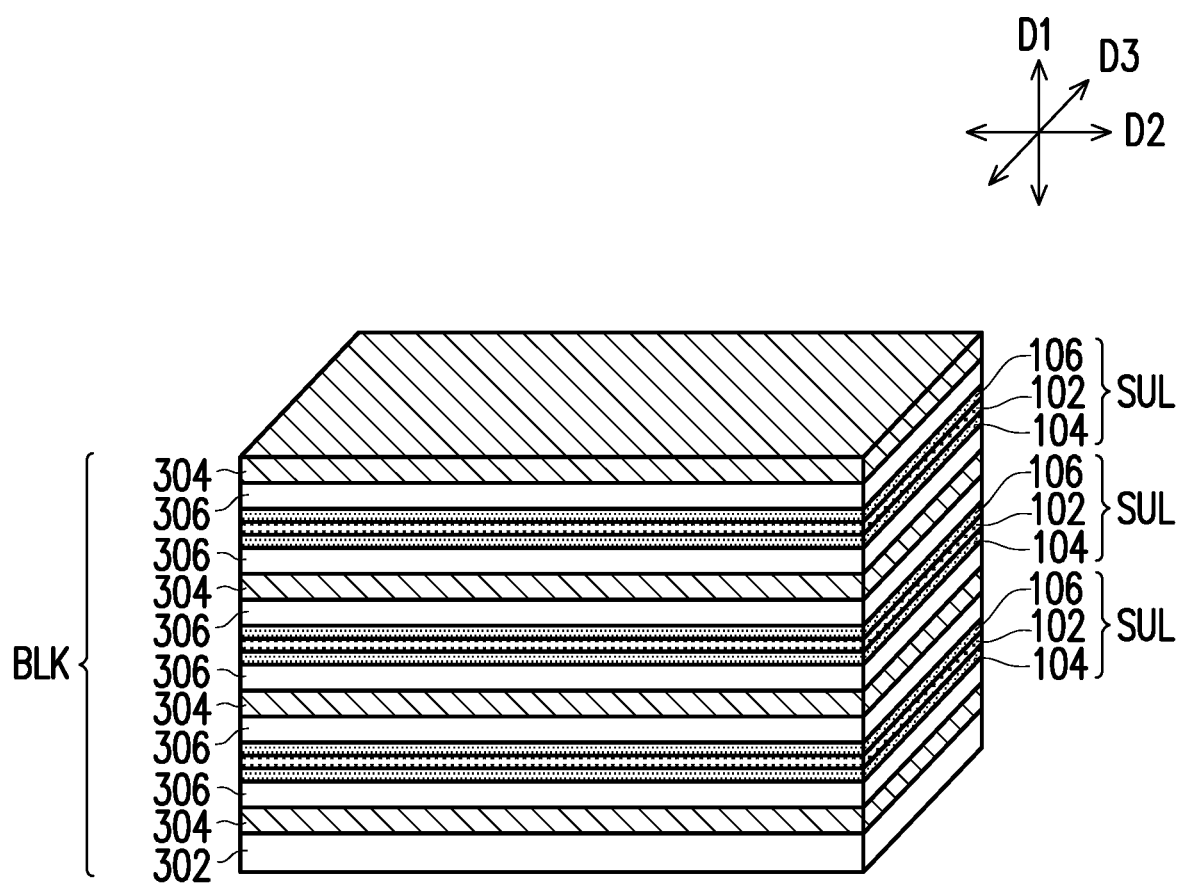
FIG. 6 to FIG. 17B are schematic views of various stages in a method of fabricating a semiconductor structure according to some exemplary embodiments of the present disclosure.

FIG. 6 to FIG. 17B are schematic views of various stages in a method of fabricating a semiconductor structure according to some exemplary embodiments of the present disclosure. Referring to FIG. 6, a stacked block structure BLK is provided over a semiconductor substrate 302 by stacking a plurality of stacked unit layers SUL, a plurality of gate dielectric materials 306 and a plurality of first gate materials 304 along a first direction D1. The stacked block structure BLK may be stacked up and formed by any of the method described in FIG. 3A to FIG. 3G, FIG. 4A to FIG. 4F and FIG. 5A to FIG. 5G. The disclosure is not limited thereto.

Figure 7A:
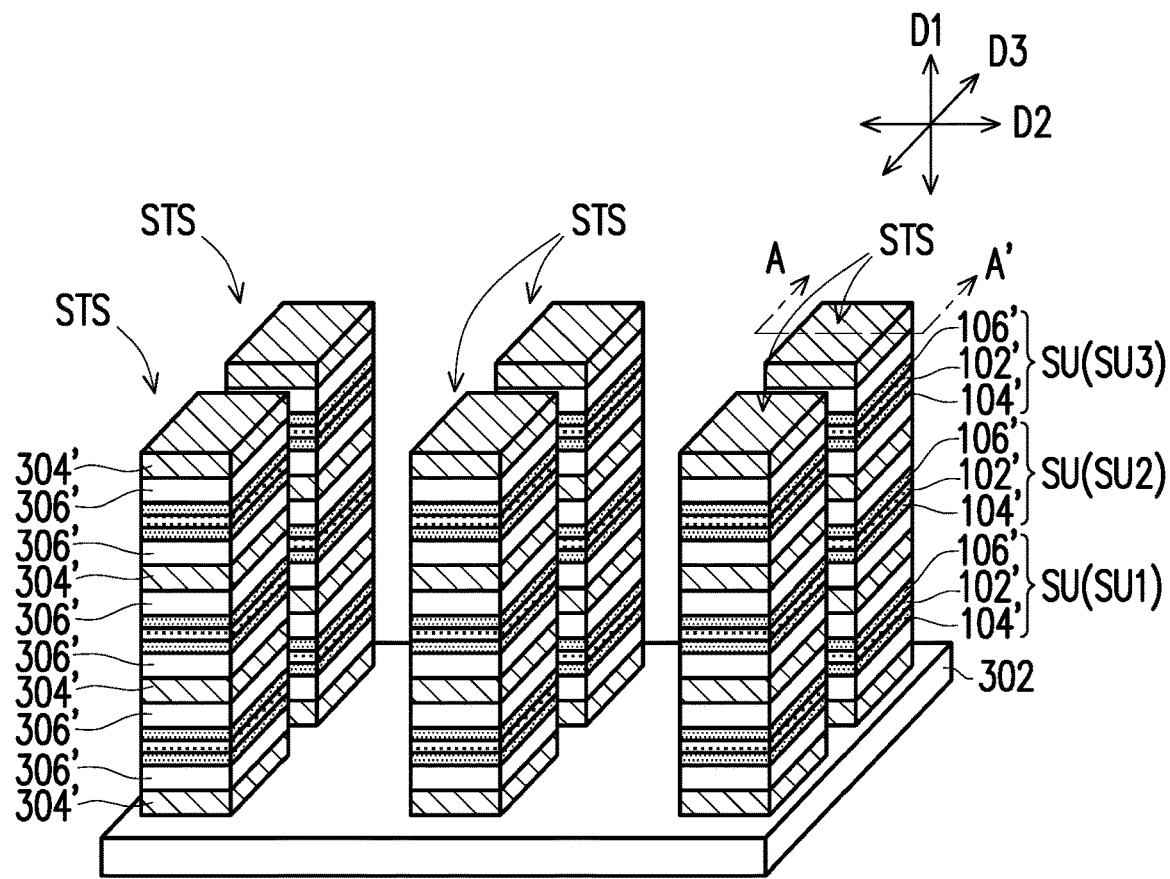
Figure 7B:
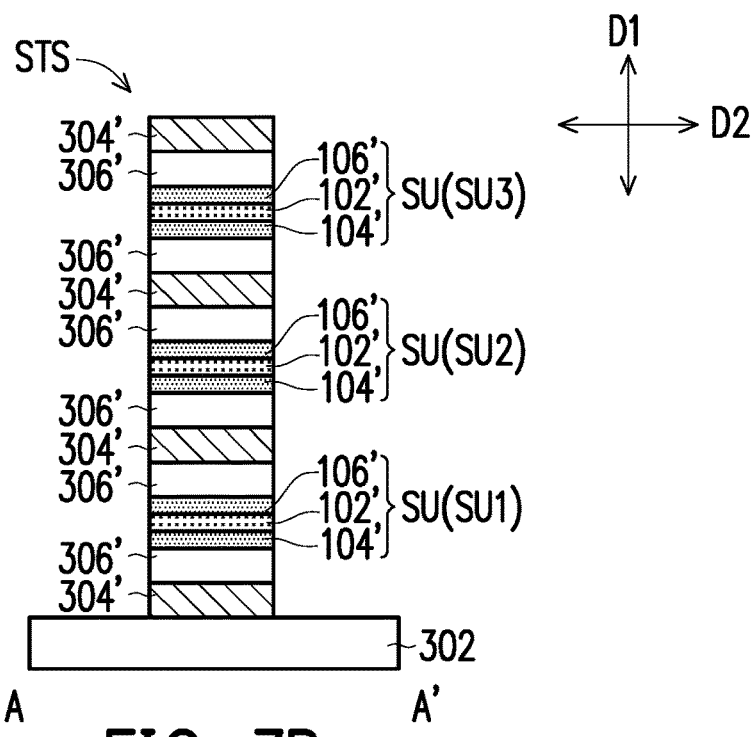

FIG. 7A is a schematic view of one stage in a method of fabricating a semiconductor structure S10, while FIG. 7B is a sectional view of the structure shown in FIG. 7A taken alone the line A-A'. Referring to FIG. 7A and FIG. 7B, the stacked unit layers SUL, the gate dielectric materials 306 and the first gate materials 304 of the stacked block structure BLK are patterned to form a plurality of stacked strip structures STS. Although six stacked strip structures STS are illustrated in FIG. 7A, it should be noted that the number of stacked strip structures STS formed from the stacked block structure BLK is not limited thereto, and this may be adjusted based on product requirements.

As illustrated in FIG. 7A and FIG. 7B, each of the stacked strip structures STS includes a plurality of stacked units SU stacked up along the first direction D1 over the semiconductor substrate 302. For example, a first stacked unit SU1, a second stacked unit SU2 and a third stacked unit SU3 are stacked up in sequence along the first direction D1. In some embodiments, the stacked units SU are stacked up along the first direction D1, while the stacked strip structures STS are spaced apart from one another and arranged along a second direction D2 and a third direction D3 (the planar direction). The first direction D1 being perpendicular to the second direction D2 and the third direction D3.

In some embodiments, each of the stacked units SU (SU1, SU2, and SU3) includes a first passivation layer 104', a channel layer 102' and a second passivation layer 106', whereby the channel layer 102' is sandwiched in between the first passivation layer 104' and the second passivation layer 106'. In the exemplary embodiment, the first passivation layer 104', the channel layer 102' and the second passivation layer 106' are respectively formed by patterning the first passivation material 104, the channel material 102 and the second passivation material 106.

Furthermore, in some embodiments, the first gate materials 304 are patterned to form a first portion 304' of a gate structure, while the gate dielectric materials 306 are patterned to form gate dielectrics 306'. As illustrated in FIG. 7A and FIG. 7B, the first portion 304' of the gate structure is covering a top surface and a bottom surface of each of the stacked units SU. In addition, the gate dielectrics 306' are surrounding the stacked units SU while separating the stacked units SU from the first portion 304' of the gate structure. In other words, each of the stacked units SU are physically separated from the first portion 304' of the gate structure.

Figure 8A:
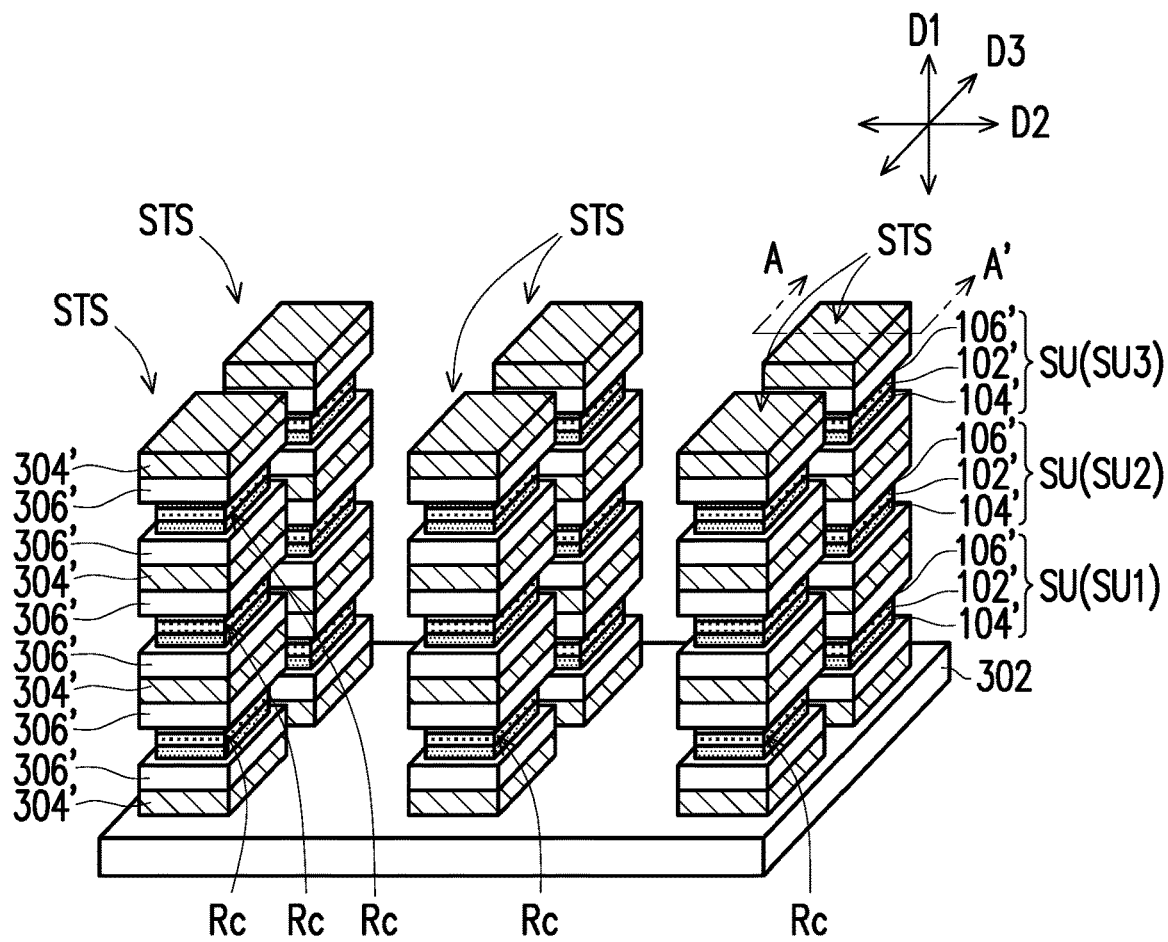
Figure 8B:
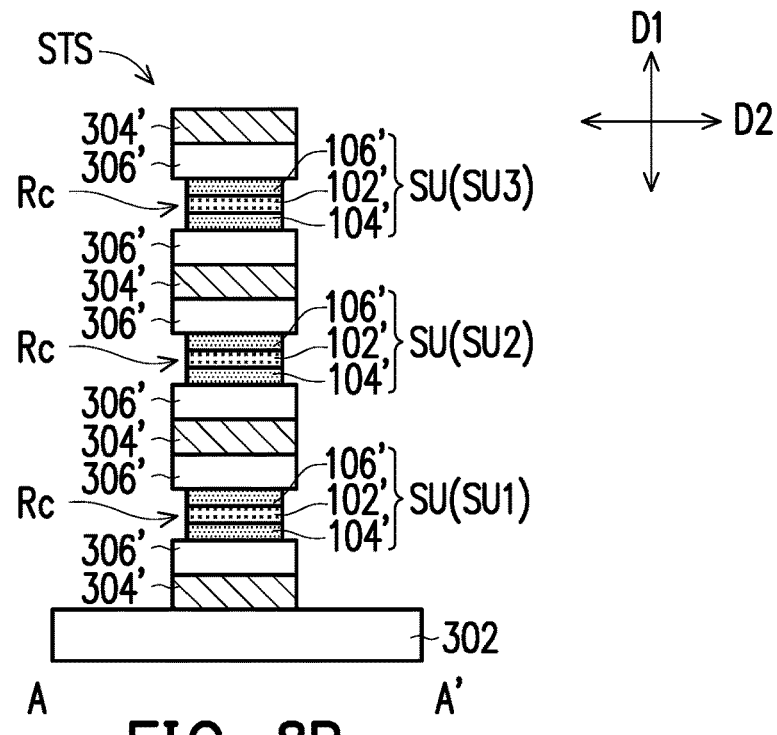

FIG. 8A is a schematic view of one stage in a method of fabricating a semiconductor structure S10, while FIG. 8B is a sectional view of the structure shown in FIG. 8A taken alone the line A-A'. Referring to FIG. 8A and FIG. 8B, in some embodiments, after forming the plurality of stacked strip structures STS, lateral etching is performed to remove portions of the stacked strip structures STS to form a plurality of recesses Rc. For example, isotropic etching is performed laterally on the first passivation layer 104', the channel layer 102' and the second passivation layer 106' to remove portions of the stacked units SU to form the recesses Rc. In some embodiments, wet etching or dry etching is performed to form the recesses Rc. In certain embodiments, a width of each of the stacked units SU is formed to be smaller than widths of the first portion 304' of a gate structure and the gate dielectrics 306' after the lateral etching process.

Figure 9A:
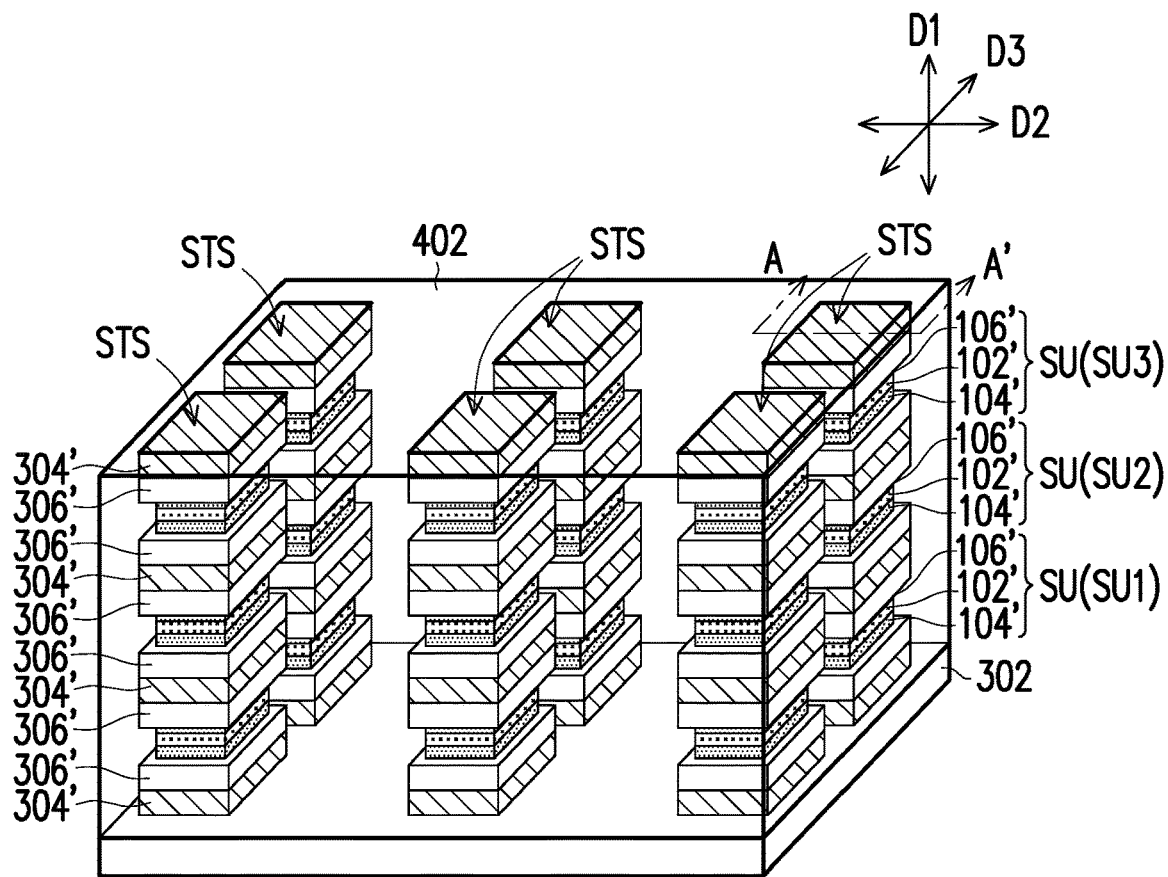
Figure 9B:
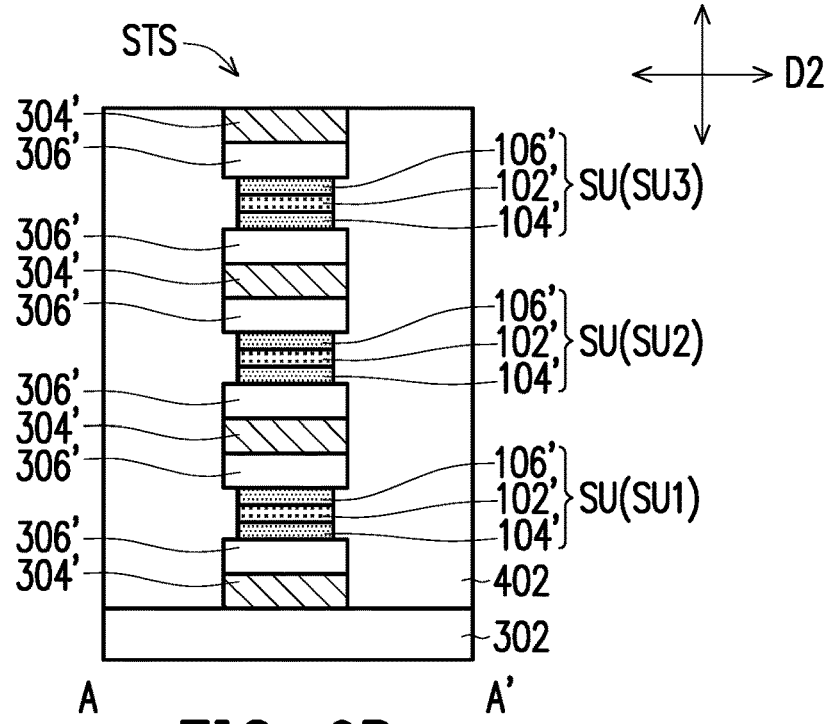

FIG. 9A is a schematic view of one stage in a method of fabricating a semiconductor structure S10, while FIG. 9B is a sectional view of the structure shown in FIG. 9A taken alone the line A-A'. Referring to FIG. 9A and FIG. 9B, a dielectric material 402 is formed in between the spaces of the stacked strip structures STS and in the plurality of recesses Rc. The dielectric material 402 include silicon oxide ($SiO_2$), aluminum oxide ($Al_2O_3$) hafnium oxide ($HfO_2$), or the like. In one embodiment, the dielectric material 402 is similar to a material of the gate dielectrics 306'. In some embodiments, the dielectric material 402 is formed in between the spaces of the stacked strip structures STS and in the recesses Rc by suitable deposition techniques, such as chemical vapor deposition (CVD), atomic layer deposition (ALD), or the like.

Figure 10A:
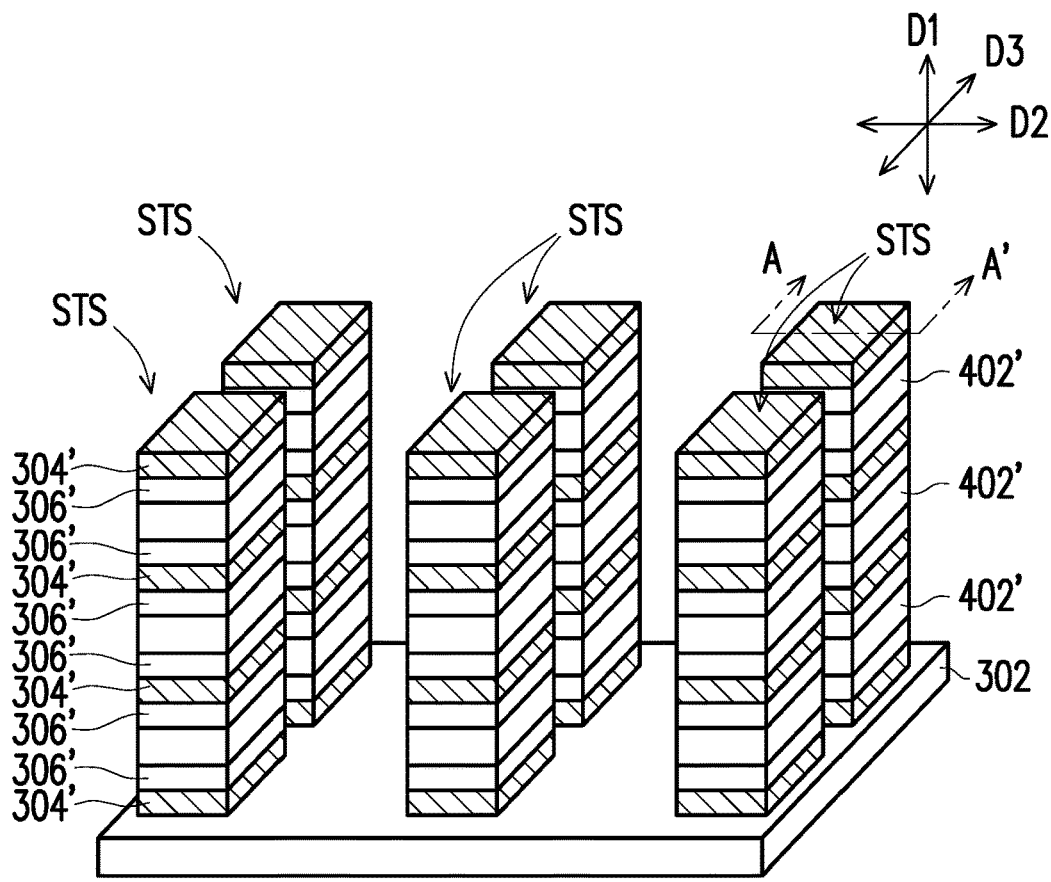
Figure 10B:
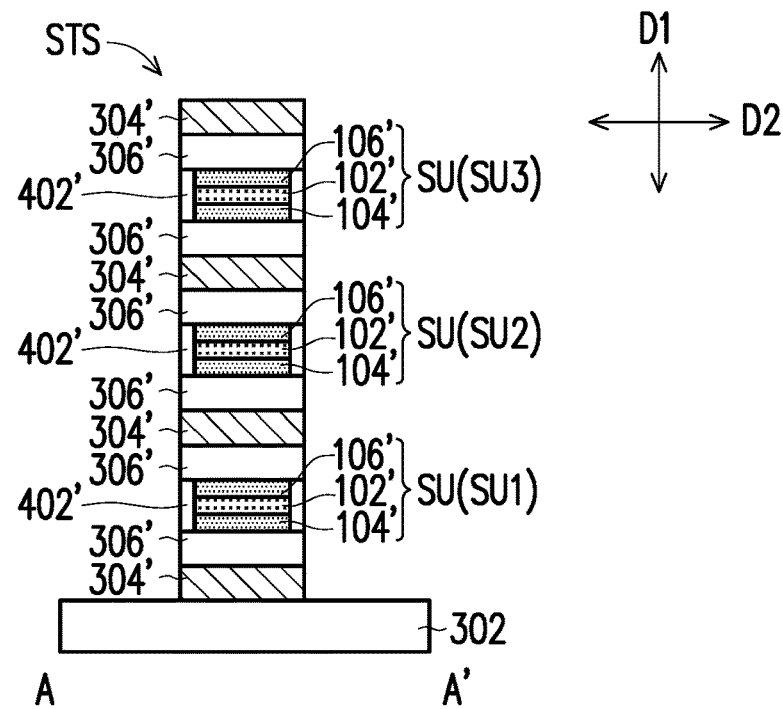

FIG. 10A is a schematic view of one stage in a method of fabricating a semiconductor structure S10, while FIG. 10B is a sectional view of the structure shown in FIG. 10A taken alone the line A-A'. Referring to FIG. 10A and FIG. 10B, in some embodiments, the dielectric material 402 is patterned (e.g. by anisotropic etching) to form a plurality of side dielectrics 402' surrounding each of the stacked units SU. For example, after patterning the dielectric material 402 to form the side dielectrics 402', sidewalls of the side dielectrics 402' are aligned with sidewalls of the first portion 304' of the gate structure and sidewalls of the gate dielectrics 306'. The side dielectrics 402' may be joined with the gate dielectrics 306' located above and below, and the side dielectrics 402' may be formed as part of the stacked strip structure STS.

Figure 11A:
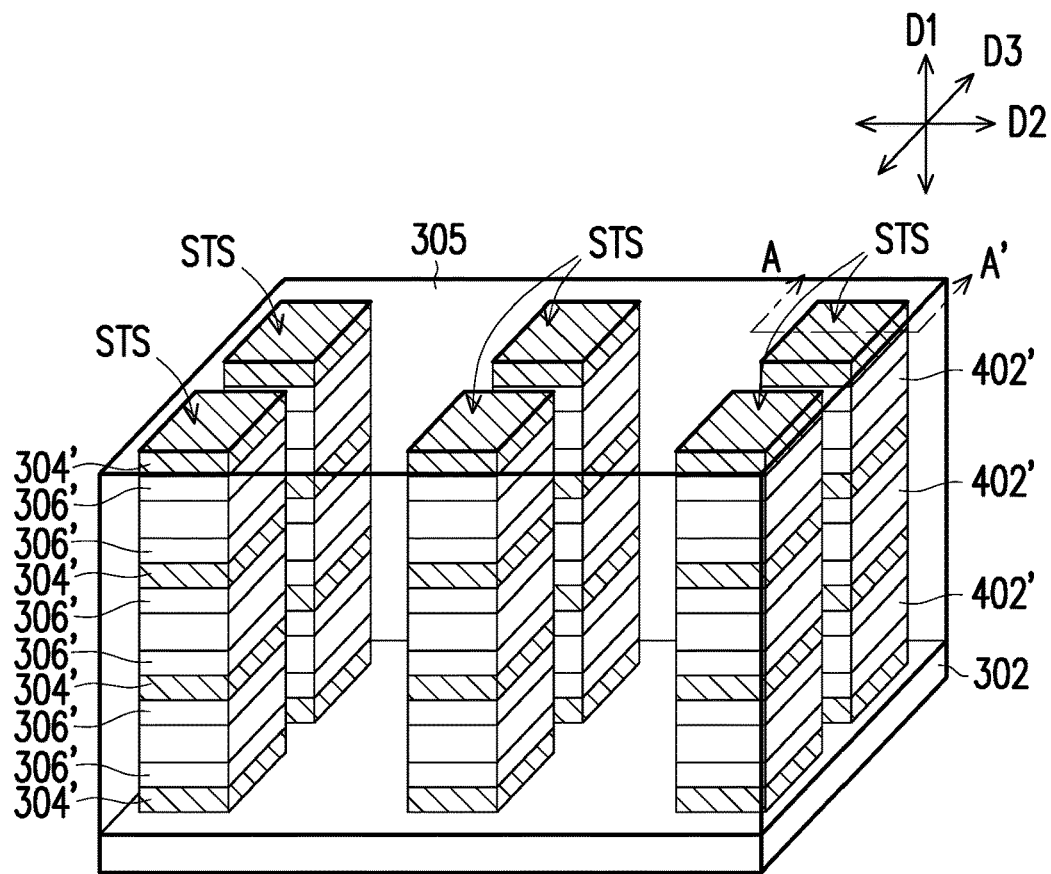
Figure 11B:
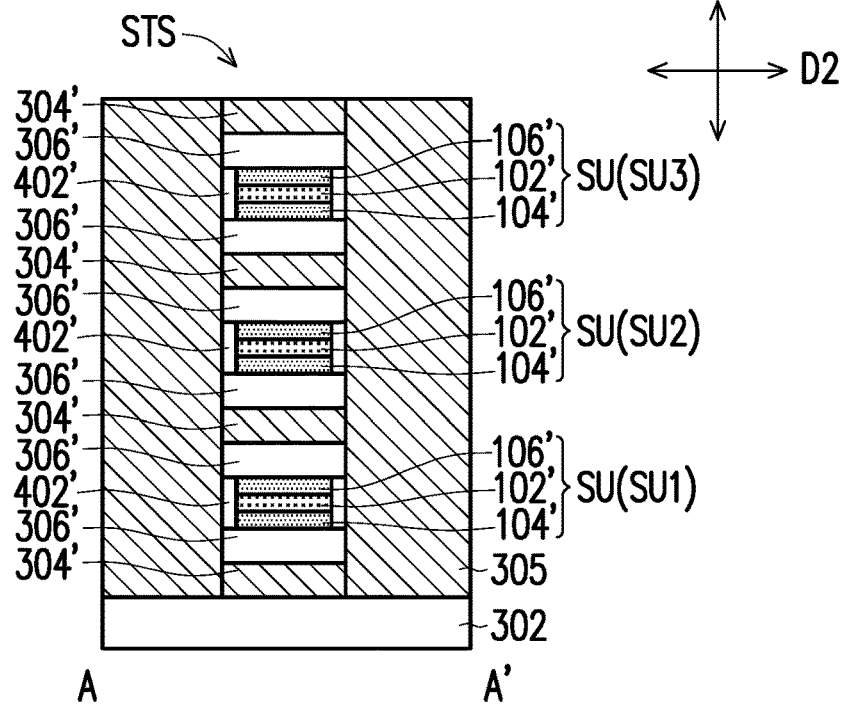

FIG. 11A is a schematic view of one stage in a method of fabricating a semiconductor structure S10, while FIG. 11B is a sectional view of the structure shown in FIG. 11A taken alone the line A-A'. Referring to FIG. 11A and FIG. 11B, a second gate material 305 is formed over the semiconductor substrate 302 to surround the plurality of stacked strip structures STS. For example, the second gate material 305 includes gold (Au), silver (Ag), copper, titanium nitride, or the like. In one embodiment, the second gate material 305 and the first portion 304' of the gate structure are made of the same materials.

Figure 12A:
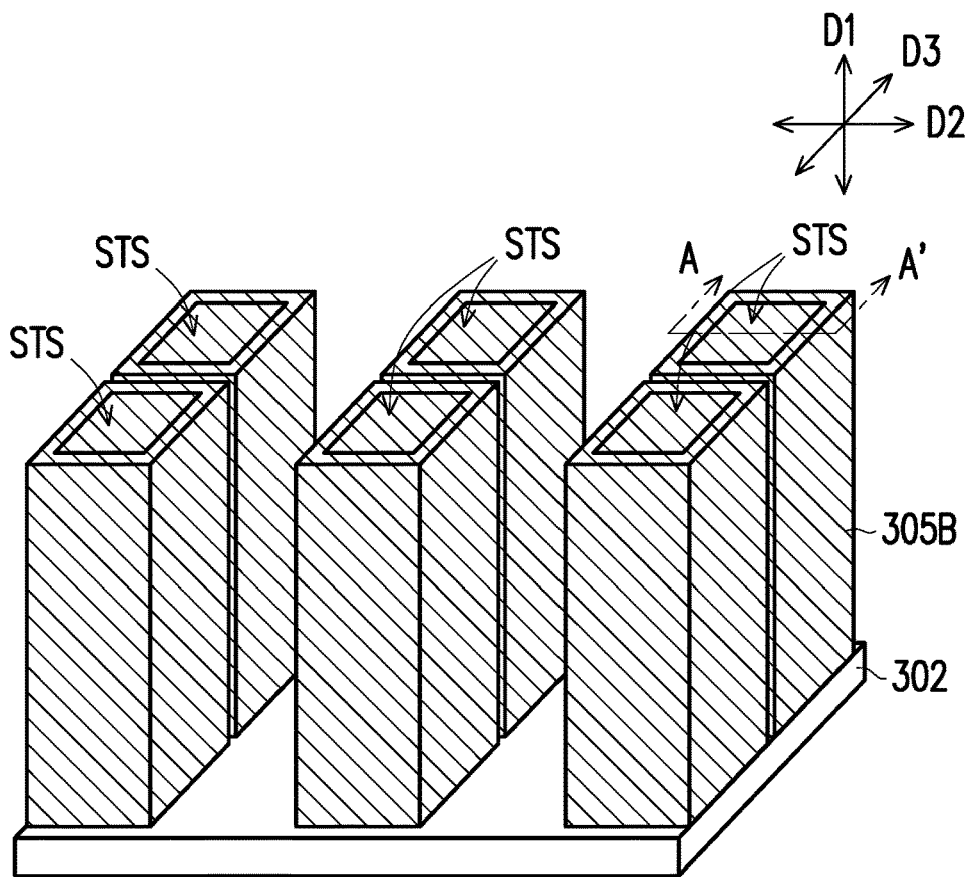
Figure 12B:
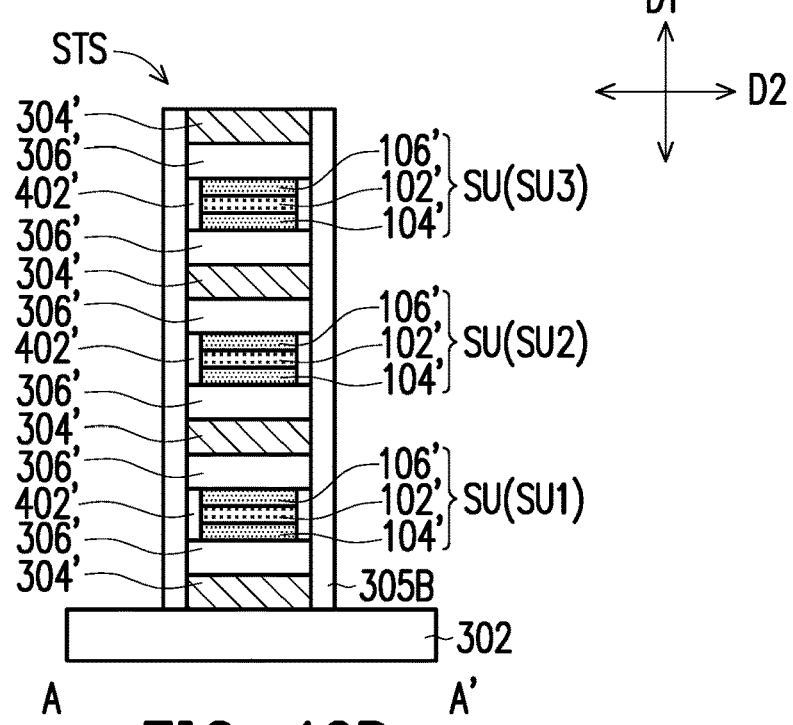

FIG. 12A is a schematic view of one stage in a method of fabricating a semiconductor structure S10, while FIG. 12B is a sectional view of the structure shown in FIG. 12A taken alone the line A-A'. Referring to FIG. 12A and FIG. 12B, in some embodiments, the second gate material 305 is further patterned to form a plurality of gate blocks 305B. In certain embodiments, each of the gate blocks 305B surround a single stacked strip structure STS, while the gate blocks 305 are separated from one another. In other words, the gate blocks 305B may define an area of forming the semiconductor structure S10.

Figure 13A:
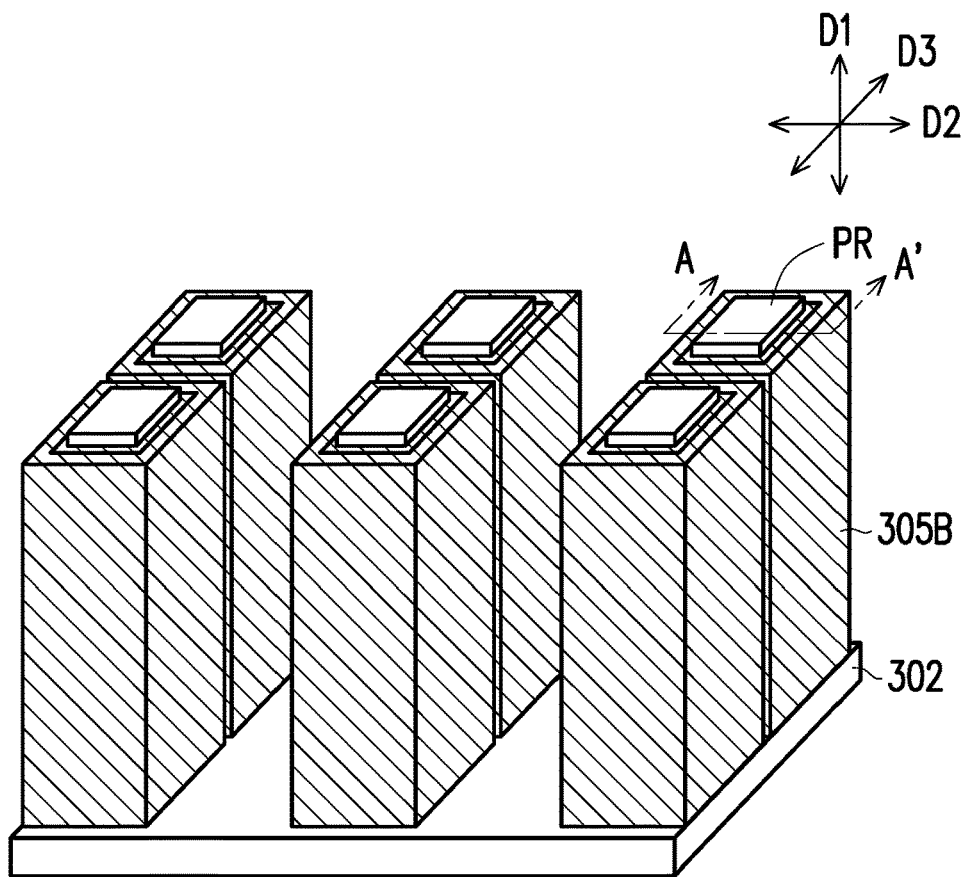
Figure 13B:
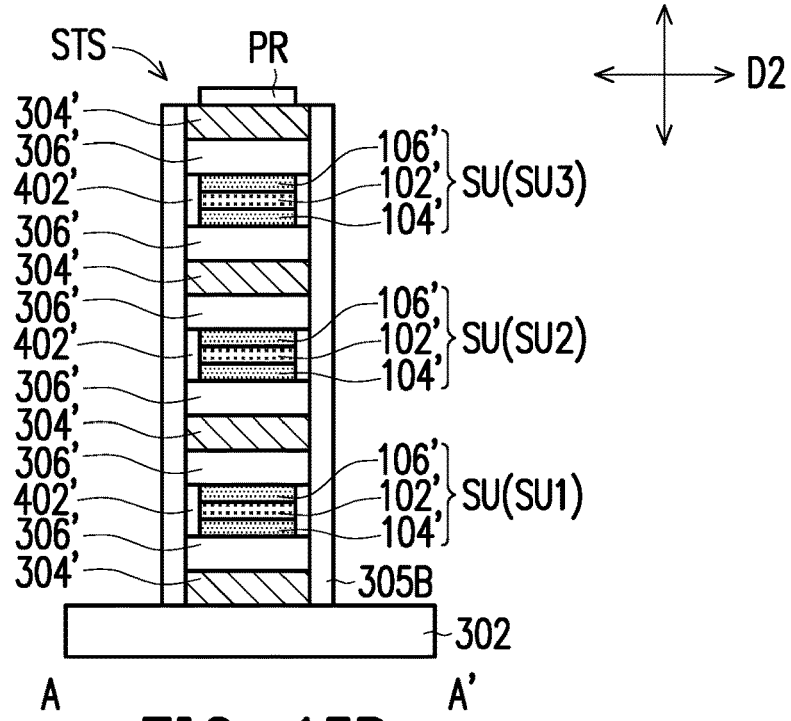

FIG. 13A is an enlarged view of one gate block 305B surrounding a stacked strip structure STS at one stage in a method of fabricating a semiconductor structure S10, while FIG. 13B is a sectional view of the structure shown in FIG. 13A taken alone the line A-A'. Referring to FIG. 13A and FIG. 13B, a photoresist pattern PR is disposed on the stacked strip structure STS to cover the first portion 304' of the gate structure, and to cover portions of the gate block 305B. In some embodiments, the photoresist pattern PR may have sidewalls that are aligned with sidewalls of the stacked units SU located below. In one embodiment, the photoresist pattern PR may be formed by coating (such as spin-coating) and photolithography processes or the like; however, the disclosure is not limited thereto. A material of the photoresist pattern PR, for example, includes a positive resist material or a negative resist material, that is suitable for a patterning process such as a photolithography process with a mask or a mask-less photolithography process (for instance, an electron-beam (e-beam) writing or an ion-beam writing).

Figure 14A:
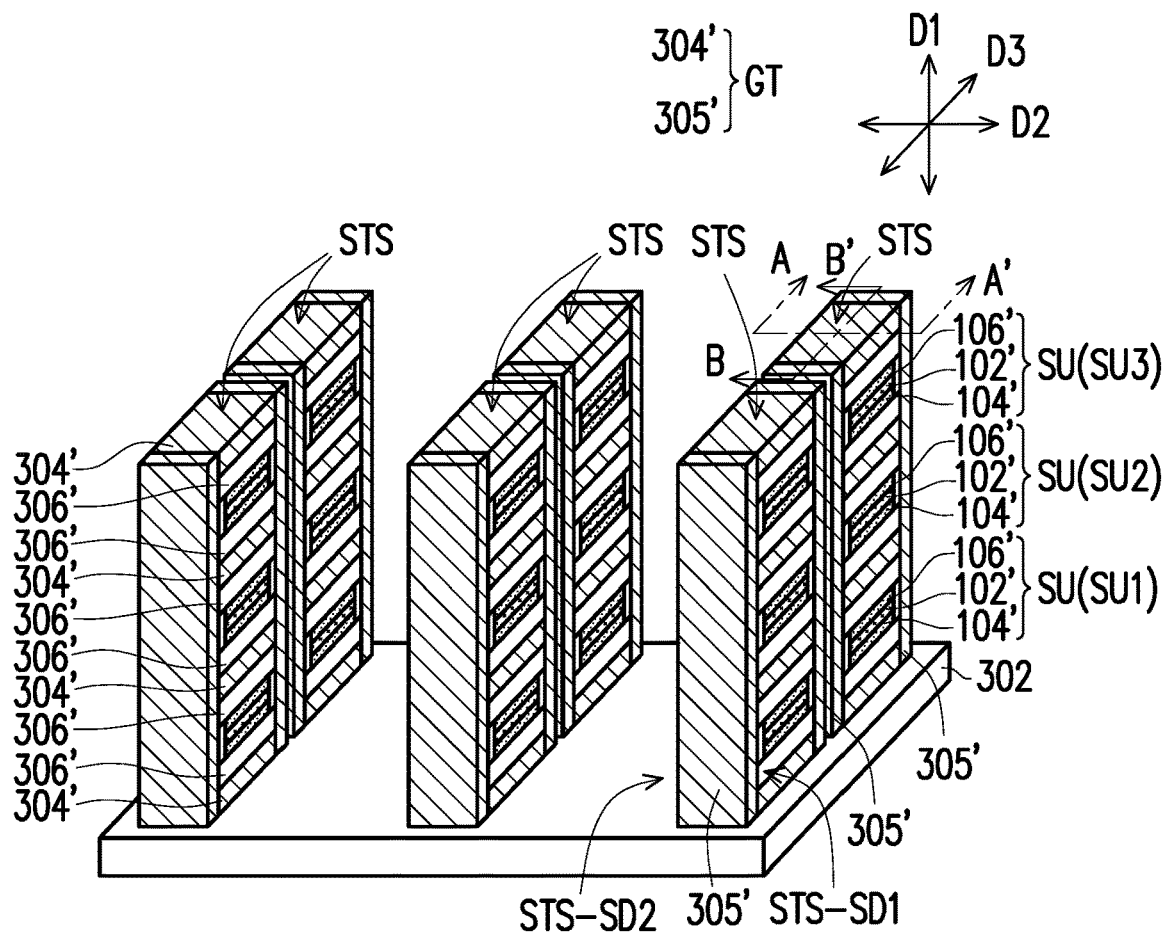
Figure 14B:
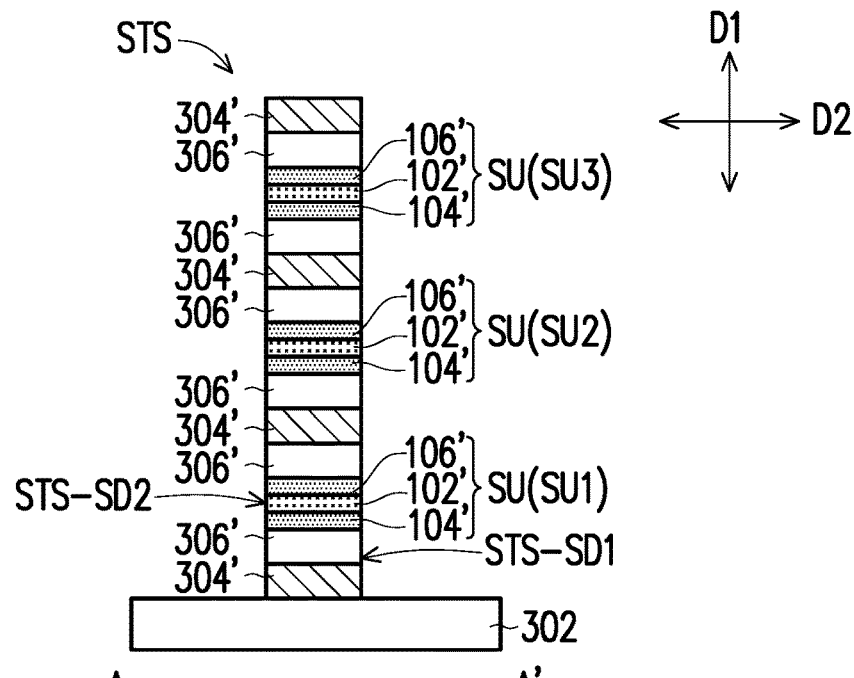
Figure 14C:
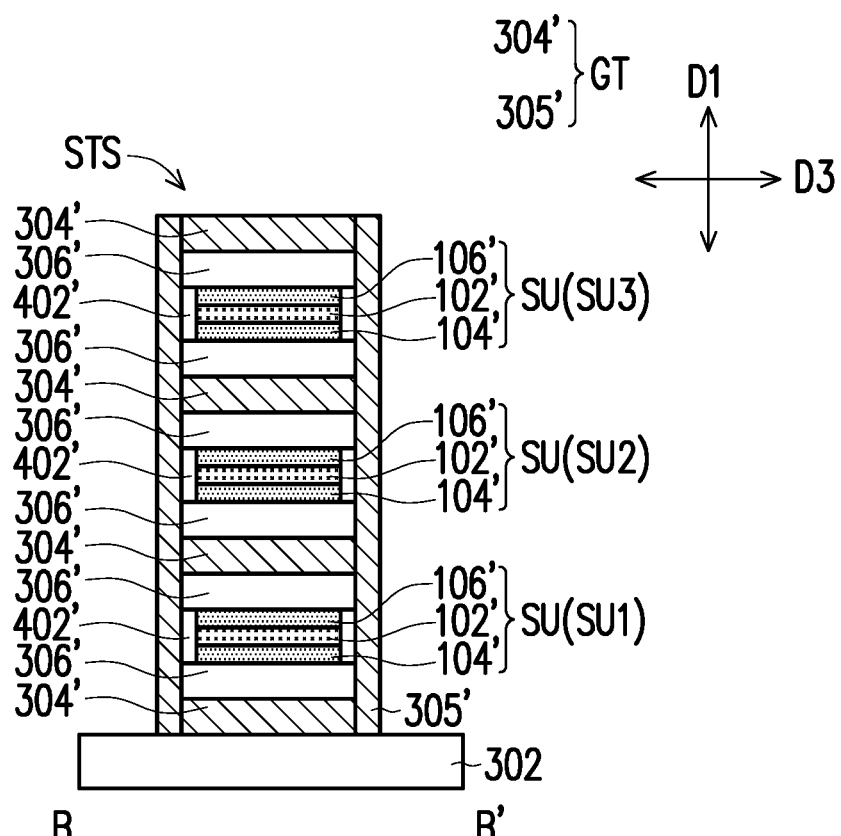

FIG. 14A is a schematic view of one stage in a method of fabricating a semiconductor structure S10, FIG. 14B is a sectional view of the structure shown in FIG. 14A taken alone the line A-A', and FIG. 14C is a sectional view of the structure shown in FIG. 14A taken alone the line B-B'. Referring to FIG. 14A to FIG. 14C, a patterning process is performed to remove portions of the stacked strip structure STS and portions of the gate block 305B not covered by the photoresist pattern PR. For example, the gate block 305B (second gate material) is patterned to form a second portion 305' of the gate structure GT. In the exemplary embodiment, the first portion 304' and the second portion 305' constitute the gate structure GT (conductive structure) of each stacked strip structure STS. In some embodiments, the first portion 304' is covering a top surface and a bottom surface of each stacked units SU (SU1, SU2, SU3), while the second portion 305' is connected to the first portion 304' and covering sidewalls of each of the stacked units SU (as shown in FIG. 14C). In certain embodiments, the first portion 304' and the second portion 305' of the gate structure GT wraps around each of the stacked units SU (as shown in FIG. 14A). In other words, a gate all around (GAA) structure is achieved.

As further illustrated in FIG. 14A to FIG. 14C, after the patterning process, the gate structure GT is wrapping around four sides of the stacked units SU (SU1, SU2, SU3), while two opposing sidewalls of the channel layers 102' are exposed by the gate structure GT. Furthermore, the channel layers 102' are exposed from two opposing sides (a first side STS-SD1 and a second side STS-SD2) of the stacked strip structure STS. In some embodiments, the gate structure GT is further wrapping around the gate dielectrics 306' and the side dielectrics 402'. In certain embodiments, referring to FIG. 14B, sidewalls of the channel layers 102' may be aligned with sidewalls of the gate dielectrics 306' and sidewalls of the passivation layers (104', 106'). In other words, the gate dielectrics 306' and the passivation layers (104', 106') may also be exposed from two opposing sides (the first side STS-SD1 and the second side STS-SD2) of the stacked strip structure STS.

Figure 15A:
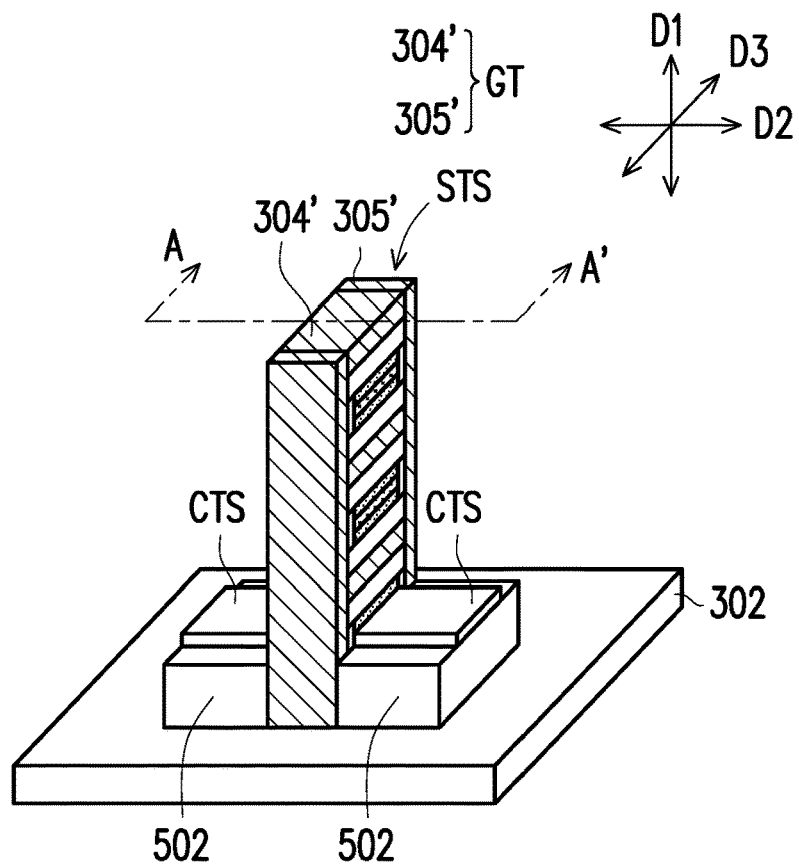
Figure 15B:
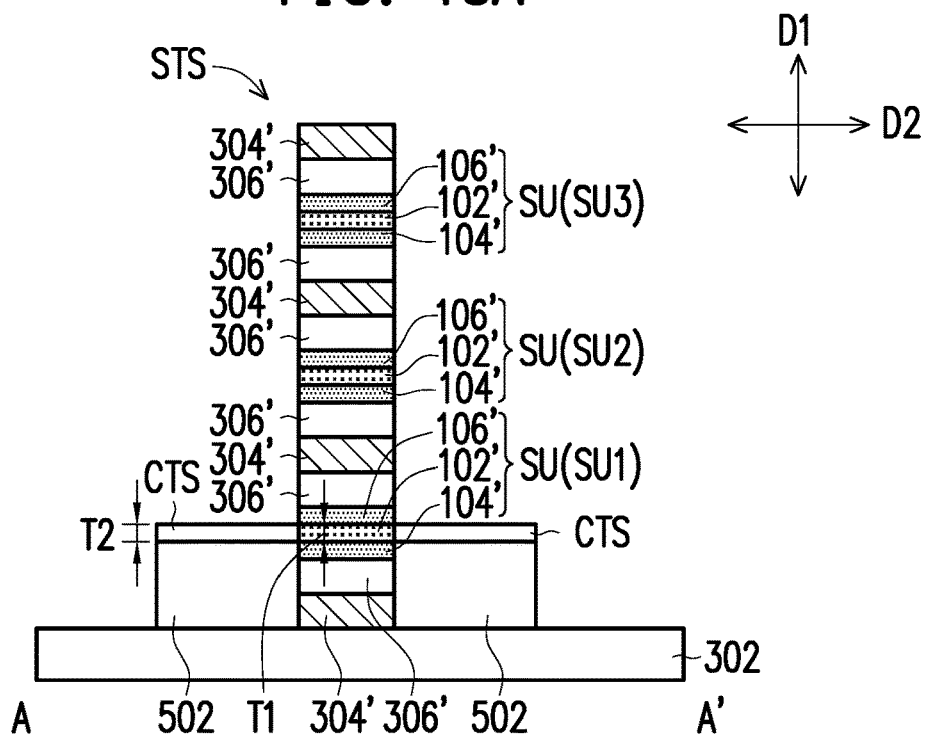

FIG. 15A is a schematic view of one stage in a method of fabricating a semiconductor structure S10, while FIG. 15B is a sectional view of the structure shown in FIG. 15A taken alone the line A-A'. Referring to FIG. 15A and FIG. 15B, inter-dielectric layers 502 are formed on the substrate 302 on the two opposing sides (the first side STS-SD1 and the second side STS-SD2 in FIG. 14A) of the stacked strip structure STS. For example, the inter-dielectric layers 502 are covering two opposing sides of the first portion 304', the gate dielectric 306' and the first passivation layer 104'. In some embodiments, the inter-dielectric layers 502 include silicon oxide, silicon nitride, silicon oxynitride, a spin-on dielectric material, a low-k dielectric material or the like.

Thereafter, a plurality of contact structures CTS is formed on the inter-dielectric layers 502 over the semiconductor substrate 302. The contact structures CTS are made of conductive materials, such as metals or metal alloys including one or more of Al, AlCu, Cu, Ti, TiN, tungsten (W), and the like, which may be patterned using a photolithography and etching process. In some embodiments, the contact structures CTS are physically connected to two opposing sidewalls of the channel layer 102' exposed from the stacked strip structure STS. In some embodiments, the contacts structures CTS are stacked up over the inter-dielectric layers 502 along the first direction D1. In certain embodiments, the contact structures CTS are extending in a second direction D2 (a planar direction) that is perpendicular to the first direction D1 (the build-up direction). In certain embodiments, the contact structures CTS are physically separated from the gate structure GT. In other words, the contact structures CTS does not extend beyond the channel layer 102' (in the third direction D3), and is physically separated from the second portion 305' of the gate structure GT. In one embodiment, a thickness T1 of the contact structures CTS is substantially equal to a thickness T2 of the channel layer 102'.

Figure 16A:
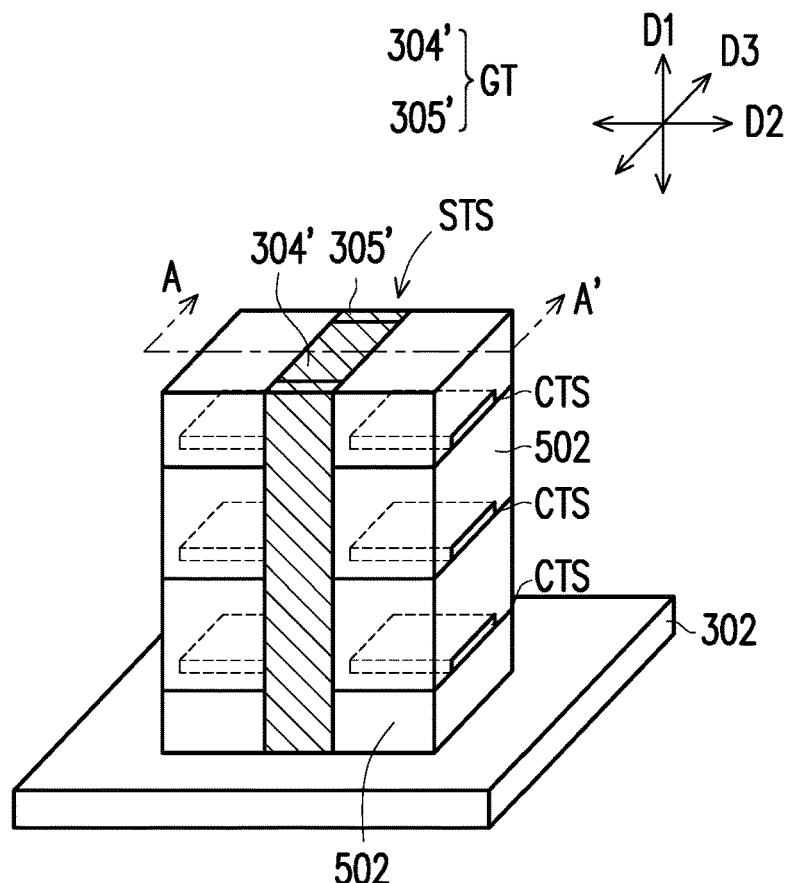
Figure 16B:
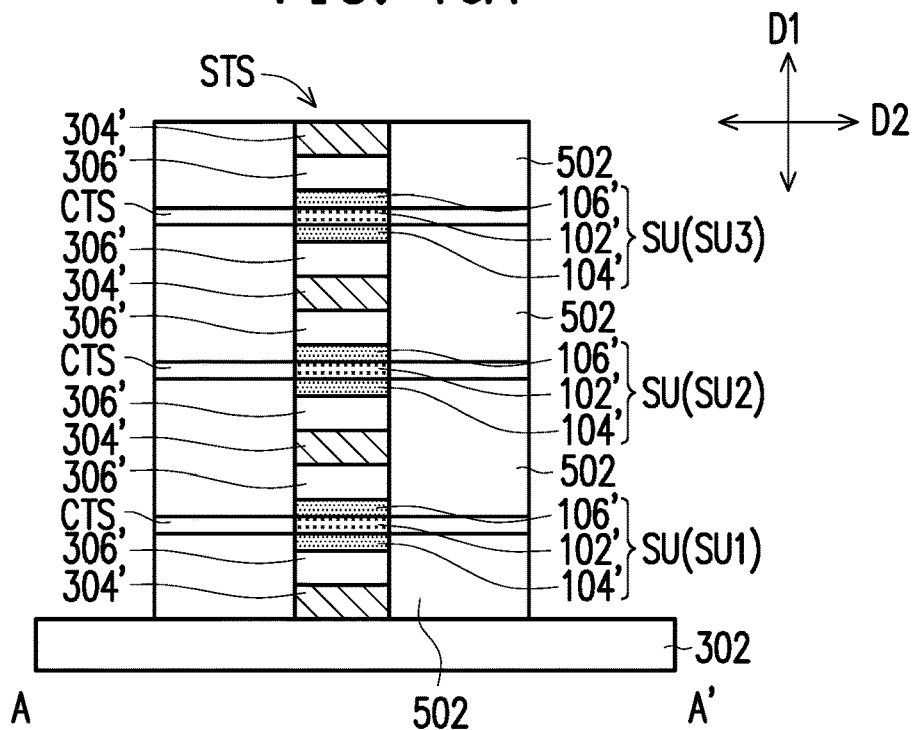

FIG. 16A is a schematic view of one stage in a method of fabricating a semiconductor structure S10, while FIG. 16B is a sectional view of the structure shown in FIG. 16A taken alone the line A-A'. Referring to FIG. 16A and FIG. 16B, the formation of the inter-dielectric layers 502 and the contact structures CT along the first direction D1 are repeated so that the topmost inter-dielectric layer 502 is aligned with a top surface of the stacked strip structure STS (or top surface of the gate structure GT). For example, the contact structures CTS are sandwiched between or surrounded the inter-dielectric layers 502, and are physically connected to two opposing sidewalls of each of the channel layers 102'.

Figure 17A:
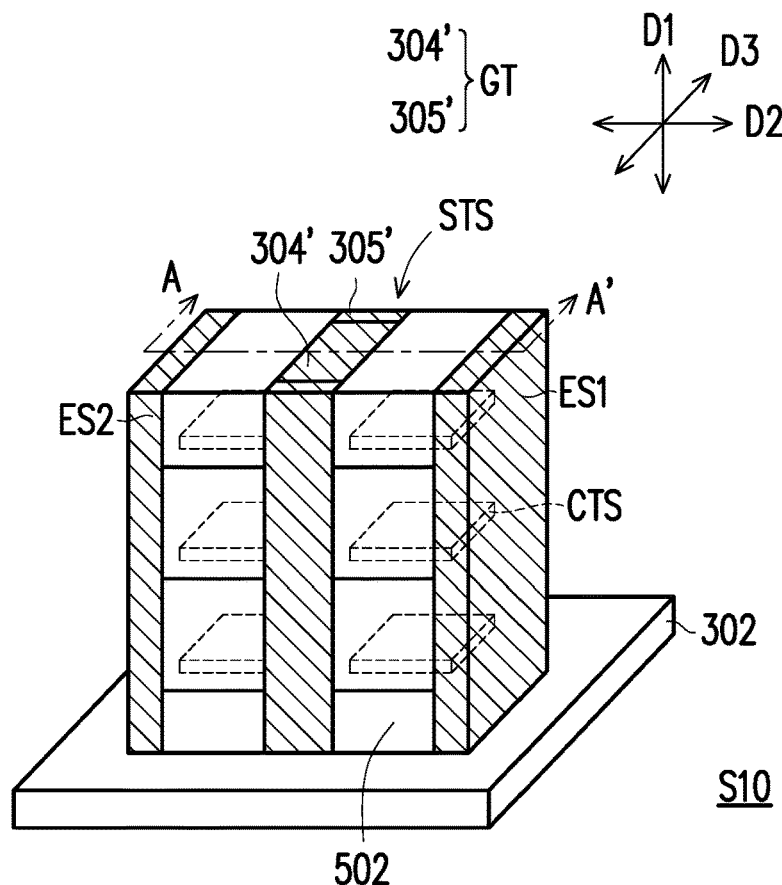
Figure 17B:
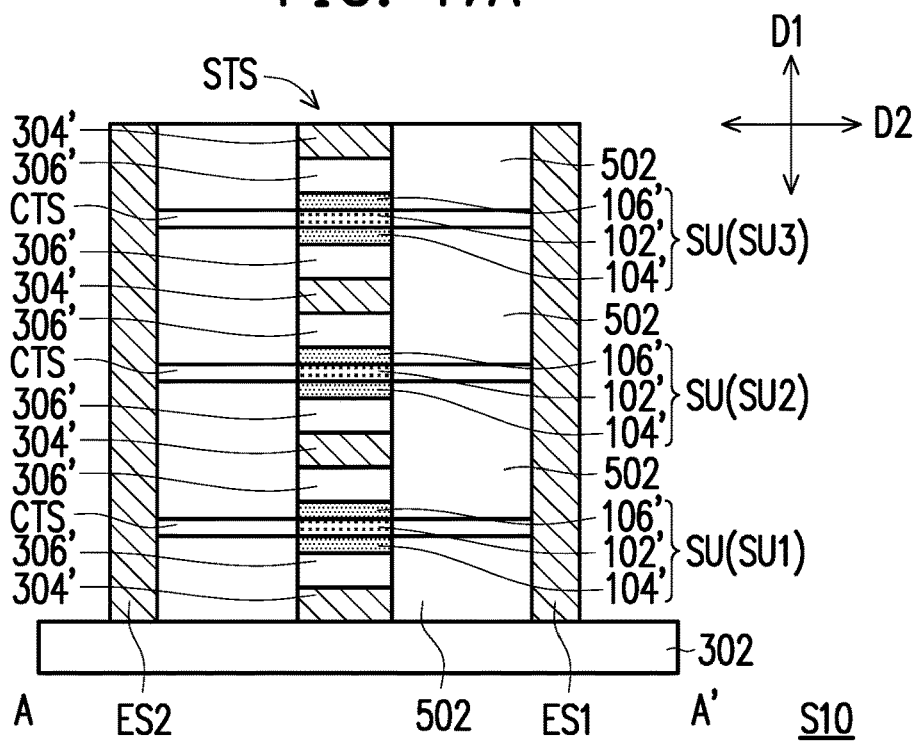

FIG. 17A is a schematic view of one stage in a method of fabricating a semiconductor structure S10, while FIG. 17B is a sectional view of the structure shown in FIG. 17A taken alone the line A-A'. Referring to FIG. 17A and FIG. 17B, in a subsequent step, electrode strips (ES1, ES2) are formed on two opposing sides of the stacked strip structure STS. For example, in one embodiment, a first electrode strip ES1 and a second electrode strip ES2 are formed on two opposing sides of the gate structure GT. In certain embodiments, the contact structures CT are connecting the channel layer 102' of each of the stacked units SU to the first electrode strip ES1 and the second electrode strip ES2. In other words, the inter-dielectric layers 502 and the contact structures CT are located in between the gate structure GT and the first electrode strip ES1, and in between the gate structure GT and the second electrode strip ES2.

In some embodiments, the first electrode strip ES1 and the second electrode strip ES2 are source/drain electrodes, including materials such as gold (Au), palladium (Pd), nickel (Ni), or the like. In certain embodiments, heights of the first electrode strip ES1 and the second electrode strip ES2 are substantially equal to a height of the gate structure GT (or equal to a height of the stacked strip structure STS). In other words, top surfaces of the first electrode strip ES1 and the second electrode strip ES2 are aligned with a top surface of the gate structure GT, and a top surface of the inter-dielectric layers 502. Up to here, a semiconductor structure S10 according to some embodiments of the present disclosure is accomplished. In some embodiments, the semiconductor structure S10 is a triple stacking heterostructure with three stacked units SU forming three transistors. In alternative embodiments, the number of stacked units SU or transistors formed in the semiconductor structure S10 may be adjusted based on product requirements.

FIG. 18 to FIG. 31B are schematic views of various stages in a method of fabricating a semiconductor structure according to some other exemplary embodiments of the present disclosure. The method illustrated in FIG. 18B to FIG. 31B is similar to the method illustrated in FIG. 6 to FIG. 17B. Therefore, the same reference numerals are used to refer to the same or liked parts, and its detailed description will be omitted herein.

Figure 18:
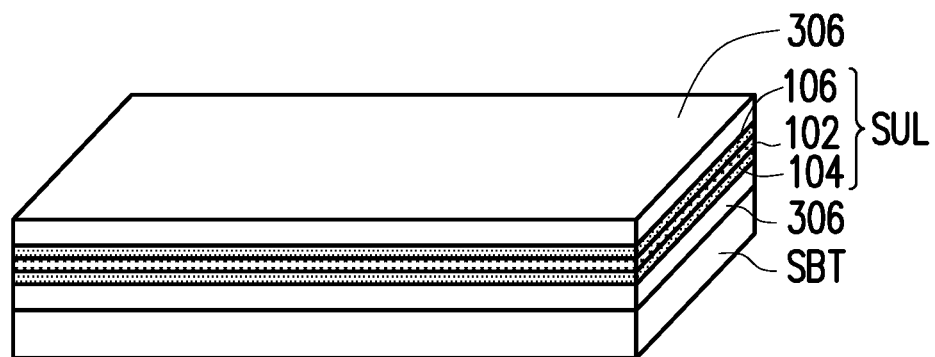
FIG. 18 to FIG. 31B are schematic views of various stages in a method of fabricating a semiconductor structure according to some other exemplary embodiments of the present disclosure.
Figure 19:
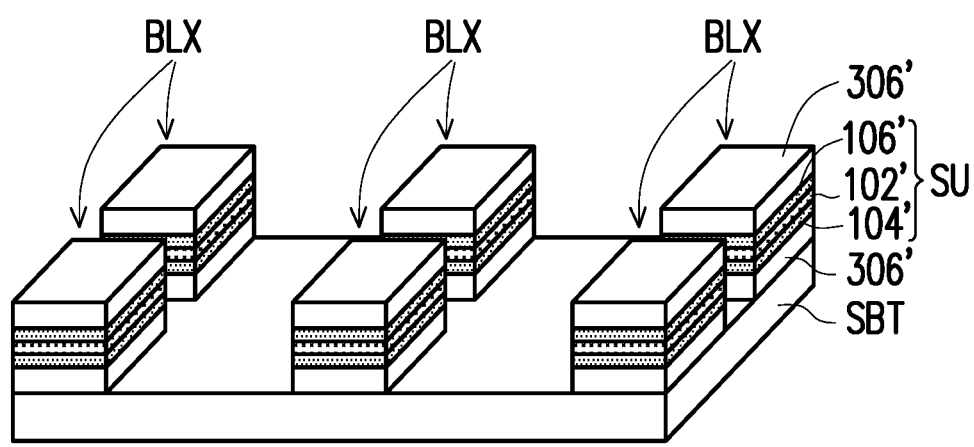

Referring to FIG. 18, in some embodiments, a stacked unit layer SUL sandwiched between two gate dielectric materials 306 are formed over the substrate SBT based on the method described in FIG. 5A to FIG. 5C. Referring to FIG. 19, in a subsequent step, the structure shown in FIG. 18 is patterned to form a plurality of stacked block units BLX that is separated from one another. For example, each of the stacked block units BLX include a stacked unit SU sandwiched between two gate dielectrics 306', and the stacked unit SU include a first passivation layer 104', a channel layer 102' and a second passivation layer 106' stacked up in sequence.

Figure 20A:
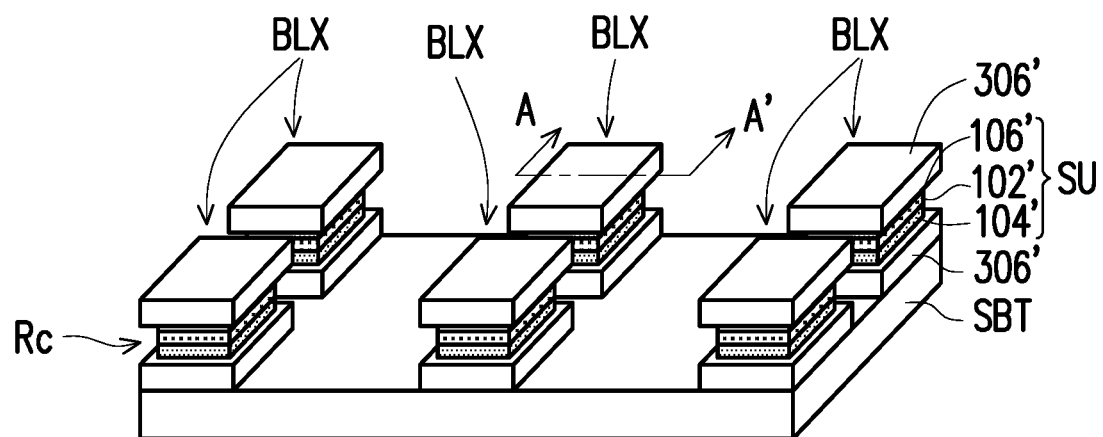
Figure 20B:
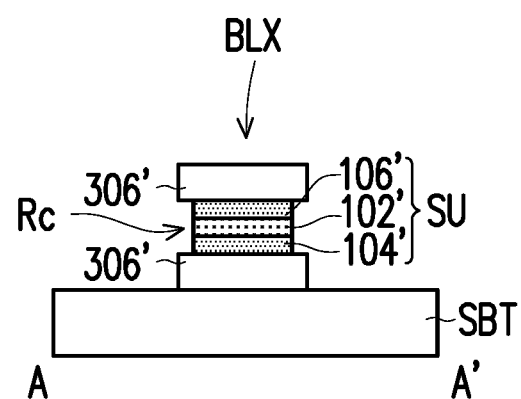

FIG. 20A is a schematic view of one stage in a method of fabricating a semiconductor structure S20, while FIG. 20B is a sectional view of the structure shown in FIG. 20A taken alone the line A-A'. Referring to FIG. 20A and FIG. 20B, in some embodiments, after forming the stacked block units BLX, lateral etching is performed to remove portions of the stacked block units BLX to form a plurality of recesses Rc. For example, isotropic etching is performed laterally on the first passivation layer 104', the channel layer 102' and the second passivation layer 106' to remove portions of the stacked units SU to form the recesses Rc. In some embodiments, wet etching or dry etching is performed to form the recesses Rc. In certain embodiments, a width of each of the stacked units SU is formed to be smaller than widths of the gate dielectrics 306' after the lateral etching process.

Figure 21A:
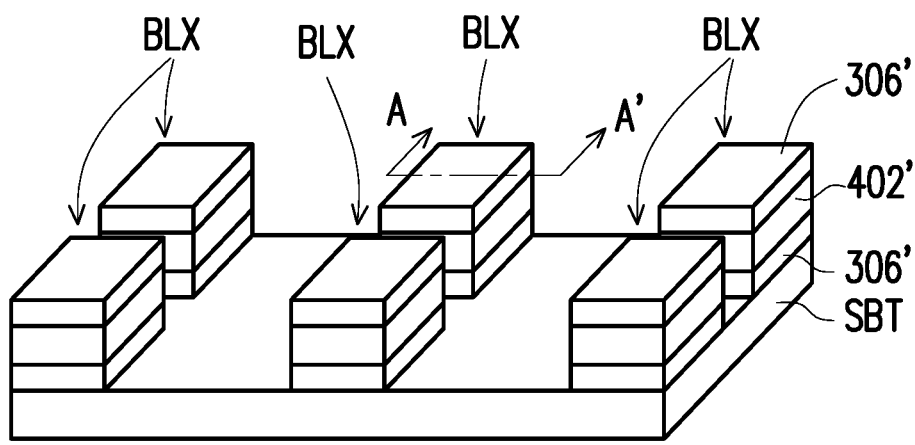
Figure 21B:
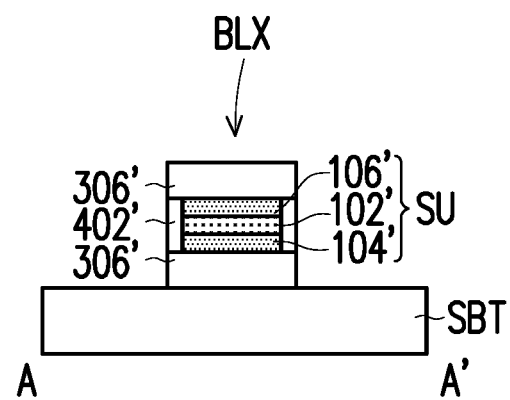

FIG. 21A is a schematic view of one stage in a method of fabricating a semiconductor structure S20, while FIG. 21B is a sectional view of the structure shown in FIG. 21A taken alone the line A-A'. Referring to FIG. 21A and FIG. 21B, in a subsequent step, a plurality of side dielectrics 402' is formed to surround each of the stacked units SU. For example, sidewalls of the side dielectrics 402' are aligned with sidewalls of the gate dielectrics 306'. In some embodiments, the side dielectrics 402' are joined with the gate dielectrics 306' located above and below. The side dielectrics 402' may be formed by a method similar to that described in FIG. 9A to FIG. 10B.

Figure 22:
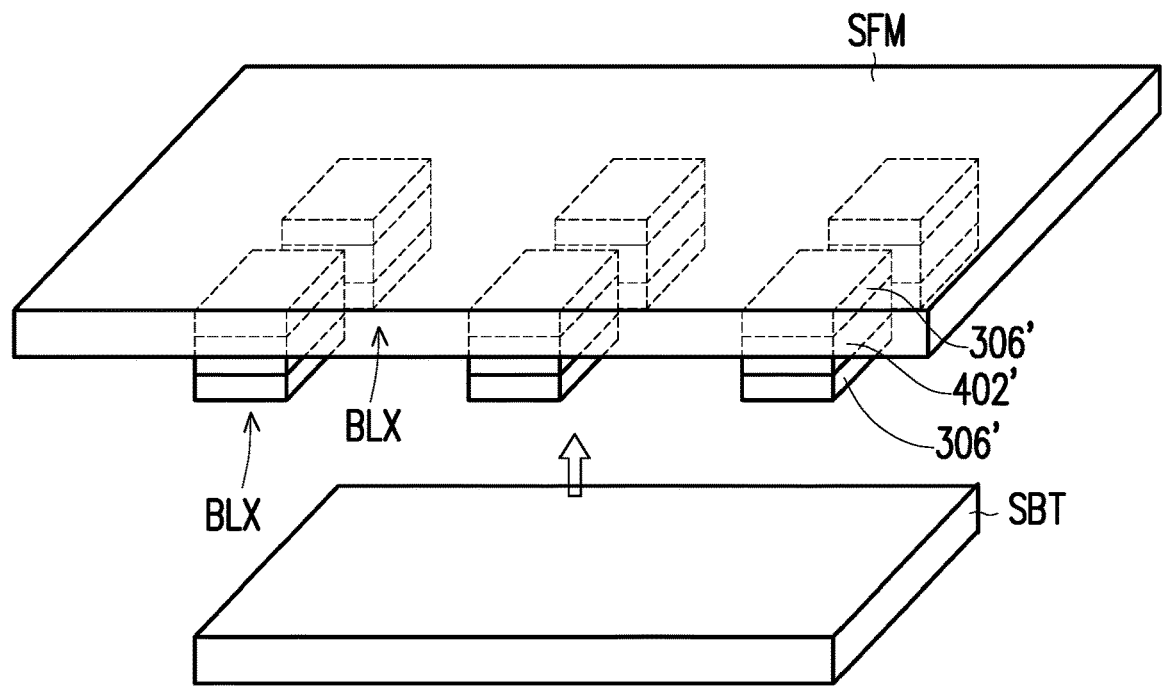
Figure 23:
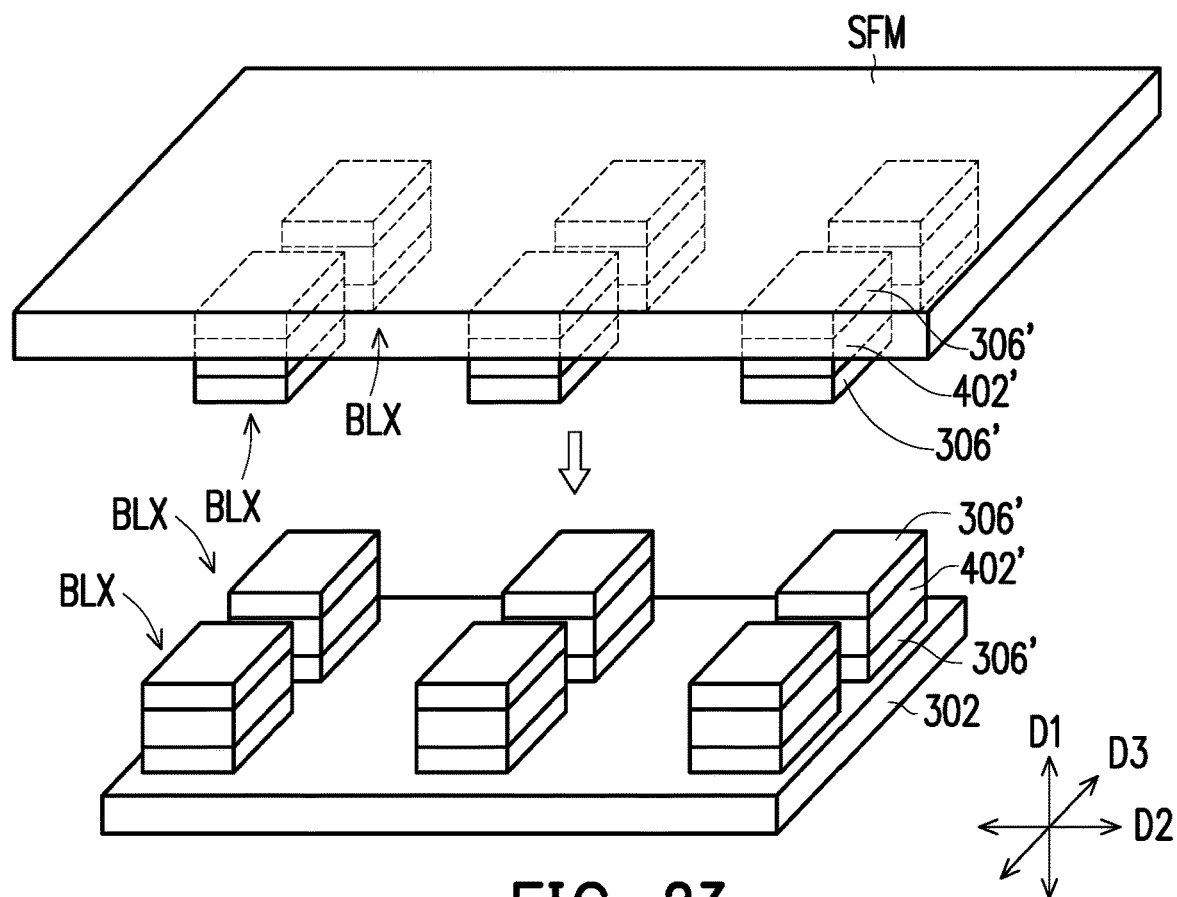

Referring to FIG. 22, in some embodiments, a supporting film SFM is attached to the stacked block units BLX so that the layer of stacked block units BLX are fasten up by the supporting film SFM. For example, the supporting film SFM is attached to the gate dielectrics 306' of the stacked block units BLX, and helps to peel off the stacked block units BLX from the substrate SBT. Referring to FIG. 23, in a subsequent step, a first layer of the stacked block units BLX are transferred onto a target substrate, such as a semiconductor substrate 302. Thereafter, a second layer of stacked block units BLX may be transferred onto the first layer of stacked block units BLX so that they are stacked up along the first direction DR1. For example, after the stacking process, the gate dielectrics 306' of two stacked block units BLX are in contact with one another.

Figure 24A:
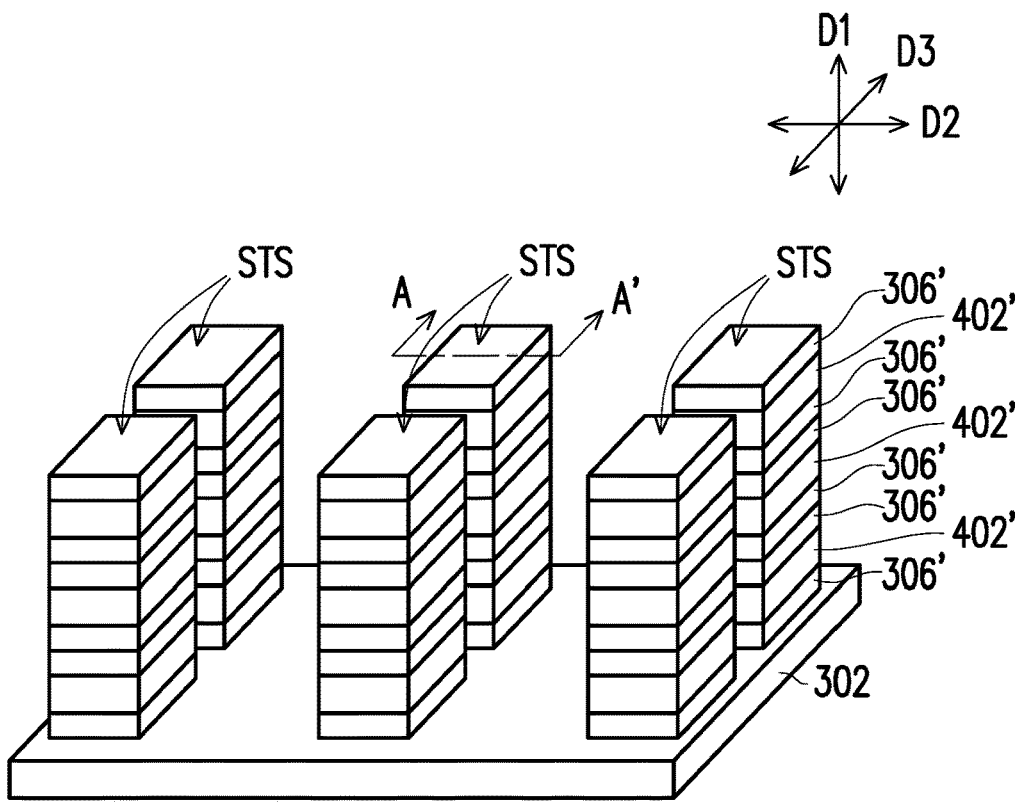
Figure 24B:
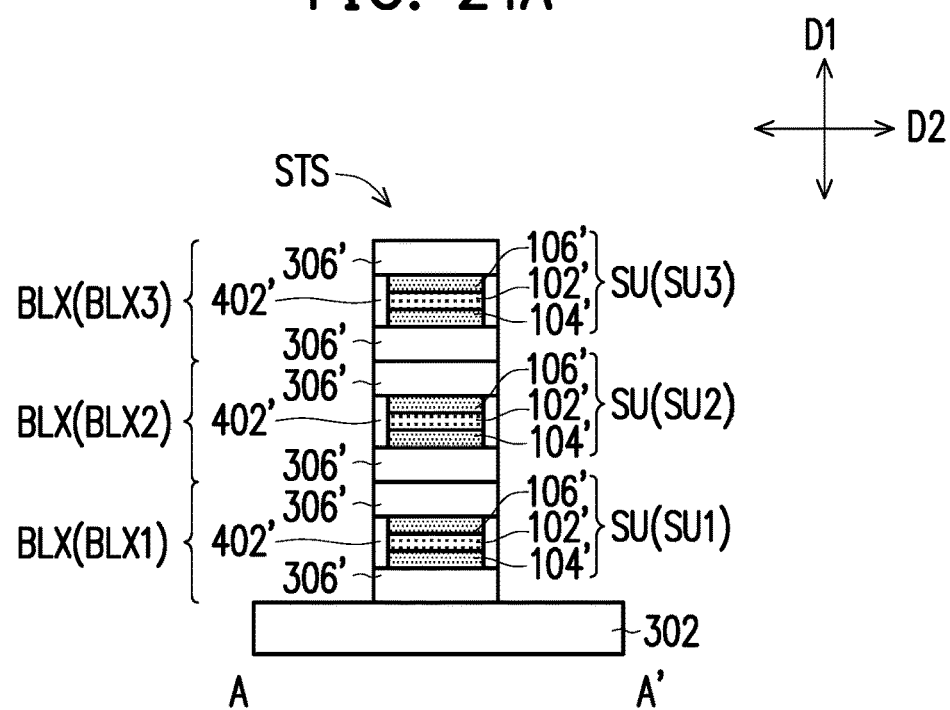

FIG. 24A is a schematic view of one stage in a method of fabricating a semiconductor structure S20, while FIG. 24B is a sectional view of the structure shown in FIG. 24A taken alone the line A-A'. Referring to FIG. 24A and FIG. 24B, the stacking of the stacked block units BLX may be repeated until a desired number of stacking layers is formed. For example, as illustrated in FIG. 24A and FIG. 24B, a triple stacking heterostructure (with three stacked unit SU (SU1, SU2, SU3)) is formed over the semiconductor substrate 302 to form a plurality of stacked strip structures STS. In other words, in some embodiments, the stacked strip structures STS are formed by stacking up the stacked block units BLX (e.g. a first stacked block unit BLX1, a second stacked block unit BLX2 and a third stacked block unit BLX3) along the first direction DR1.

Figure 25A:
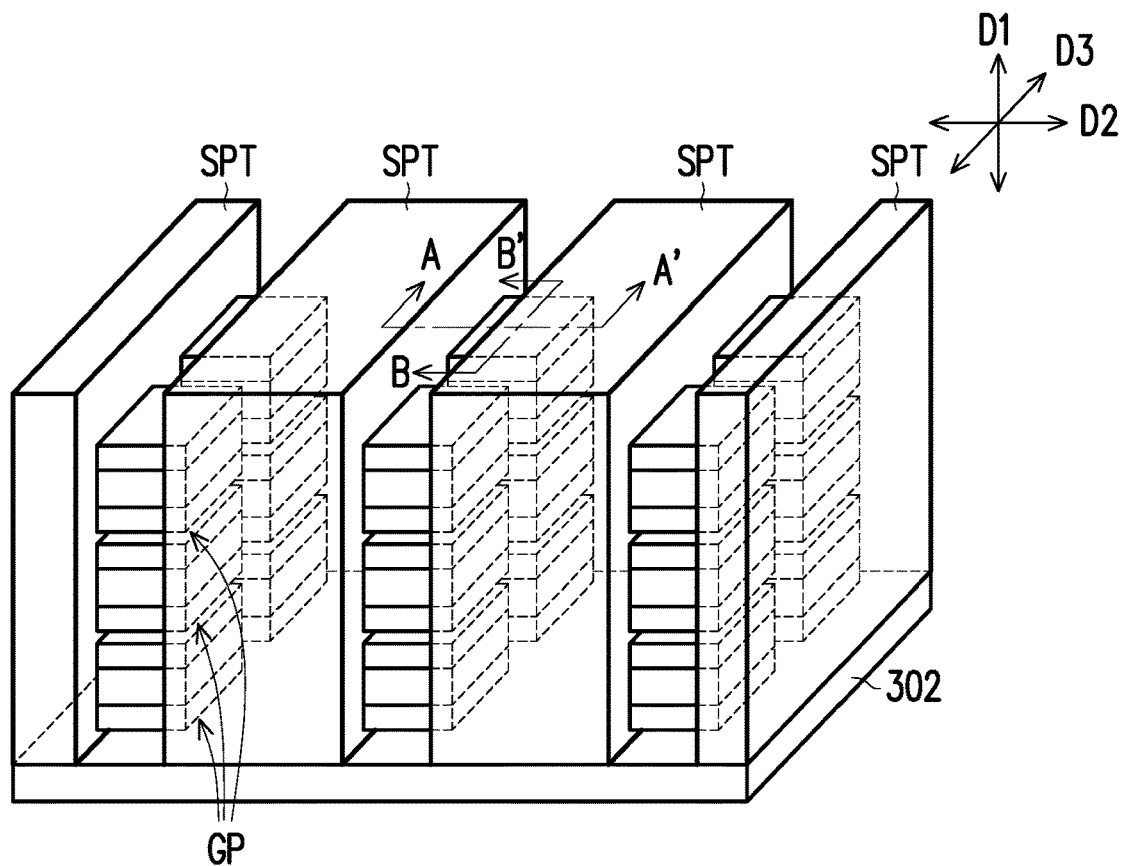
Figure 25B:
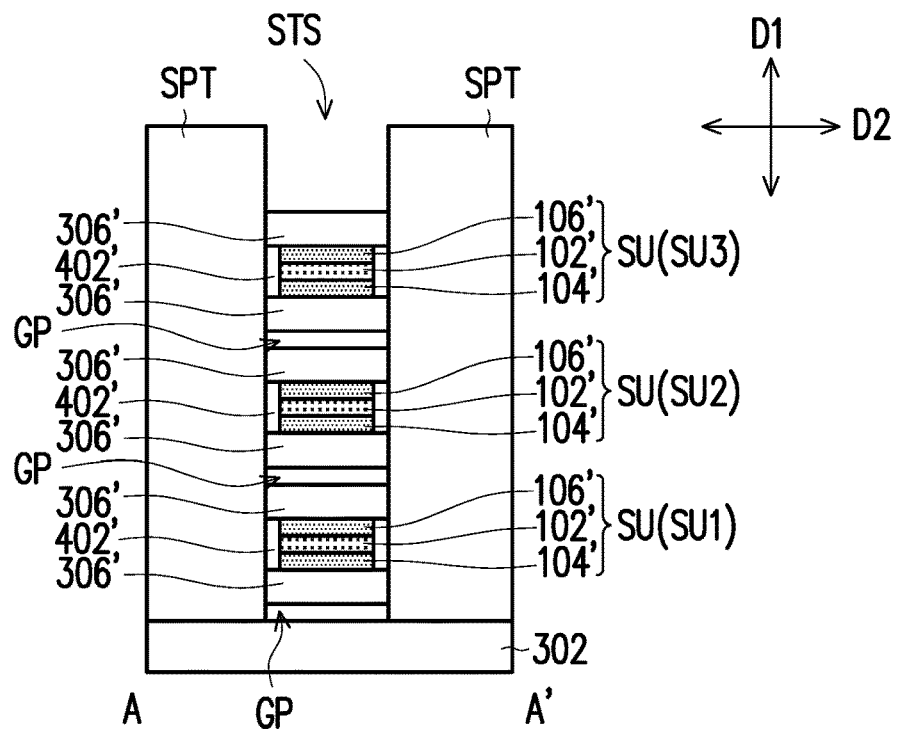
Figure 25C:
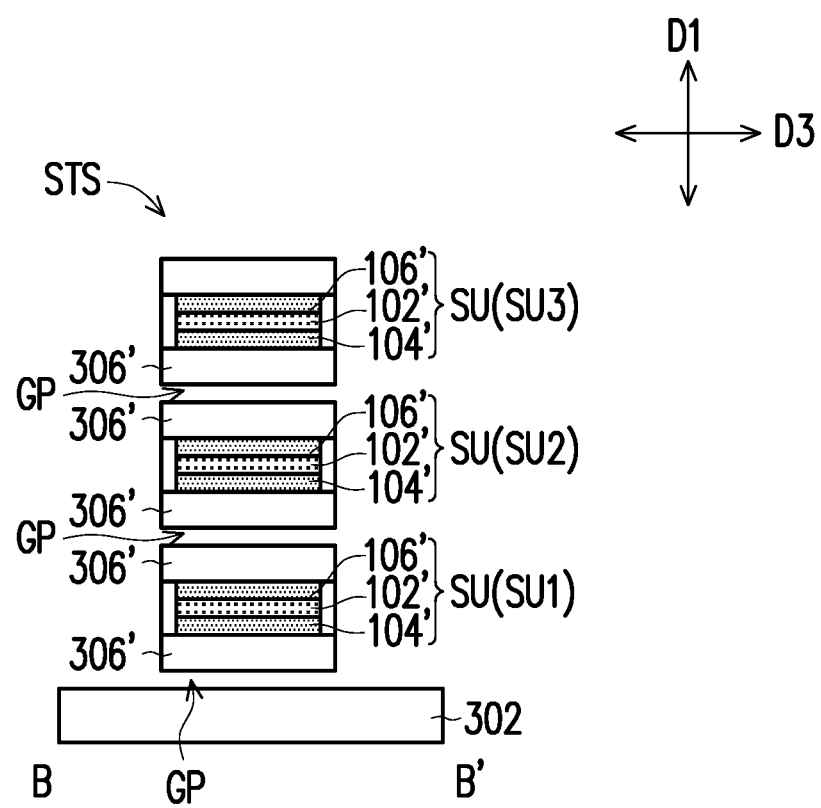

FIG. 25A is a schematic view of one stage in a method of fabricating a semiconductor structure S20, FIG. 25B is a sectional view of the structure shown in FIG. 25A taken alone the line A-A', and FIG. 25C is a sectional view of the structure shown in FIG. 25A taken alone the line B-B'. Referring to FIG. 25A to FIG. 25C, in some embodiments, a supporting structure SPT is formed in between the stacked strip structures STS along the second direction DR2 to support the stacked strip structures STS. A material of the supporting structure SPT is not particularly limited as long as the supporting structure SPT can be used to prevent a collapse of the stacked strip structures STS during subsequent etching steps. In some embodiments, as illustrated in FIG. 25A to FIG. 25C, a lateral etching process is performed to remove portions of the gate dielectrics 306'. For example, lateral etching is performed to remove portions of the gate dielectrics 306' of two adjacent stacked block units BLX to form gaps GP therebetween. Furthermore, the bottommost and topmost gate dielectrics 306' may also be partially removed to form the gaps GP.

Figure 26A:
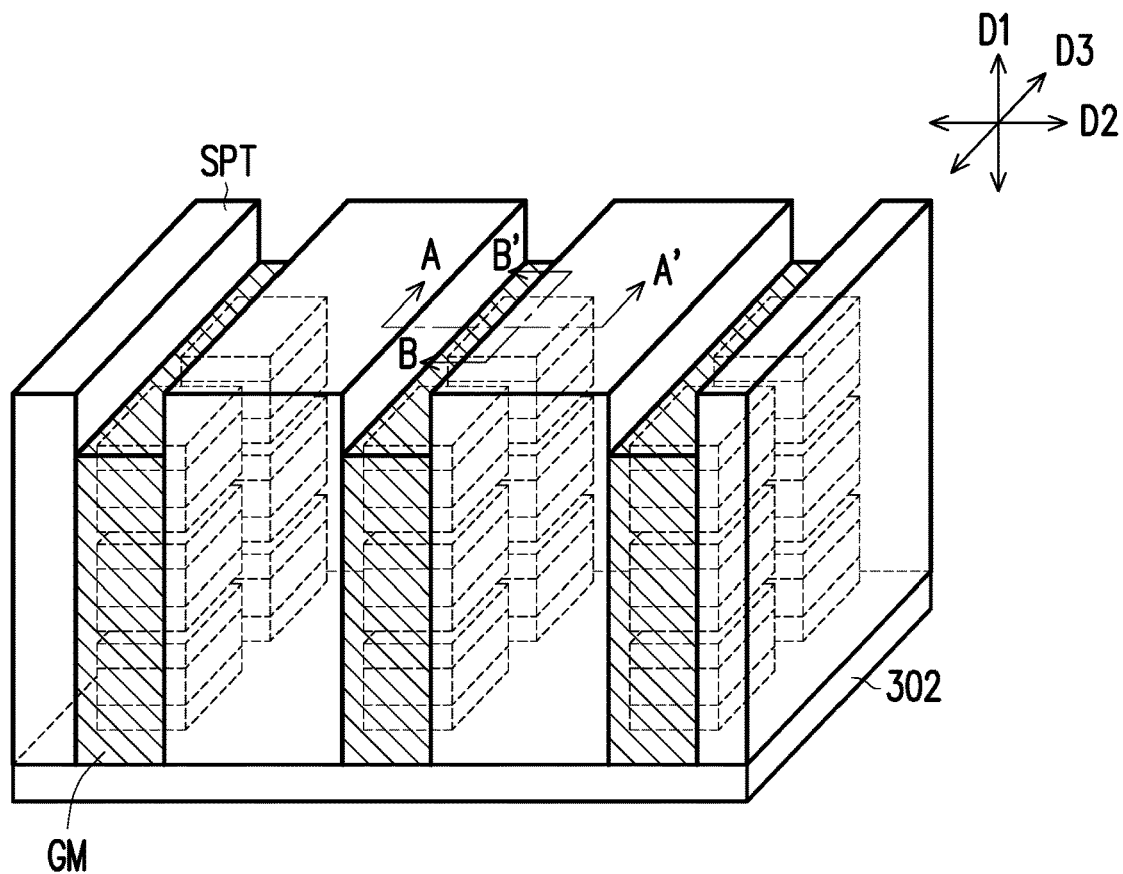
Figure 26B:
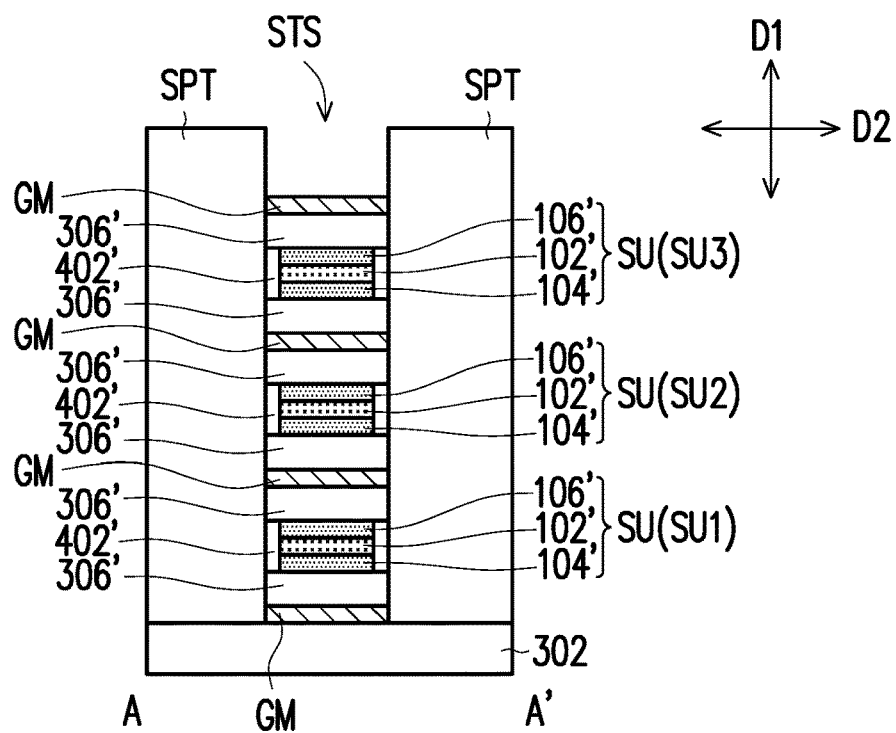
Figure 26C:
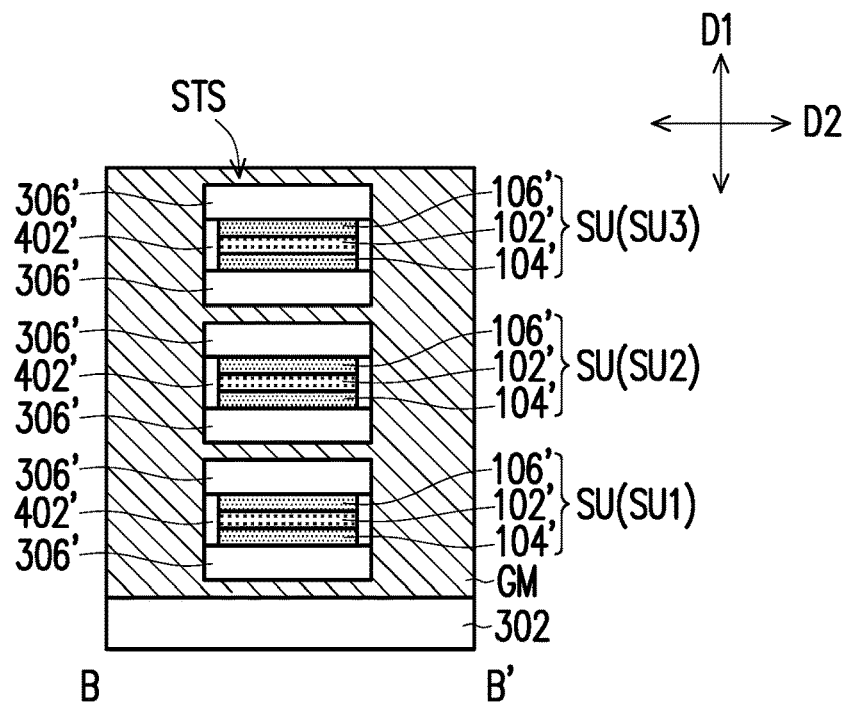

FIG. 26A is a schematic view of one stage in a method of fabricating a semiconductor structure S20, FIG. 26B is a sectional view of the structure shown in FIG. 26A taken alone the line A-A', and FIG. 26C is a sectional view of the structure shown in FIG. 26A taken alone the line B-B'. Referring to FIG. 26A to FIG. 26C, a gate material GM is formed over the stacked strip structures STS and to fill up the gaps GP. For example, the gate material GM fill up the gaps GP in between two gate dielectrics 306'. In some embodiments, the gate material GM wraps around each of the stacked units SU of the stacked strip structure STS.

Figure 27:
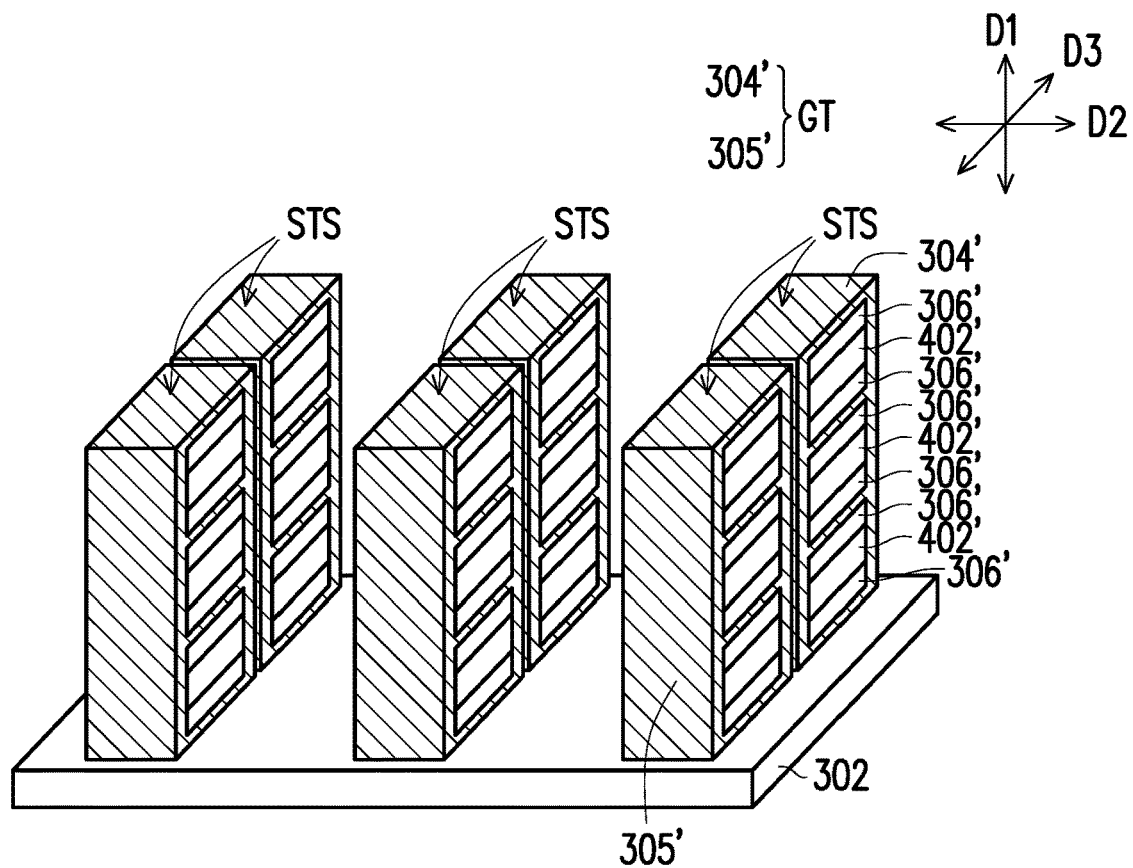

Referring to FIG. 27, in a subsequent step, after forming the gate material GM, the supporting structure SPT is then removed. Thereafter, the gate material GM may be patterned to separate the stacked strip structures STS from one another. In some embodiments, the gate material GM is patterned to form a gate structure GT of the stacked strip structure STS. For example, the gate structure GT includes a first portion 304' covering a top surface and a bottom surface of each stacked units SU (not shown), and includes a second portion 305' connected to the first portion 304' and covering sidewalls of each of the stacked units SU. The first portion 304' and the second portion 305' of the gate structure GT may together wrap around the gate dielectrics 306', and wrap around each of the stacked units SU of the stacked strip structures STS. In some embodiments, after removing the supporting structure SPT and patterning the gate material GM, the side dielectrics 402' are exposed by the gate structure GT, or exposed from two opposing sides of the stacked strip structure STS.

Figure 28A:
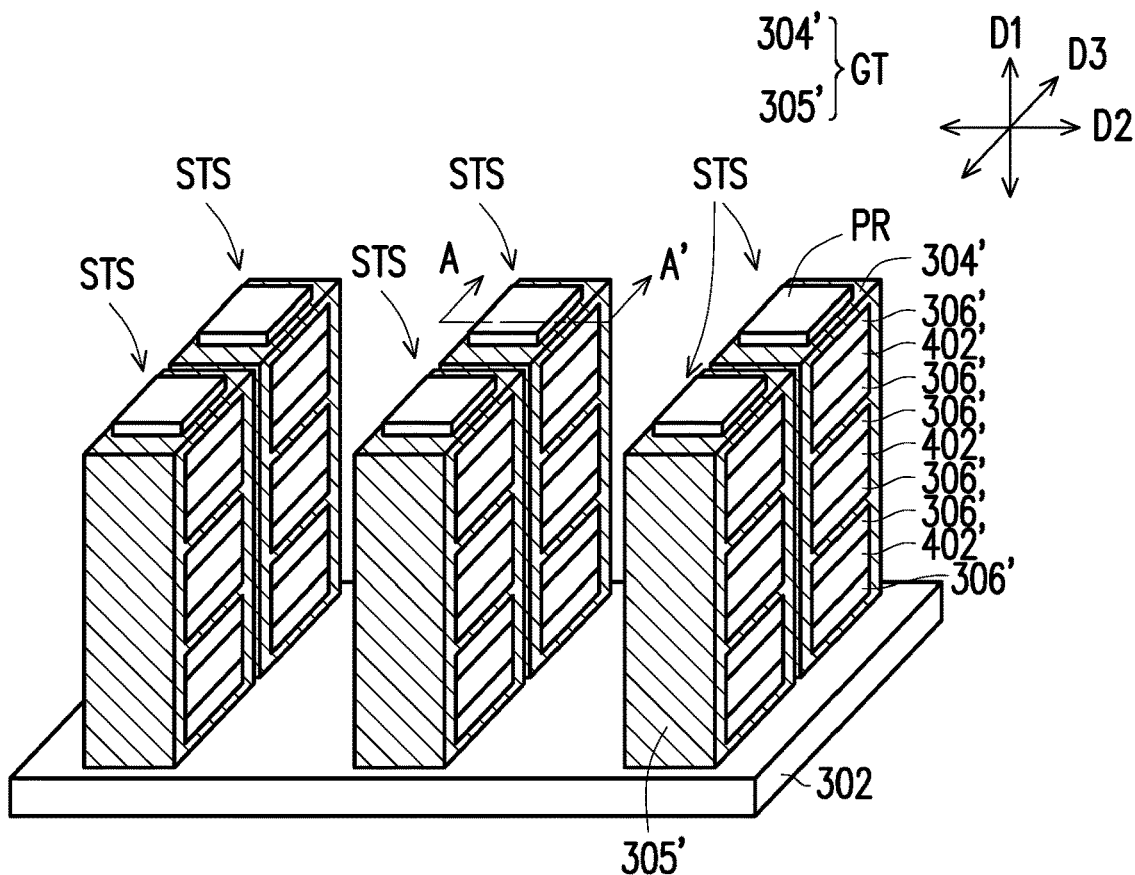
Figure 28B:
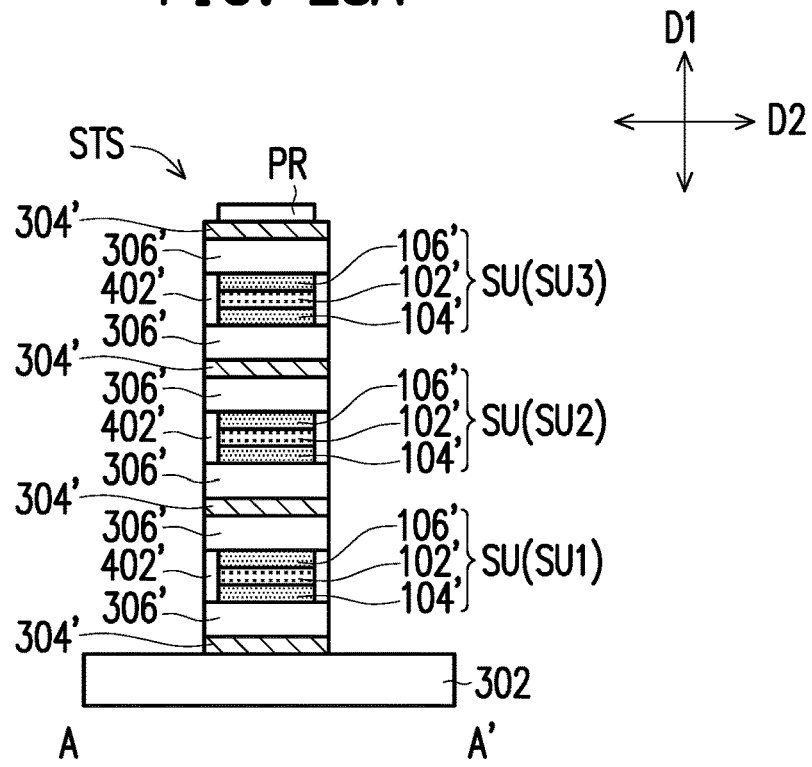

FIG. 28A is a schematic view of one stage in a method of fabricating a semiconductor structure S20, while FIG. 28B is a sectional view of the structure shown in FIG. 28A taken alone the line A-A'. Referring to FIG. 28A and FIG. 28B, a photoresist pattern PR is disposed on the stacked strip structure STS to cover portions of the gate structure GT. In some embodiments, the photoresist pattern PR may have sidewalls that are aligned with sidewalls of the stacked units SU located below. In one embodiment, the photoresist pattern PR may be formed by coating (such as spin-coating) and photolithography processes or the like; however, the disclosure is not limited thereto. A material of the photoresist pattern PR, for example, includes a positive resist material or a negative resist material, that is suitable for a patterning process such as a photolithography process with a mask or a mask-less photolithography process (for instance, an electron-beam (e-beam) writing or an ion-beam writing).

Figure 29A:
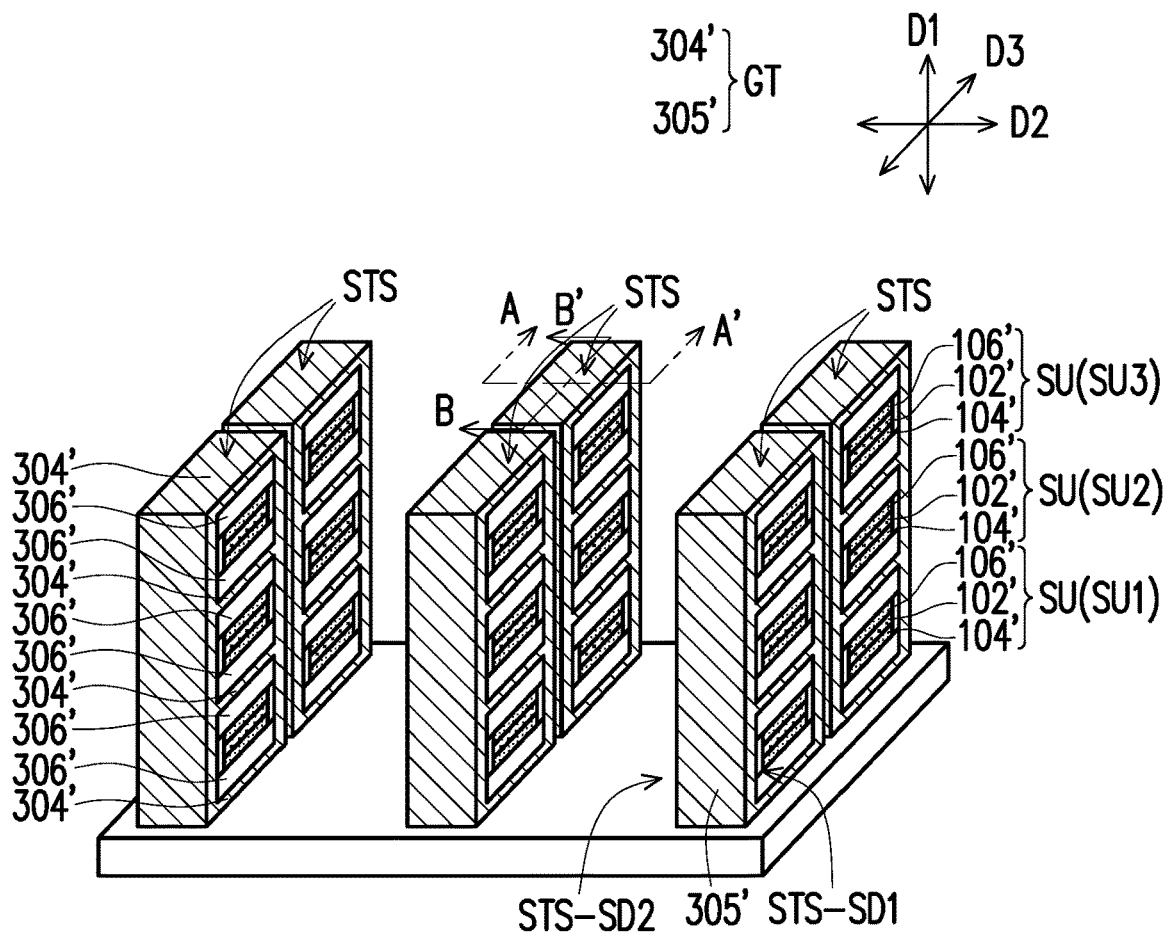
Figure 29B:
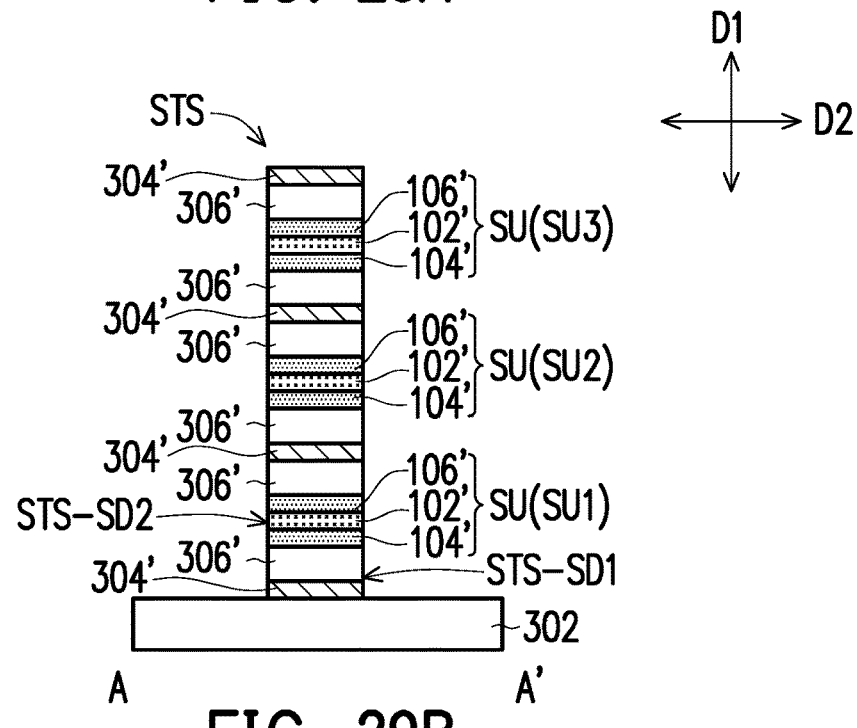
Figure 29C:
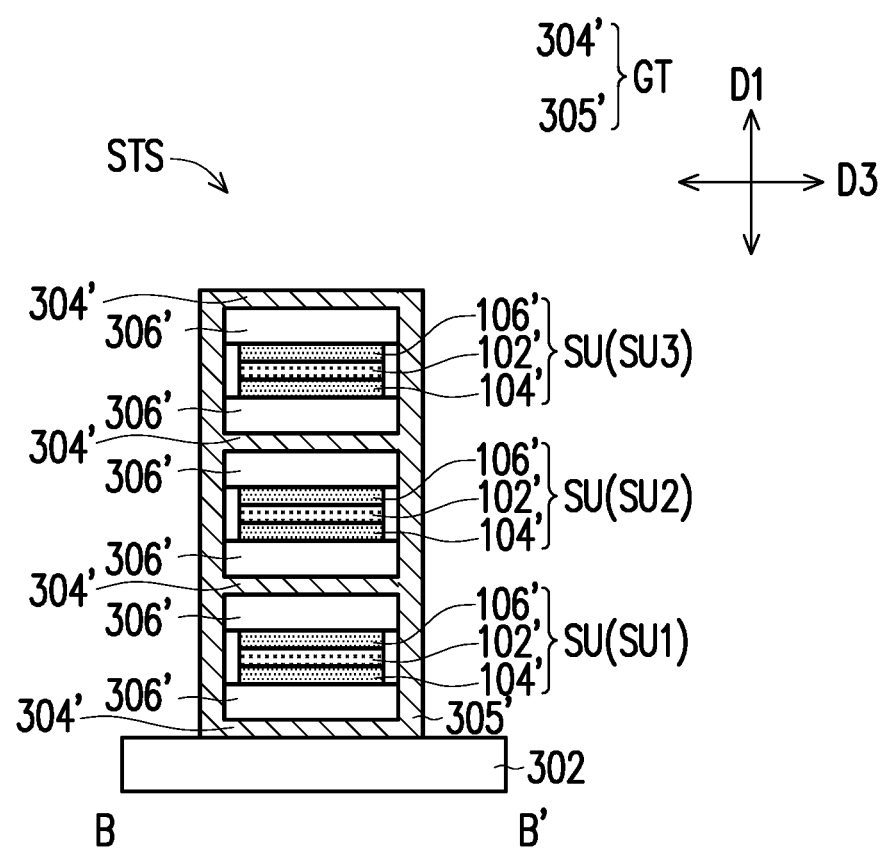

FIG. 29A is a schematic view of one stage in a method of fabricating a semiconductor structure S20, FIG. 29B is a sectional view of the structure shown in FIG. 29A taken alone the line A-A', and FIG. 29C is a sectional view of the structure shown in FIG. 29A taken alone the line B-B'. Referring to FIG. 29A to FIG. 29C, a patterning process is performed to remove portions of the stacked strip structure STS not covered by the photoresist pattern PR. For example, portions of the gate structure GT and portions of the side dielectrics 402' are removed to expose the channel layers 102'. In some embodiments, the channel layers 102' are exposed from two opposing sides (a first side STS-SD1 and a second side STS-SD2) of the stacked strip structure STS. Similarly, the gate dielectrics 306' and the passivation layers (104', 106') may also be exposed from two opposing sides (the first side STS-SD1 and the second side STS-SD2) of the stacked strip structure STS.

Figure 30A:
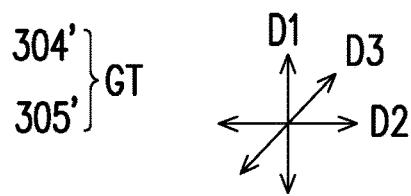
Figure 30A:
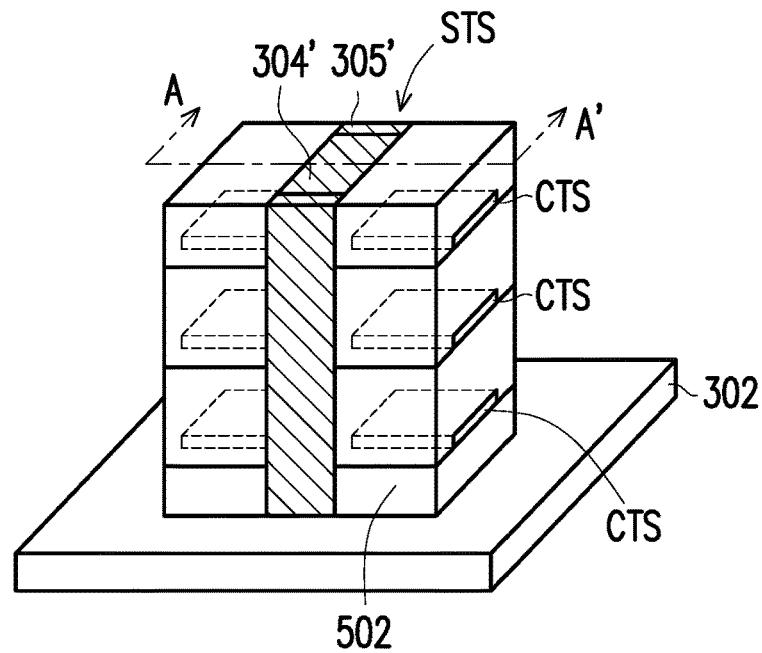
Figure 30B:
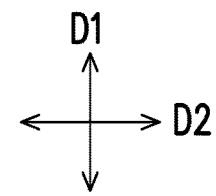
Figure 30B:
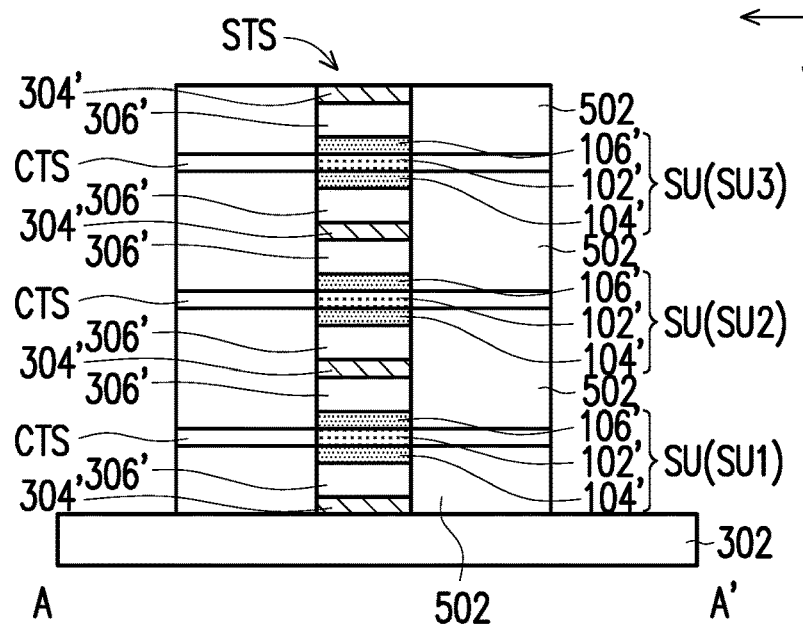

FIG. 30A is a schematic view of one stage in a method of fabricating a semiconductor structure S20, while FIG. 30B is a sectional view of the structure shown in FIG. 30A taken alone the line A-A'. Referring to FIG. 30A and FIG. 30B, inter-dielectric layers 502 are formed on the substrate 302 on the two opposing sides (the first side STS-SD1 and the second side STS-SD2 in FIG. 29A) of the stacked strip structure STS. Thereafter, a plurality of contact structures CTS is formed on the inter-dielectric layers 502 over the semiconductor substrate 302. In some embodiments, the formation of the inter-dielectric layers 502 and the contact structures CT along the first direction D1 are repeated so that the topmost inter-dielectric layer 502 is aligned with a top surface of the stacked strip structure STS.

Figure 31A:
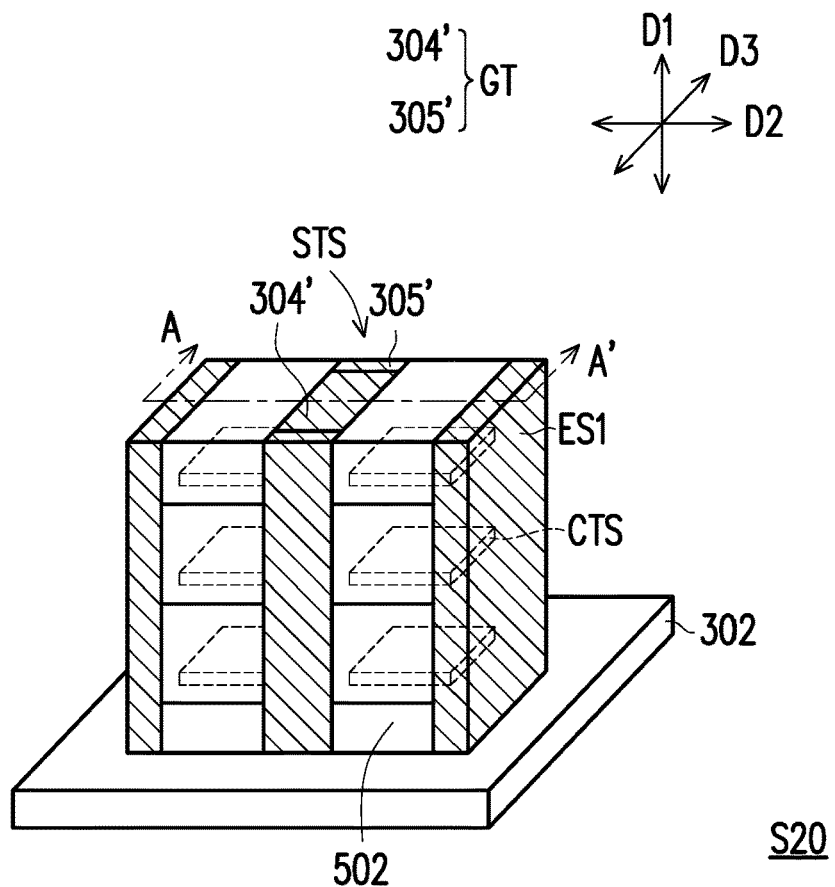
Figure 31B:
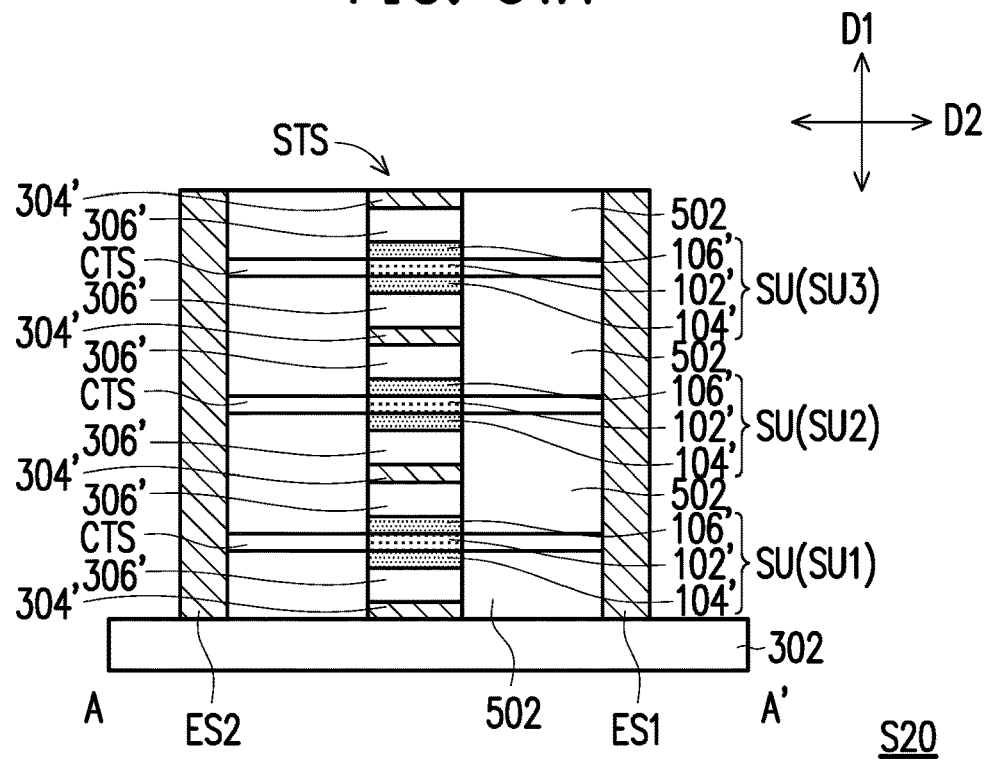

FIG. 31A is a schematic view of one stage in a method of fabricating a semiconductor structure S20, while FIG. 31B is a sectional view of the structure shown in FIG. 31A taken alone the line A-A'. Referring to FIG. 31A and FIG. 31B, in a subsequent step, electrode strips (ES1, ES2) are formed on two opposing sides of the stacked strip structure STS. For example, in one embodiment, a first electrode strip ES1 and a second electrode strip ES2 are formed on two opposing sides of the gate structure GT. In certain embodiments, the contact structures CT are connecting the channel layer 102' of each of the stacked units SU to the first electrode strip ES1 and the second electrode strip ES2. Up to here, a semiconductor structure S20 according to some embodiments of the present disclosure is accomplished. In some embodiments, the semiconductor structure S20 is a triple stacking heterostructure with three stacked units SU forming three transistors. In alternative embodiments, the number of stacked units SU or transistors formed in the semiconductor structure S10 may be adjusted based on product requirements.

Figure 32:
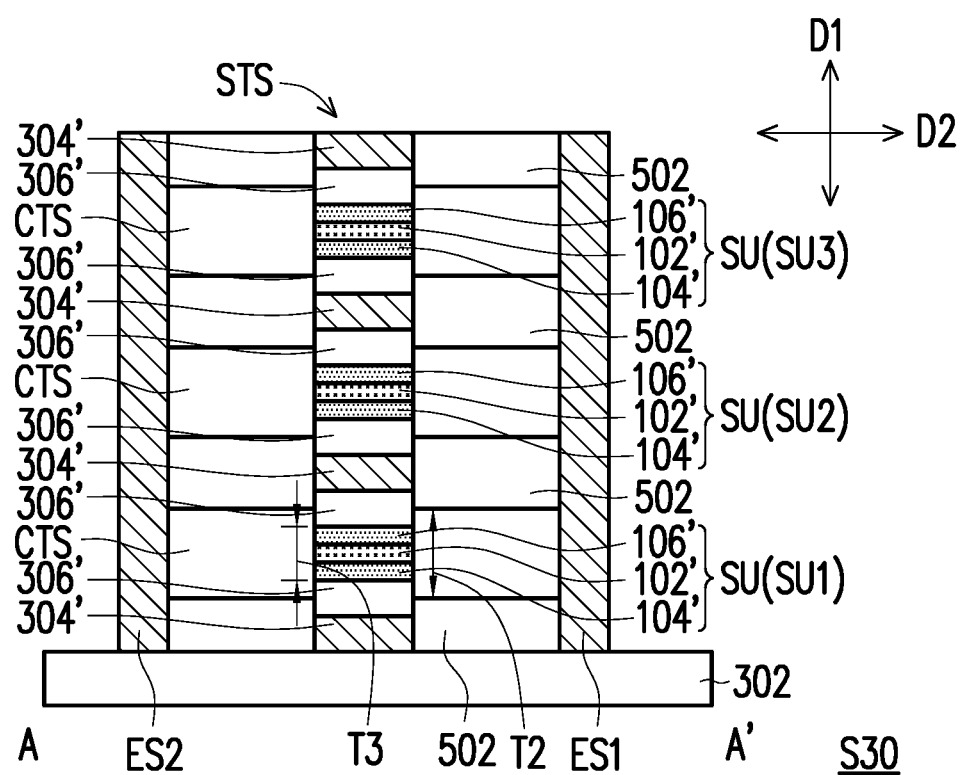
FIG. 32 is a schematic sectional view of a semiconductor structure according to some exemplary embodiments of the present disclosure.

FIG. 32 is a schematic sectional view of a semiconductor structure according to some exemplary embodiments of the present disclosure. The semiconductor structure S30 illustrated in FIG. 32 is similar to the semiconductor structure S10 illustrated in FIG. 17A and FIG. 17B. Therefore, the same reference numerals are used to refer to the same or liked parts, and its detailed descriptions are omitted herein. In the previous embodiments, a thickness T1 of the contact structures CTS is shown to be substantially equal to a thickness T2 of the channel layer 102'. However, the disclosure is not limited thereto. Referring to FIG. 32, in some embodiments, a thickness T2 of each of the contact structures CTS is greater than a thickness T3 of each of the stacked units SU. In certain embodiments, the thickness T2 of the contact structures CTS may be appropriately adjusted as long as the contact structures CTS does not extend beyond the top and bottom gate dielectrics 306' surrounding each of the stacked units SU along the first direction DR1. In other words, the contact structures CTS are physically and electrically separated from the first portion 304' and the second portion 305' of the gate structure GT.

Figure 33A:
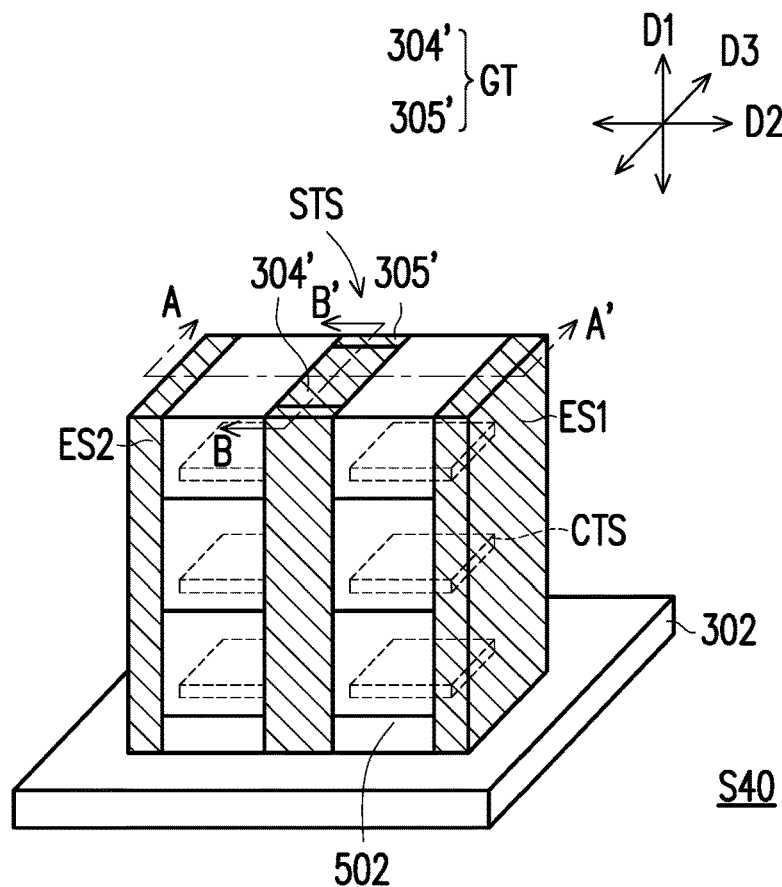
FIG. 33A to FIG. 33C are schematic views of a semiconductor structure according to some other exemplary embodiments of the present disclosure.
Figure 33B:
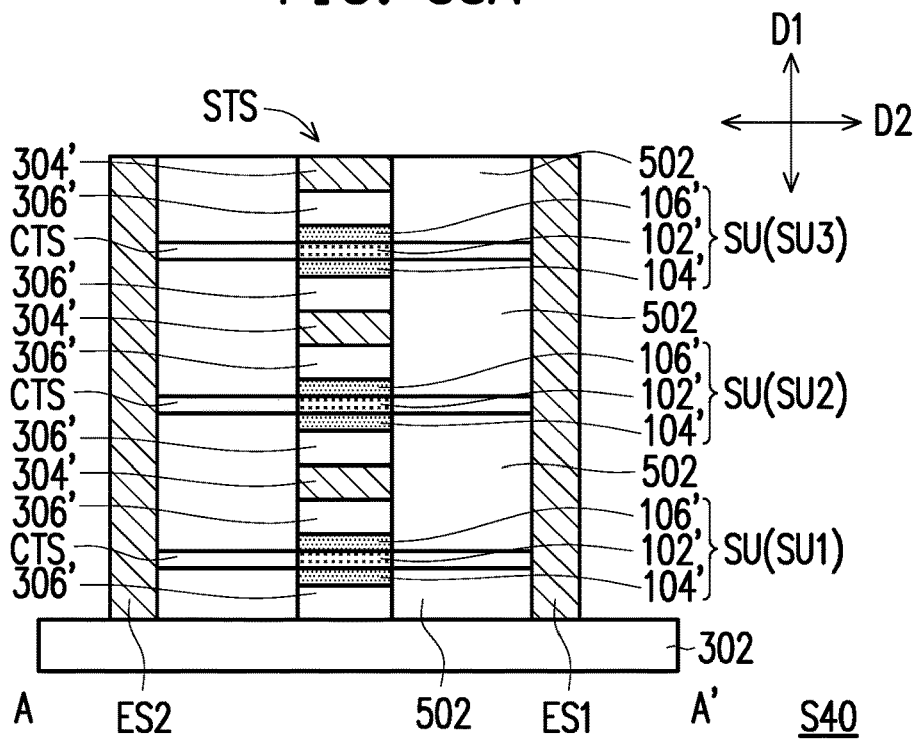
Figure 33C:
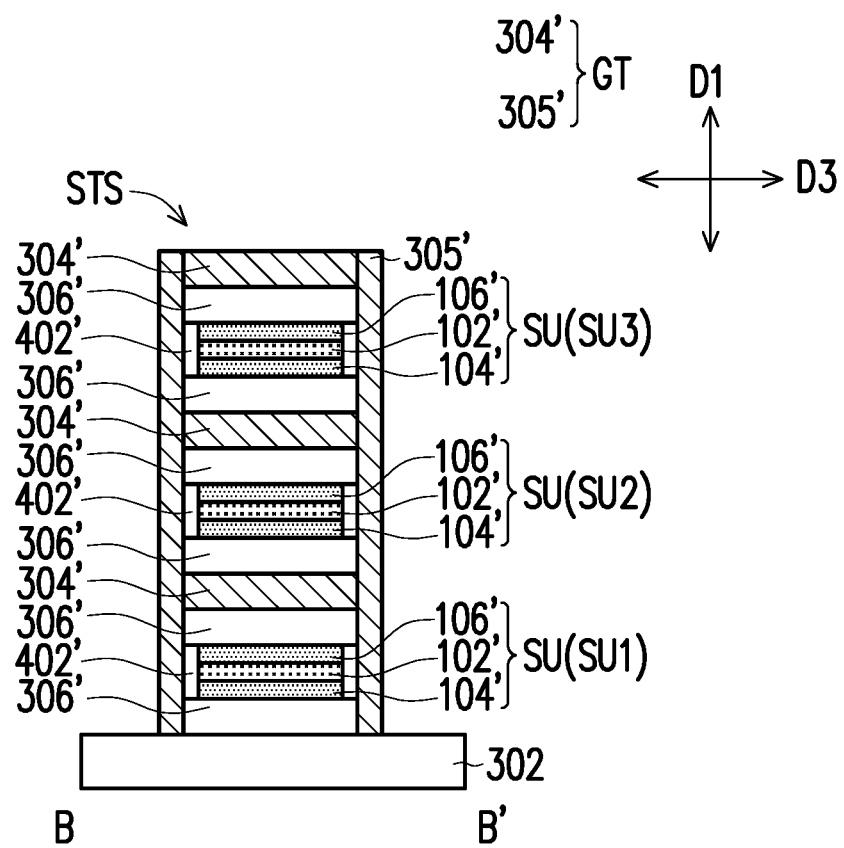

FIG. 33A to FIG. 33C are schematic views of a semiconductor structure according to some other exemplary embodiments of the present disclosure. FIG. 33B is a sectional view of the structure shown in FIG. 33A taken alone the line A-A', while FIG. 33C is a sectional view of the structure shown in FIG. 33A taken alone the line B-B'. The semiconductor structure S40 illustrated in FIG. 33A to FIG. 33C is similar to the semiconductor structure S10 illustrated in FIG. 17A and FIG. 17B. Therefore, the same reference numerals are used to refer to the same or liked parts, and its detailed descriptions are omitted herein.

In the previous embodiments, the bottommost layer of the stacked strip structure STS is the first portion 304' of the gate structure GT. However, the disclosure is not limited thereto. Referring to FIG. 33A to FIG. 33C, in some embodiments, the bottommost layer of the stacked strip structure STS is the gate dielectric 306'. In other words, the bottommost first gate material 304 may be omitted from the stacked block structure BLK illustrated in FIG. 6 during layer-by-layer stacking. In the exemplary embodiment, a material of the substrate 302 is an oxide or high doped silicon (having high conductivity). As such, a surface of the substrate 302 may be treated as a bottom gate, and a bias may be applied to the substrate 302 for gate control. Up to here, a semiconductor structure S40, which includes a gate all around (GAA) structure is also achieved.

In the above-mentioned embodiments, a method that enable two-dimensional material building blocks to be cleanly peeled off from the target substrates without the use of any etchants or solvents is achieved. In other words, the residuals remaining at the interface after conventional transfer processes may be reduced to a minimum. The embodiments allow the fabrication of a semiconductor structure achieved by vertical stack-by-stack heterostructure transfer for cubic integration, while ultraclean interfaces of the sandwiched structure may be sustained. As such, a stacking assembly method that maintains the intrinsic properties of the two-dimensional building blocks while producing pristine interlayer interfaces can be achieved.

In accordance with some embodiments of the present disclosure, a semiconductor structure includes a semiconductor substrate, a plurality of stacked units, a conductive structure, a plurality of dielectrics, a first electrode strip and a second electrode strip, and a plurality of contact structures. The stacked units are stacked up along a first direction over the semiconductor substrate, wherein each of the stacked units comprises a first passivation layer, a second passivation layer and a channel layer sandwiched between the first passivation layer and the second passivation layer. The conductive structure is disposed on the semiconductor substrate and wrapping around the plurality of stacked units. The dielectrics are surrounding the stacked units and separating the stacked units from the conductive structure. The first electrode strip and the second electrode strip are located on two opposing sides of the conductive structure. The contact structures are extending in a second direction perpendicular to the first direction, wherein the contact structures are connecting the channel layer of each of the stacked units to the first electrode strip and the second electrode strip.

In accordance with some other embodiments of the present disclosure, a method of forming stacked unit layers is described. The method includes the following steps. A first stacked unit layer is formed by the following steps: delaminating a channel material from a first substrate using a supporting film that is attached to a first surface of the channel material; reverse attaching the supporting film to the first substrate so that a second surface of the channel material is facing away from the first substrate, wherein the second surface is opposite to the first surface; attaching a first passivation material on the second surface of the channel material; reverse stacking the channel material along with the first passivation material on a second substrate so that the first surface of the channel material is facing away from the second substrate; removing the supporting film to reveal the first surface of the channel material; and attaching a second passivation material on the first surface of the channel material to form the first stacked unit layer constituted by the first passivation material, the channel material and the second passivation material.

In accordance with some other embodiments of the present disclosure, a method of forming stacked two-dimensional (2D) material layers is described. The method includes the following steps. A supporting film is used to peel off a first 2D material layer from a first substrate, wherein a first surface of the first 2D material layer is revealed. The first 2D material layer and the supporting film are flipped so that the first surface of the first 2D material layer is arranged in a faced-up manner, and the first 2D material layer is attached onto the first substrate so that the supporting film is located between the first substrate and the first 2D material layer. A second supporting film is used to attach a second 2D material layer onto the first surface of the first 2D material and removing the second supporting film. The second 2D material layer, the first 2D material layer and the supporting film are flipped so that the supporting film is in a faced-up manner, and the second 2D material layer is attached onto a second substrate so that first 2D material layer is located between the supporting film and the second 2D material layer. The supporting film is removed to reveal a second surface of the first 2D material layer. A third supporting film is used to attach a third 2D material layer onto the second surface of the first 2D material layer.

In accordance with some other embodiments of the present disclosure, a semiconductor structure includes a stacked strip structure, electrode strips and a plurality of contact structures. The stacked strip structure includes a first stacked unit, a second stacked unit and a gate structure. The first stacked unit includes a first channel layer and passivation layers covering a top surface and a bottom surface of the first channel layer. The second stacked unit is disposed on the first stacked unit and includes a second channel layer and passivation layers covering a top surface and a bottom surface of the second channel layer. The gate structure is wrapping around the first stacked unit and the second stacked unit, wherein two opposing sidewalls of the first channel layer and two opposing sidewalls of the second channel layer are exposed by the gate structure, and exposed from the stacked strip structure. The electrode strips are located on two opposing sides of the stacked strip structure. The contact structures are physically connected to the two opposing sidewalls of the first channel layer and the two opposing sidewalls of the second channel layer exposed from the stacked strip structure, and physically connected to the electrode strips.

In accordance with yet another embodiment of the present disclosure, a method of fabricating a semiconductor structure is described. The method includes the following steps. A stacked block structure is formed over a semiconductor substrate by stacking a plurality of stacked unit layers, a plurality of gate dielectric materials and a plurality of first gate materials along a first direction. The plurality of stacked unit layers, the plurality of gate dielectric materials and the plurality of first gate materials of the stacked block structure are patterned to form a plurality of stacked strip structures, wherein each of the plurality of stacked strip structures includes a plurality of stacked units, a first portion of a gate structure and a plurality of gate dielectrics. The plurality of stacked units is stacked up along the first direction over the semiconductor substrate, wherein each of the stacked units includes a first passivation layer, a second passivation layer and a channel layer sandwiched between the first passivation layer and the second passivation layer. The first portion of the gate structure is covering a top surface and a bottom surface of each of the plurality of stacked units. The gate dielectrics are surrounding the plurality of stacked units and separating the plurality of stacked units from the first portion of the gate structure. A second gate material is formed over the semiconductor substrate to surround the plurality of stacked strip structures, and the second gate material is patterned to form a second portion of the gate structure. The second portion is connected to the first portion and covering sidewalls of each of the plurality of stacked units, and the first portion and the second portion of the gate structure wraps around the plurality of stacked units. A plurality of contact structures is formed on the semiconductor substrate to extend in a second direction perpendicular to the first direction, wherein the plurality of contact structures is connected to the channel layer of each of the plurality of stacked unit. A first electrode strip and a second electrode strip are formed on two opposing sides of each of the plurality of stacked strip structures, wherein the first electrode strip and the second electrode strip are connected to the plurality of contact structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure, comprising:
  a stacked strip structure, comprising:
    a first stacked unit, wherein the first stacked unit comprises a first channel layer and passivation layers covering a top surface and a bottom surface of the first channel layer;
    a second stacked unit, wherein the second stacked unit is disposed on the first stacked unit and includes a second channel layer and passivation layers covering a top surface and a bottom surface of the second channel layer;
    a gate structure wrapping around the first stacked unit and the second stacked unit, wherein two opposing sidewalls of the first channel layer and two opposing sidewalls of the second channel layer are exposed by the gate structure, and exposed from the stacked strip structure;
  electrode strips located on two opposing sides of the stacked strip structure; and
  a plurality of contact structures joining the first channel layer to the electrode strips, and joining the second channel layer to the electrode strips.

2. The structure according to claim 1, wherein the gate structure comprises a first portion and a second portion, the first portion is covering a top surface and a bottom surface of each of the first stacked unit and the second stacked unit, and the second portion is connected to the first portion and covering sidewalls of the first stacked unit and sidewalls of the second stacked unit.

3. The structure according to claim 1, further comprising gate dielectrics sandwiched between the gate structure and the first stacked die unit, and sandwiched between the gate structure and the second stacked die unit.

4. The structure according to claim 1, wherein a thickness of each of the plurality of contact structures is substantially equal to a thickness of the first channel layer and a thickness of the second channel layer.

5. The structure according to claim 1, wherein a thickness of each of the plurality of contact structures is greater than a thickness of the first channel layer and a thickness of the second channel layer.

6. The structure according to claim 1, wherein the first channel layer, the second channel layer and the passivation layers of the first stacked unit and the second stacked unit are two-dimensional materials.

7. The structure according to claim 6 wherein the first channel layer and the second channel layer are transition metal dichalcogenide, and the passivation layers of the first stacked unit and the second stacked unit are hexagonal boron nitride.

8. A structure, comprising:
  a plurality of stacked units stacked up along a first direction over the semiconductor substrate, wherein each of the stacked units comprises a first passivation layer, a second passivation layer and a channel layer sandwiched between the first passivation layer and the second passivation layer;
    first gate portions located over bottom and top surfaces of each of the plurality of stacked units, wherein sidewalls of the first gate portions arranged along a second direction are aligned with first sidewalls and second sidewalls of each of the plurality of stacked units arranged along the second direction, and wherein the second direction is perpendicular to the first direction; and
    contact structures extending along the second direction, and electrically connected to the channel layer of each of the plurality of stacked units.

9. The structure according to claim 8, wherein the channel layer is a transition metal dichalcogenide, and the first passivation layer and the second passivation layer are hexagonal boron nitride.

10. The structure according to claim 8, further comprising a plurality of inter-dielectric layers located on two opposing sides of the plurality of stacked units, wherein the first passivation layer and the second passivation layer of each of the plurality of stacked units are in physical contact with two different layers of the plurality of inter-dielectric layers.

11. The structure according to claim 8, wherein a thickness of the contact structures is substantially equal to a thickness of the channel layer in each of the stacked units.

12. The structure according to claim 8, further comprising second gate portions joined with the first gate portions, wherein the second gate portions are covering third sidewalls and fourth sidewalls of each of the plurality of stacked units arranged along a third direction, and the third direction is perpendicular to the first direction and perpendicular to the second direction.

13. The structure according to claim 12, further comprising a plurality of side dielectric layers disposed on the third sidewalls and the fourth sidewalls of each of the plurality of stacked units, wherein the plurality of side dielectric layers is physically separating the plurality of stacked units from the second gate portions.

14. The structure according to claim 8, further comprising a first electrode strip and a second electrode strip located on two opposing sides of the plurality of stacked units, wherein the first electrode strip and the second electrode strip are extending along the first direction, and are connected to the contact structures.

15. The structure according to claim 14, wherein top surfaces of the first electrode strip and the second electrode strip are leveled with a top surface of the first gate portions.

16. A structure, comprising:
  a stacked strip structure comprising a plurality of channel layers and a gate structure, wherein the plurality of channel layers is made of two-dimensional materials, and the gate structure is wrapping around each of the plurality of channel layers;

electrode strips located on two opposite sides of the stacked strip structure, and spaced apart from the stacked strip structure; and a plurality of contact structures joining each of the plurality of channel layers to the electrode strips located on two opposite sides.

17. The structure according to claim 16, wherein a height of the electrode strips is equal to a height of the stacked strip structure.

18. The structure according to claim 16, wherein a thickness of the plurality of contact structures is substantially equal to a thickness of the channel layer.

19. The structure according to claim 16, wherein the stacked strip structure further comprises a plurality of gate dielectrics separating the plurality of channel layers from the gate structure.

20. The structure according to claim 16, wherein the stacked strip structure further comprises a plurality of passivation layers covering tops and bottoms of each of the plurality of channel layers, and the plurality of passivation layers is made of two-dimensional materials.

* * * * *